(12) United States Patent
Ishizuka

(10) Patent No.: US 8,461,871 B2
(45) Date of Patent: Jun. 11, 2013

(54) INTERFACE CIRCUIT, ANALOG FLIP-FLOP, AND DATA PROCESSOR

(75) Inventor: Akira Ishizuka, Tochigi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/122,923

(22) PCT Filed: Oct. 9, 2009

(86) PCT No.: PCT/JP2009/067609
§ 371 (c)(1),
(2), (4) Date: Apr. 6, 2011

(87) PCT Pub. No.: WO2010/044375
PCT Pub. Date: Apr. 22, 2010

(65) Prior Publication Data
US 2011/0204920 A1   Aug. 25, 2011

(30) Foreign Application Priority Data

Oct. 14, 2008  (JP) .................................. 2008-265622
Oct. 14, 2008  (JP) .................................. 2008-265623

(51) Int. Cl.
*G06F 7/38* (2006.01)

(52) U.S. Cl.
USPC ........................................................... 326/46

(58) Field of Classification Search
USPC .............. 341/118, 126, 144–148; 326/37–47, 326/101
See application file for complete search history.

(56) References Cited

U.S. PATENT DOCUMENTS

| 5,623,300 | A | 4/1997 | Itoh et al. | |
| 5,760,725 | A * | 6/1998 | Yoshida et al. | 341/144 |
| 6,687,868 | B1 | 2/2004 | Furukawa et al. | |
| 6,788,240 | B2 * | 9/2004 | Reyneri et al. | 341/159 |
| 7,532,147 | B2 * | 5/2009 | Teo et al. | 341/164 |
| 2003/0043926 | A1 | 3/2003 | Terashima et al. | |
| 2004/0008136 | A1 * | 1/2004 | Reyneri et al. | 341/155 |
| 2007/0025453 | A1 | 2/2007 | Terashima et al. | |

FOREIGN PATENT DOCUMENTS

| EP | 0 657 815 A1 | 6/1995 |
| JP | 50-114908 | 9/1975 |
| JP | 61-092078 A | 5/1986 |
| JP | 62-257238 | 11/1987 |
| JP | 05-307367 | 11/1993 |
| JP | 06-061471 A | 3/1994 |
| JP | 2550521 | 8/1996 |
| JP | 11-112483 | 4/1999 |
| JP | 2003-078511 A | 3/2003 |

* cited by examiner

*Primary Examiner* — Thienvu Tran
(74) *Attorney, Agent, or Firm* — Wolf, Greenfield & Sacks, P.C.

(57) ABSTRACT

On an interface between LSIs, boards, devices (units), and others, the data transfer efficiency per signal line is improved. A shift circuit 710-0 shifts a piece of digital signal D1(0) for output as three digital signals D1S(00) to (02). An analog conversion circuit 720-0 converts the three digital signals D1S(00) to (02) into a piece of analog signal A2(0) for transfer. A digital conversion circuit 730-0 converts the piece of analog signal A2(0) into three digital signals D3(00) to (02). A selection circuit 740-0 makes a sequential selection from the three digital signals D3(00) to (02) to output a piece of digital signal D4(0).

5 Claims, 39 Drawing Sheets

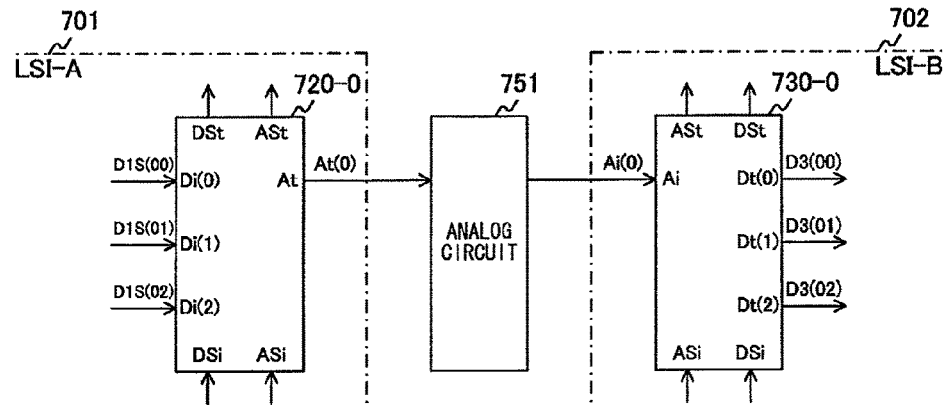
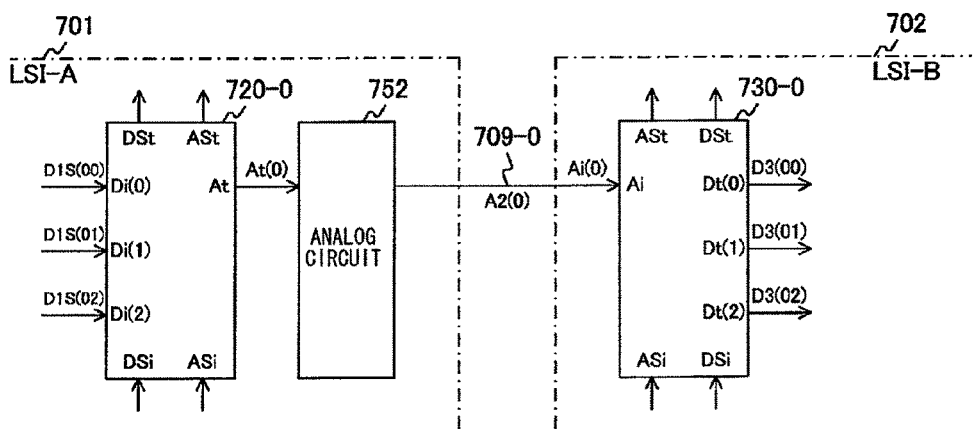
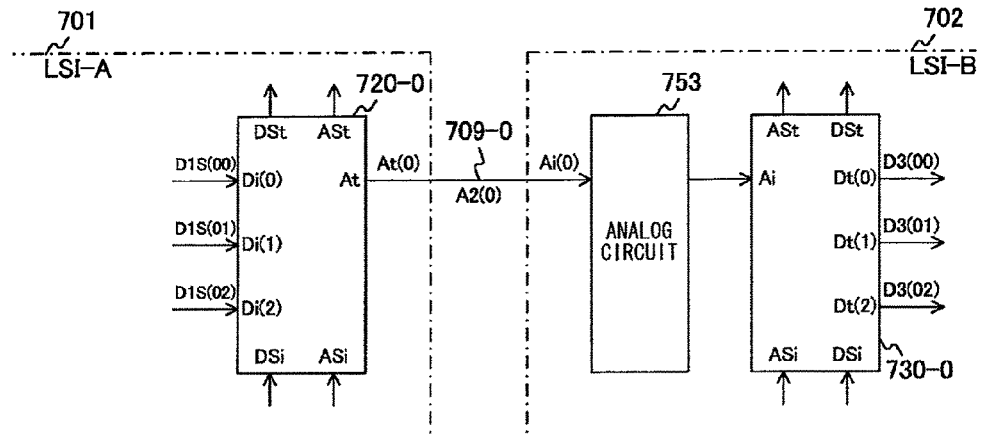
FIG. 34

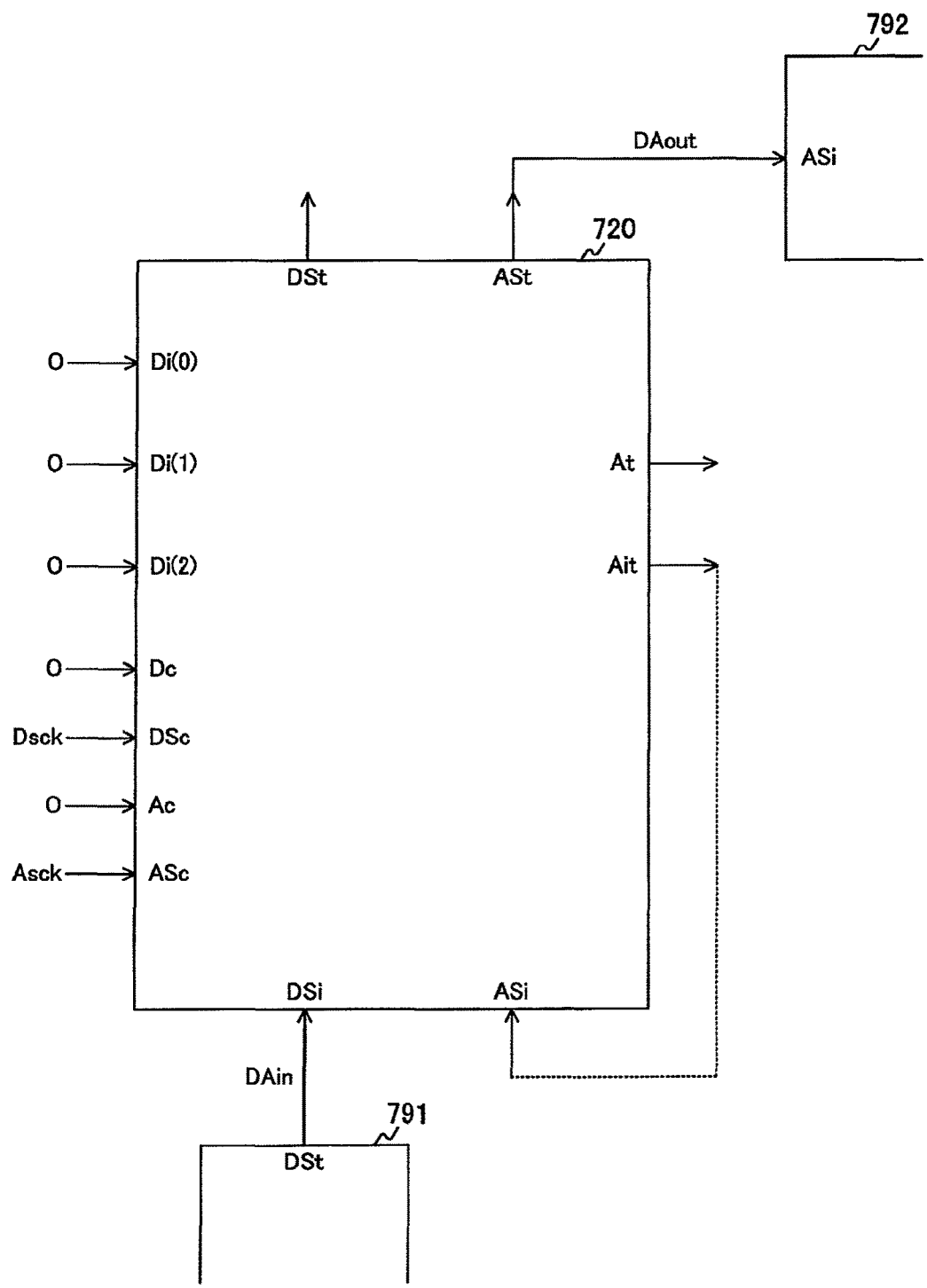
F I G. 37 ize_grantedINTERFACE CIRCUIT, ANALOG FLIP-FLOP, AND DATA PROCESSOR

TECHNICAL FIELD

The present invention relates to a data processor and, more specifically, to an interface circuit in charge of transfer between LSIs, boards, devices (units), and others, and an analog flip-flop storing instantaneous values of analog data specifically in the circuit as analog values, or supplying the analog values in storage as analog data in the circuit.

BACKGROUND ART

In recent years, thanks to the advance of semiconductor technology and circuit technology, the clock speed in LSIs and boards is ever increasing. With such an increase of the clock speed, the interface between LSIs, boards, devices (units), and others is a bottleneck. For transmission and reception of data of digital signals, a need arises also for minimum compensation of delay, and there thus needs to make adjustments to allow transmission of the data in a period of time much shorter than a clock period.

In order to be ready for such an increase of the clock speed, proposed is a technology for automatically correcting any cable delay and any bit-to-bit skew, for example (e.g., refer to Patent Literature 1.).

On the other hand, as to the currently available digital LSIs, a test method thereof has been greatly innovated technologically, and the technology has reached the level of automatically creating a test circuit in charge of a test of chips in the digital LSIs or a test pattern being a signal sequence for the test. In other words, the digital LSIs are those for processing of binary signals with "0" and "1", and have advantages of being easy to be tested compared with analog LSIs, and being able to simplify a fault model thereof by restrictions to single stuck-at faults, thereby achieving computerization with a method of scan path test or others.

Herein, the scan path test is a method for checking the state of a circuit by using a path (scan path) as a result of establishing a serial connection of flip-flops. Through this scan path, the flip-flops are each stored with any arbitrary value, or any value stored in each of the flip-flops is read through this scan path. In such a scan path test, the flip-flops usually in use are all connected in series in a test mode, and the flip-flops are all so made as to be available for external settings of any arbitrary data (improvement of controllability). Thereafter, the mode is changed to a normal mode, and combinational gates inside of an LSI are each provided with the externally-set data about the flip-flops. An addition of clock is then made so that the output of such gates is captured into any same flip-flop. Lastly, the mode is then changed to the test mode again for scan-out (improvement of observability), and a signal of the internal gate is output to the outside of the LSI, thereby making a determination whether the gate output is normal or abnormal. This operation is repeated until any desired fault coverage is achieved. Such an example of utilizing the scan path test for a text of digital LSIs has been widely known (e.g., refer to Patent Literature 2.).

Citation List

Patent Literature

Patent Literature 1: Japanese Unexamined Patent Publication No. 11-112483 (FIG. 1)

Patent Literature 2: U.S. Pat. No. 2,550,521 (FIG. 5)

SUMMARY OF INVENTION

However, with the previous technology described in Patent Literature 1, there needs to send out a test pattern in advance for use of phase/synchronization adjustments, thereby complicating the processing. In order to avoid such a need for adjustments, reducing the clock speed in the interface may be a possibility, but this may cause the reduction of a transfer speed. In order to maintain the transfer speed even with the reduction of the clock speed, increasing the number of signal lines for parallel transfer may be a possibility, but a larger number of signal lines may not be allowed in view of implementation.

On the other hand, as to a test method of analog LSIs, the processing thereof is complex because the analog LSIs each handle any successive analog values, and computerization thereof is taking time to be in practical use because there is not yet an algorithm effective enough for fault detection. With the analog signal processing, the flip-flops are not generally used, and the LSIs are applied with alternating-current and/or direct-current analog signals. For example, applying signals of various levels and frequencies directly to the LSIs leads to the control over amplifiers, filters, and others with relative ease. In other words, the analog LSIs often have a satisfactory level of controllability as are each including circuits that can be uniquely defined by the electric potential of nodes, for example. On the other hand, assuming that an LSI carries therein a filter, for example, an input of the filter can be applied with any predetermined signal with relative ease as described above so that an output thereof is to be input to a subsequent signal processing circuit. In this case, for observing the output of the filter, there needs to provide inside a special test circuit. In other words, the analog LSIs are generally poor in observability.

Therefore, as to the analog LSIs, keeping track of internal signals and electric potential is considered useful in view of improving the observability. Moreover, improving more the controllability is considered useful in view of the better efficiency of the test.

Accordingly, there is a demand for an interface circuit and a data processor that can increase the data transfer efficiency per signal line on an interface between LSIs, boards, devices (units), and others. There is also a demand for an analog flip-flop and a data processor that can establish synchronization of data paths or scan paths in an analog LSI.

A first interface circuit of the invention is provided with output digital value output means, output analog value output means, and an output analog flip-flop. The output digital value output means outputs an output digital value of k bits (where k is an integer of 2 or larger). The output analog value output means outputs a piece of output analog value corresponding to the k-bit output digital value in m pieces (where m is an integer of n or larger) of values including n pieces (where n is an integer satisfying "3≦n≦(k-th power of 2)) of discrete values. The output analog flip-flop retains and outputs the output analog value based on a common trigger signal. As such, in a circuit or others being an output destination, by an input made based on the common trigger signal, synchronization is established between the output and input of the analog value by the control over the common trigger signal. In this case, outputting and inputting the k-bit digital value as it is by communications and/or interfacing require at least k pieces of signal lines (e.g., pieces of pins, pieces of wiring patterns, and pieces of cables). On the other hand, carrying out communications (or interfacing) using a piece of analog value corresponding to the k-bit digital value requires only a single piece of signal line, thereby being able to reduce the number of pins, the number of wiring patterns, the number of cables, and others. For example, with a degree of accuracy that allows discrimination of discrete values of n=(k-th power of 2), transfer can be performed with a single piece of signal line (i.e., the number of signal lines of 1/k). Moreover, these lead to the reduction of region needed for interfacing and to the reduction of communications distance so that the resulting device can be reduced in size, and the processing can be performed at a higher speed.

Further, in this first interface circuit, the output digital value output means may include common output digital value retention means that retains and outputs the k-bit output digital value based on the common trigger signal. If this is the configuration, through control over the common trigger signal, synchronization is established entirely over the timing for the retention of the k-bit output digital value to the timing for the output of any one corresponding output analog value. Moreover, by an input made based on the common trigger signal in a circuit or others being an output destination, synchronization is established entirely over also the input and output of the analog value.

Still further, in this first interface circuit, the output digital value output means may further include k pieces of specific output digital value retention means, and specific output digital value shift means. The k pieces of specific output digital value retention means each retain and output a 1-bit output digital value based on an output trigger signal, which is specific for the control over the output digital value. The specific output digital value shift means shifts, based on the output trigger signal, by using an output of any of the k pieces of specific output digital value retention means located at the i-th (where i is an arbitrary integer satisfying "$1 \leq i \leq (k-1)$") as an input of any of the specific output digital value retention means located at the i+1-th, the output digital values retained by the k pieces of specific output digital value retention means. The common output digital value retention means may receive the output digital values of k bits in total coming from the k pieces of specific output digital value retention means based on the common trigger signal, and may retain and output the values as the k-bit output digital value. Therefore, the k-bit output digital value is output at least in a cycle of the k pieces of output trigger signals.

Still further, in this first interface circuit, the common trigger signal may have a cycle k times longer than a cycle of the output trigger signal. If this is the configuration, in accordance with such a long cycle being k times longer than the cycle of the output trigger signal, synchronization is established entirely over the output of the k-bit output digital value under the control of the common trigger signal, the processing before the output of any one corresponding output analog value, and also the input (communications and interfacing) of the analog value based on the common trigger signal in a circuit or others being an output destination. As such, even when the output trigger signal has a short cycle, in other words, even when the output is a digital value coming from a digital circuit operating at a high speed, a long-distance transmission process between LSIs, boards, units, and others is possible with a sufficient length of time being k times longer with no reduction of a throughput.

Still further, in this first interface circuit, the output analog flip-flop may retain an analog value by accumulating an electric charge in a diffusion layer region formed on a semiconductor substrate. For example, as an electric charge transfer element, a BBD (Bucket Brigade Device/Bucket Bridge Device) can be used.

Still further, in this first interface circuit, the output analog flip-flop may retain an analog value by accumulating an electric charge in a depletion layer region generated on the semiconductor substrate. For example, as an electric charge transfer element, a CCD (Charge Coupled Device) can be used.

Furthermore, a second interface circuit of the invention is provided with an input analog flip-flop, and input digital value input means. The input analog flip-flop receives and retains, based on a common trigger signal, an input analog value indicating any of m pieces (where m is an integer of n or larger) of values including n pieces (where n is an integer satisfying "$3 \leq n \leq (k\text{-th power of }2)$", and k is an integer of 2 or larger) of discrete values. The input digital value input means receives and retains an input digital value of k bits corresponding to the input analog value. With such a configuration, in a circuit or others being an output source, by an output made based on the common trigger signal, synchronization is established between the output and input of an analog value during communications and interfacing by the control over the common trigger signal. Moreover, in this case, communications (or interfacing) of the k-bit digital value requires at least k pieces of signal lines, but carrying out communications (or interfacing) using a piece of analog value corresponding to the k-bit digital value requires only a single piece of signal line, thereby being able to reduce the number of pins, the number of wiring patterns, the number of cables, and others. For example, with a degree of accuracy that allows discrimination of discrete values of n=(k-th power of 2), transfer can be performed with a single piece of signal line (i.e., the number of signal lines of 1/k). Moreover, these lead to the reduction of region needed for interfacing and to the reduction of communications distance so that the resulting device can be reduced in size, and the processing can be performed at a higher speed.

Further, in this second interface circuit, the input digital value input means may include input digital value output means, and common input digital value retention means. The input digital value output means outputs an input digital value of k bits corresponding to the input analog value. The common input digital value retention means retains the k-bit input digital value based on the common trigger signal. If this is the configuration, through control over the common trigger signal, synchronization is established entirely over the timing for the input of a piece of input analog value to the timing for the retention of a corresponding k-bit input digital value. Moreover, by an output made based on the common trigger signal in a circuit or others being an output source, synchronization is established entirely over also the input and output of the analog value.

Still further, in this second interface circuit, the input digital value input means may further include specific input digital value retention means, and specific input digital value selection means. The specific input digital value retention means receives and retains a 1-bit input digital value based on an input trigger signal being specific to the control over the input digital value. The specific input digital value selection means sequentially selects, based on the input trigger signal, any of the 1-bit input digital values of k bits in total retained by the common input digital value retention means, and supplies the values as an input of the specific input digital value retention means. With such a configuration, the k-bit input digital value is received at least in a cycle of the k pieces of input trigger signals.

Still further, in this second interface circuit, the common trigger signal may have a cycle k times longer than a cycle of the input trigger signal. If this is the configuration, in accordance with such a long cycle being k times longer than the cycle of the input trigger signal, synchronization is established entirely over the input of a piece of input analog value under the control of the common trigger signal, the processing before the retention of the k-bit input digital value, and also the output (communications and interfacing) of the analog value based on the common trigger signal in a circuit or others being an output source. As such, even when the input trigger signal has a short cycle, in other words, even when the input is a digital value for input to a digital circuit operating at a high speed, a long-distance transmission process between LSIs, boards, units, and others is possible with a sufficient length of time being k times longer with no reduction of a throughput.

Still further, in this second interface circuit, the input analog flip-flop may retain an analog value by accumulating an electric charge in a diffusion layer region formed on a semiconductor substrate. For example, as an electric charge transfer element, a BBD (Bucket Brigade Device/Bucket Bridge Device) can be used.

Still further, in this second interface circuit, the input analog flip-flop may retain an analog value by accumulating an electric charge in a depletion layer region generated on the semiconductor substrate. For example, as an electric charge transfer element, a CCD (Charge Coupled Device) can be used.

Moreover, a first data processor of the invention is provided with an output interface circuit, an input interface circuit, and control means. The output interface circuit outputs, based on a common trigger signal, an output digital value of k bits (where k is an integer of 2 or larger) as a corresponding piece of output analog value in m pieces (where m is an integer of n or larger) of values including n pieces (where n is an integer satisfying "$3 \leq n \leq$ (k-th power of 2)) of discrete values. The input interface circuit receives, based on the common trigger signal, the output analog value as an input analog value, and receives a corresponding input digital value of k bits. The control means controls a supply of the common trigger signal with respect to the output interface circuit and the input interface circuit. As such, synchronization is established between the output and input (communications, and interfacing) of the analog values by control over the common trigger signal. Moreover, in this case, carrying out communications (or interfacing) of a k-bit digital value as it is requires at least k pieces of signal lines (e.g., pieces of pins, pieces of wiring patterns, and pieces of cables). On the other hand, carrying out communications (or interfacing) using a corresponding piece of analog value requires only a single piece of signal line, thereby being able to reduce the number of pins, the number of wiring patterns, the number of cables, and others. For example, with a degree of accuracy that allows discrimination of discrete values of n=(k-th power of 2), transfer can be performed with a single piece of signal line (i.e., the number of signal lines of 1/k). Moreover, these lead to the reduction of region needed for interfacing and to the reduction of communications distance so that the resulting device can be reduced in size, and the processing can be performed at a higher speed.

Moreover, an analog flip-flop of the invention is provided with input analog value retention means, and output analog value retention means. The input analog value retention means retains an input analog value. The output analog value retention means transfers the input analog value retained by the input analog value retention means based on a transfer trigger signal, and retains the value as an output analog value. In this manner, in all of the analog flip-flops, synchronization is established over the timing for the retention of output analog values through control over the transfer trigger signal.

Further, in this analog flip-flop, the input analog value may indicate any of m pieces (where m is an integer of n or larger) of values including n pieces (where n is an integer of 3 or larger) of discrete values. As such, with a degree of accuracy that allows discrimination of m pieces of discrete values, any waveform deformation, noise addition, or others as analog data are allowed, thereby allowing waveform shaping, reproduction, or others.

Still further, in this analog flip-flop, the input analog value retention means may include input means that receives the input analog value based on an input trigger signal. With such a configuration, like a digital flip-flop of a master-slave type, control is applied using two trigger signals (e.g., positive and negative trigger signals of any same signal).

Still further, in this analog flip-flop, the input means may include first input means, and second input means. The first input means receives a first analog value as the input analog value based on a first trigger signal, and the second input means receives a second analog value as the input analog value based on a second trigger signal. If this is the configuration, based on the control over the application of the input trigger signal, the input analog value is selectively received and retained.

Still further, in this analog flip-flop, either the first or second trigger signal may be an input trigger signal for a scan operation command. If this is the case, by connecting an output analog value of any adjacent analog flip-flop as corresponding (first and second) input analog values, thereby implementing as a scan-function-provided flip-flop that can make a general input by the remaining input trigger signal.

Still further, this analog flip-flop may further include output means that outputs the output analog value retained by the output analog value retention means based on an output trigger signal. If this is the configuration, the output timing is controlled based on the control over the output trigger signal.

Still further, in this analog flip-flop, one or both of the input analog value retention means and the output analog value retention means may retain an analog value by accumulating an electric charge in a diffusion layer region formed on a semiconductor substrate. For example, as an electric charge transfer element, a BBD (Bucket Brigade Device/Bucket Bridge Device) can be used.

Still further, in this analog flip-flop, one or both of the input analog value retention means and the output analog value retention means may retain an analog value by accumulating an electric charge in a depletion layer region generated on the semiconductor substrate. For example, as an electric charge transfer element, a CCD (Charge Coupled Device) can be used.

Moreover, a second data processor of the invention is provided with a plurality of analog flip-flops, and control means. The plurality of analog flip-flops is each allowed to receive, retain, and output arbitrary analog value indicating an arbitrary analog value. The control means controls the operation timing of the plurality of analog flip-flops. Each of the plurality of analog flip-flops includes input analog value retention means, and output analog value retention means. The input analog value retention means retains an input analog value, and the output analog value retention means retains, as an output analog value, the input analog value that is retained by the input analog value retention means and is received based on a transfer trigger signal. The control means includes transfer trigger signal supply means that supplies the same transfer trigger signal to the plurality of analog flip-flops. With such a configuration, through control over the transfer trigger signal, synchronization is established over the timing for the retention of output analog values of a plurality of analog flip-flops.

As described above, according to the first and second interface circuits of the invention, and the first data processor thereof, the data transfer efficiency per signal line can be increased on an interface between LSIs, boards, devices (units), and others. Moreover, according to the analog flip-flop of the invention, and the second data processor thereof, synchronization can be established over data paths or scan paths in an analog LSI.

BRIEF DESCRIPTION OF DRAWINGS

[FIG. 34] A diagram showing a modified example of the LSI-to-LSI transfer using the analog scan circuit in the embodiment of the invention.

[FIG. 37] A diagram showing another implementation example of the scan-path-use D/A converter in the embodiment of the invention.

DESCRIPTION OF EMBODIMENT

Next, an embodiment of the invention is described in detail by referring to the accompanying drawings.

Figure 1:
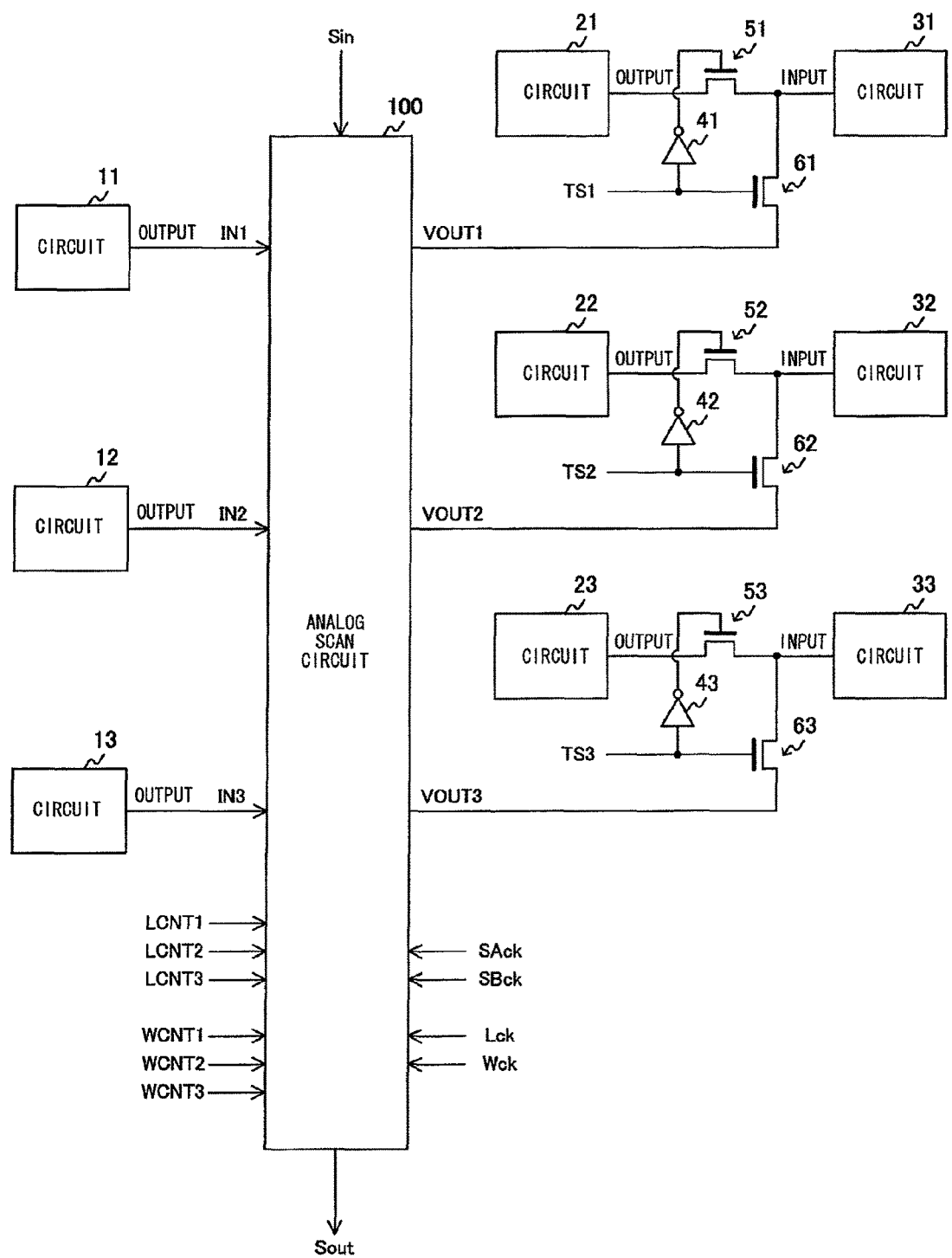
[FIG. 1] A diagram showing an exemplary relationship between an analog scan circuit 100 and a group of circuits each being a test target in an embodiment of the invention.

FIG. 1 is a diagram showing an exemplary relationship between an analog scan circuit 100 in the embodiment of the invention, and a group of circuits each being a test target therein. Circuits 11 to 13 are each a circuit being an observation target during a test. Circuits 31 to 33 are each a circuit being a control target during the test. Note herein that, for convenience of description, it is assumed that the circuit being an observation target and the circuit being a control target are provided three each, but this is surely not restrictive.

The analog scan circuit 100 has a function of sampling the voltage of signals provided from the inside of the circuits 11 to 13 to input terminals IN1 to IN3, and storing the sampling results as analog values. The analog scan circuit 100 also has a function of supplying the analog values from output terminals VOUT1 to VOUT3 to the circuits 31 to 33, and making settings of the supplied values as the voltage of signals in each of the circuits. Moreover, the analog scan circuit 100 is provided with a scan-in terminal Sin and a scan-out terminal Sout, and has a function of storing test data provided by a (not shown) tester to the scan-in terminal Sin as analog values, and outputting the test data from the scan-out terminal Sout to the tester.

Input terminals of the circuits 31 to 33 are each connected with two transistors, i.e., one of 51 to 53, and one of 61 to 63. When one of such two transistors becomes conductive, a signal input is to be made from any of output terminals of the circuits 21 to 23, or from any of output terminals VOUT1 to VOUT3 of the analog scan circuit 100. A determination about which transistor is to be made conductive is controlled by signals from test terminals TS1 to TS3. Gate terminals of the transistors 51 to 53 are respectively provided, by inverters 41 to 43, with signals opposite in polarity to that of signals provided to gate terminals of the transistors 61 to 63. Such a group of transistors is thus controlled so as to be different in state from that of the other group of transistors.

As an example, for testing of the circuit 31, the test terminal TS1 is set with "1" so that the transistor 61 is put in the ON state, and the transistor 51 is put in the OFF state. In response thereto, the circuit 31 is provided with a signal from the VOUT1 of the analog scan circuit 100. On the other hand, for the normal operation with no test of the circuit 31, the test terminal TS1 is set with "0" so that the transistor 61 is put in the OFF state, and the transistor 51 is put in the ON state. In response thereto, the circuit 31 is provided with a signal from the circuit 21 in the preceding stage.

The analog scan circuit 100 is provided with a plurality of cells that each store an analog value, and the analog values in storage can be subjected to shift transfer among the cells. For timing control of the transfer as such, the analog scan circuit 100 is provided with clock terminals SAck and SBck for the shift transfer. The analog scan circuit 100 is also provided with clock terminals Lck and Wck. The clock terminal Lck is for newly storing (loading or sampling) analog values into the cells, and the clock terminal Wck is for outputting (writing) the analog values in storage. The analog values stored in the cells are each a pulse amplitude modulation (PAM) signal being an analog signal. In other words, the signal is to be quantized (sampled) in the time direction, but shows an analog value for the amplitude.

The analog scan circuit 100 is also provided with load-use control terminals LCNT1 to LCNT3, and write-use control terminals WCNT1 to WCNT3. The load-use control terminals LCNT1 to LCNT3 are respectively corresponding to the input terminals IN1 to IN3, and are terminals for individually controlling these input terminals. Moreover, the write-use control terminals WCNT1 to WCNT3 are respectively corresponding to the output terminals VOUT1 to VOUT3, and are terminals for individually controlling these output terminals. The specific details about such control will be described later.

Figure 2:
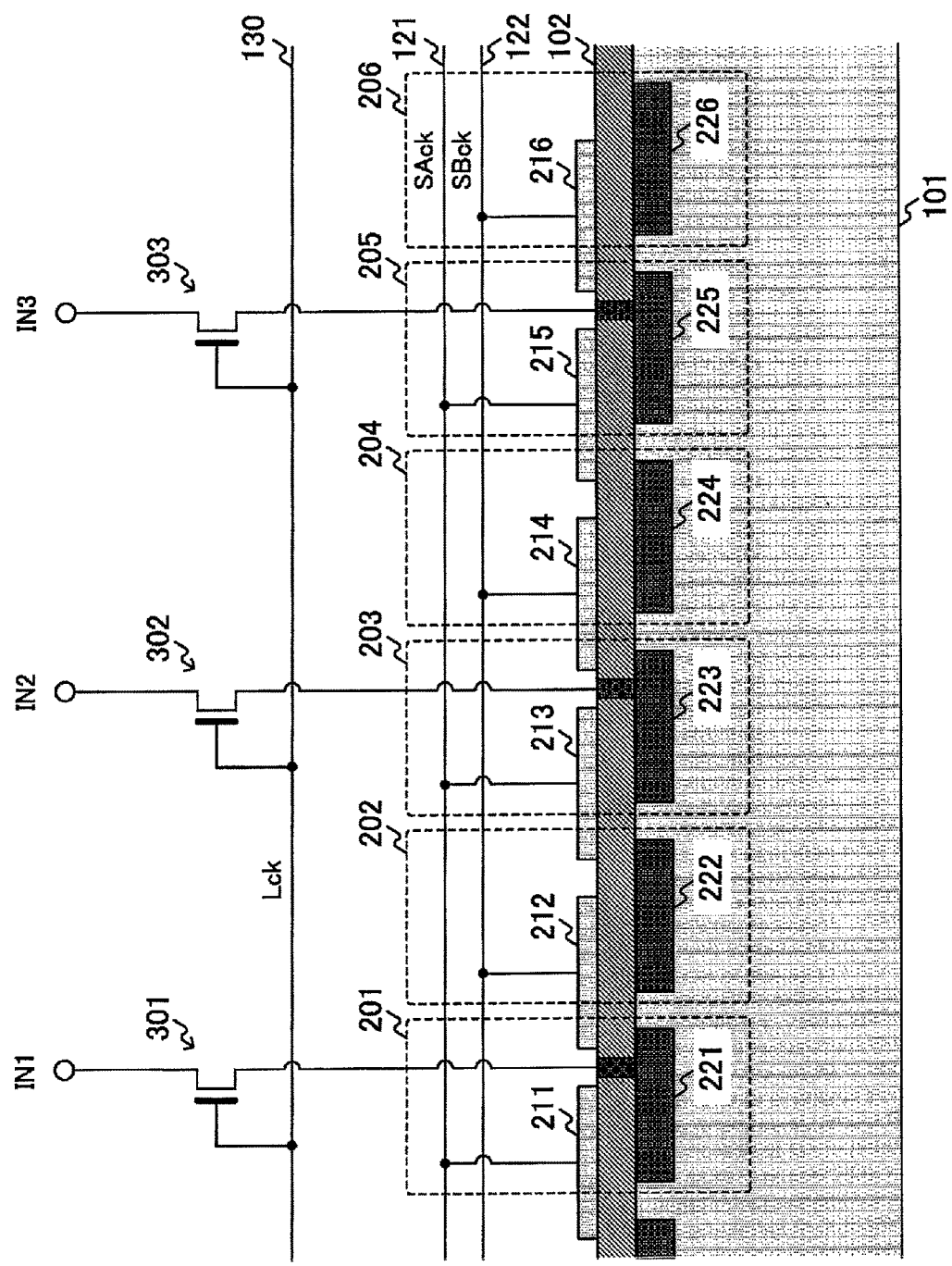
[FIG. 2] A conceptual diagram of a first example of the analog scan circuit 100 in the embodiment of the invention.
Figure 3:
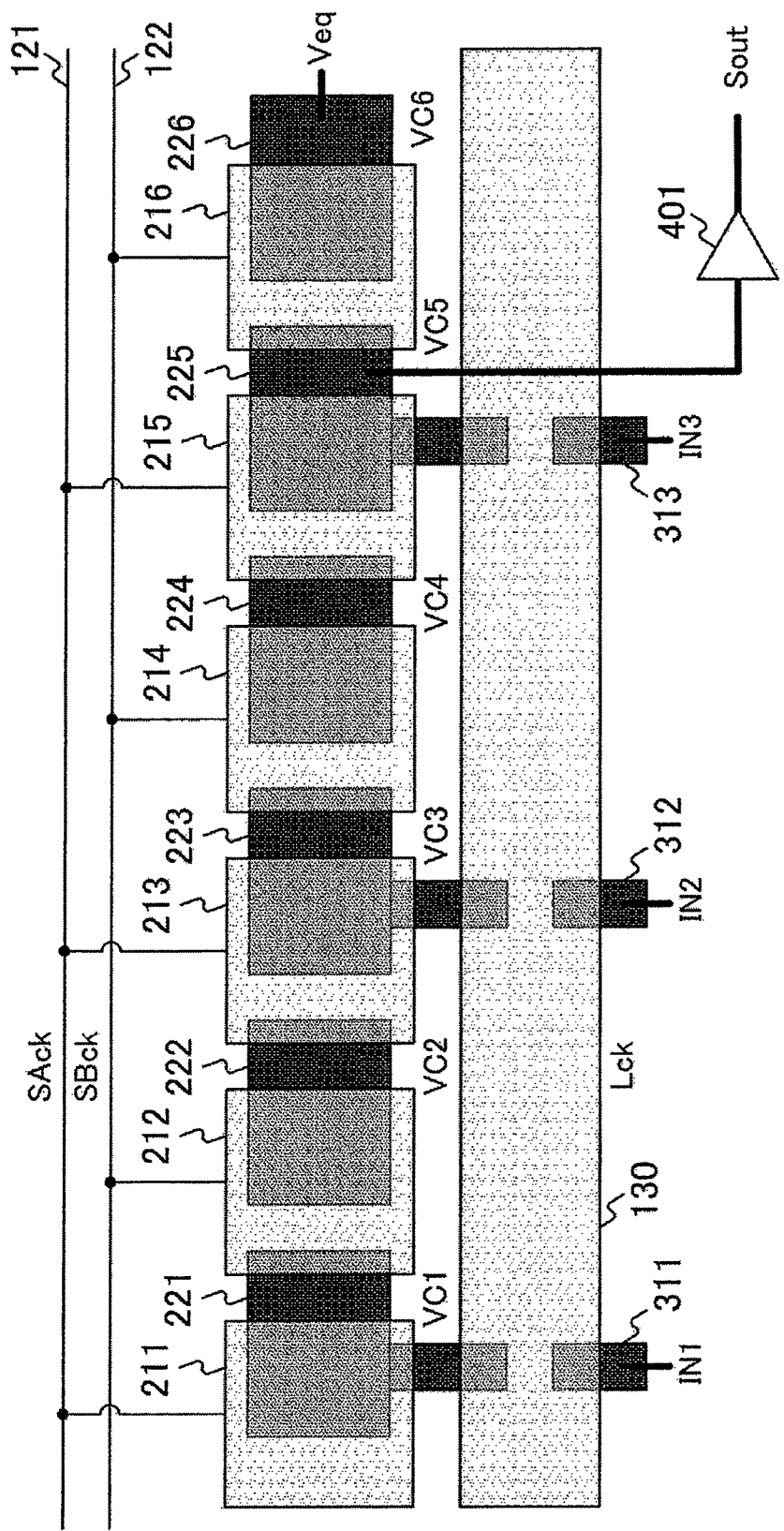
[FIG. 3] A layout diagram of the first example of the analog scan circuit 100 in the embodiment of the invention.

FIG. 2 is a conceptual diagram of a first example of the analog scan circuit 100 in the embodiment of the invention. Further, FIG. 3 is a layout diagram of the first example of the analog scan circuit 100 in the embodiment of the invention.

The analog scan circuit 100 is formed on a P-type silicon substrate 101, for example. An insulation film 102 is formed on the surface of the silicon substrate 101 by an oxidation process. N-type diffusion layer regions 221 to 226 are formed below the insulation film 102. Moreover, on the insulation film 102, gate electrodes 211 to 216 are formed at positions respectively corresponding to the diffusion layer regions 221 to 226. As shown in the drawing, these gate electrodes 211 to 216 are each extended above either of any two corresponding adjacent diffusion layer regions 221 to 226.

Each between the gate electrodes 211 to 216 and the diffusion layer regions 221 to 226, there is a capacitor available for accumulation of electric charge. The gate electrodes 211 to 216 are alternately connected with clock signal lines 121 and 122. The clock signal line 121 is provided with a clock signal SAck, and the clock signal line 121 is provided with a clock signal SBck. By controlling these clock signals SAck and SBck, the accumulated electric charge is transferred from left to right.

Such an analog scan circuit 100 is the one based on a BBD (Bucket Brigade Device/Bucket Bridge Device), and can be divided into cells 201 to 206, which are each being a unit for accumulation of electric charge. Note here that, for convenience of description, the drawing shows the six cells 201 to 206, but this is surely not restrictive. The configuration of the cells in the BBD is described in Japanese Examined Patent Publication No. 47-27573, for example.

The diffusion layer regions 221 to 226 are each available for an input of an output signal from any other circuits. In this first example, the diffusion layer region 221 is connected with a transistor 301, the diffusion layer region 223 is connected with a transistor 302, and the diffusion layer region 225 is connected with a transistor 303. The transistor 301 is connected at an end thereof with the input terminal IN1 (311), the transistor 302 is connected at an end thereof with the input terminal IN2 (312), and the transistor 303 is connected at an end thereof with the input terminal IN3 (313).

Moreover, as to the transistors 301 to 303, their gates are all connected with a load-use clock signal line 130. This clock signal line 130 is provided with a load-use clock signal Lck. As such, when the clock signal Lck is in the state of H (High), the transistors 301 to 303 are each put in the ON state so that analog signals are provided by the input terminals IN1 to IN3 to the diffusion layer regions 221, 223, and 225. By the analog signals provided as such, the capacities between the gate electrodes 211, 213, and 215 and the diffusion layer regions 221, 223, and 225 are each electrically charged. When the clock signal Lck is changed in state to L (Low), the transistors 301 to 303 are put in the OFF state so that the electric charging is stopped.

In this first example, the diffusion layer region 225 is connected with a charge voltage conversion amplifier (QV amplifier) 401, and via this charge voltage conversion amplifier 401, a scan-out signal Sout is output to the scan-out terminal. This charge voltage conversion amplifier 401 is an amplifier for converting the accumulated electric charge into voltage. Moreover, the diffusion layer region 226 is supplied with an initial voltage Veq for equalization use. With both the clock signals SAck and SBck changed in state to H, the diffusion layer regions 221 to 226 have the electric potential coinciding with the initial voltage Veq for equalization use so that the mobile electric charge stored in each of the capacities between the gate electrodes 211 to 216 and the diffusion layer regions 221 to 226 takes an initial value (Qeq). Such equalization is a process for preventing any possible accuracy degradation as a result of an addition of accumulated electric charge, if any, to the electric charge produced from signals. The accumulated electric charge is the one in the cell(s) located on the way for data shifting. Note that, since such equalization is performed automatically by a scanning operation, there is no need to perform such equalization again in a second scanning operation and thereafter.

Figure 4:
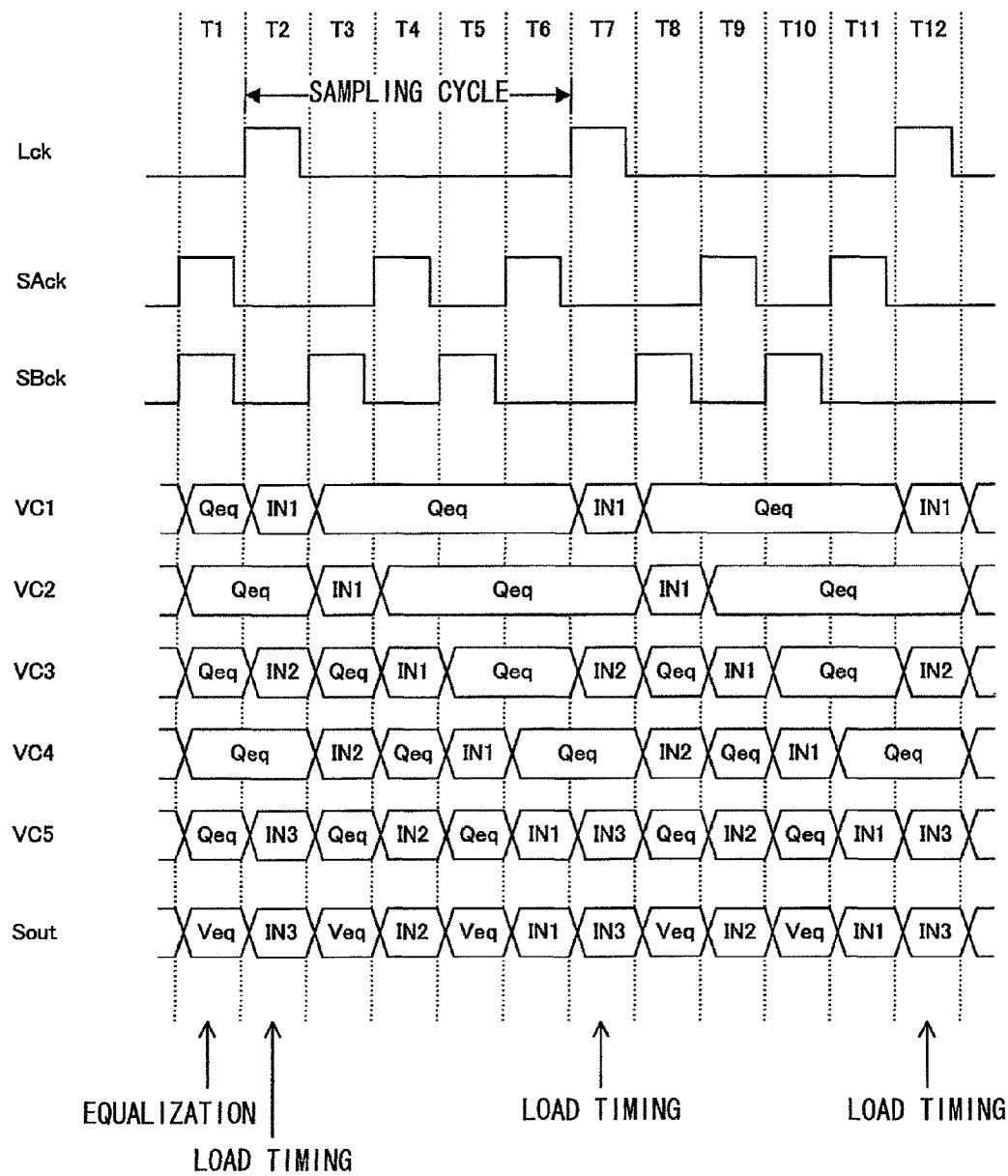
[FIG. 4] A timing diagram of the first example of the analog scan circuit 100 in the embodiment of the invention.

FIG. 4 is a timing diagram of the first example of the analog scan circuit 100 in the embodiment of the invention.

At a time T1, with both the clock signals SAck and SBck changed in state to H, in the diffusion layer regions 221 to 226, electric potentials VC1 to VC6 all coincide with the electric potential Veq for equalization use so that the mobile electric charge takes an initial value (Qeq). As such, the scan-out signal Sout at this time has an initial voltage (Veq).

At a time T2, with the clock signal Lck changed in state to H, analog signals come from the input terminals IN1 to IN3 for a respective supply to the diffusion layer regions 221, 223, and 225, and thus the electric charge is accumulated as the VC1 to VC3, respectively. The scan-out signal Sout at this time has the electric potential same as that of the input terminal IN3.

At a time T3, with the clock signal SAck changed in state to L, and with the clock signal SBck changed in state to H, transfer of electric charge in storage is performed, i.e., the electric charge stored in the capacities between the gate electrodes 211, 213, and 215 and the diffusion layer regions 221, 223, and 225 is transferred to the capacities between the gate electrodes 212, 214, and 216 and the diffusion layer regions 222, 224, and 226. After such transfer, the mobile electric charge in the capacities between the gate electrodes 211, 213, and 215 and the diffusion layer regions 221, 223, and 225 takes an initial value (Qeq).

At a time T4, with the clock signal SAck changed in state to H, and with the clock signal SBck changed in state to L, another transfer of electric charge in storage is performed, i.e., the electric charge stored in the capacities between the gate electrodes 212, 214, and 216 and the diffusion layer regions 222, 224, and 226 is transferred to the capacities between the gate electrodes 211, 213, and 215 and the diffusion layer regions 221, 223, and 225. The scan-out signal Sout at this time has the electric potential same as that of the input terminal IN2 at the time T2.

Similarly, at a time T5, the clock signal SAck is changed in state to L, and the clock signal SBck is changed in state to H. Then at a time 6 thereafter, the clock signal SAck is changed in state to H, and the clock signal SBck is changed in state to L. As a result, the scan-out signal Sout at the time T6 has the electric potential same as that of the input IN1 at the time T2.

At a time T7 and thereafter, the operation at the time T2 and thereafter is to be repeated. Accordingly, the sampling (load) cycle in this first example is 5T where 1T denotes a half cycle of the clock signal SAck or that of the clock signal SBck.

As such, in the first example in the embodiment of the invention, analog signals coming from the input terminals IN1 to IN3 are captured in response to the state change of the clock signal Lck to H. Thereafter, transfer of electric charge is performed by alternately changing the state of the clock signals SAck and SBck to H, whereby a scan-out signal Sout can be output.

Figure 5:
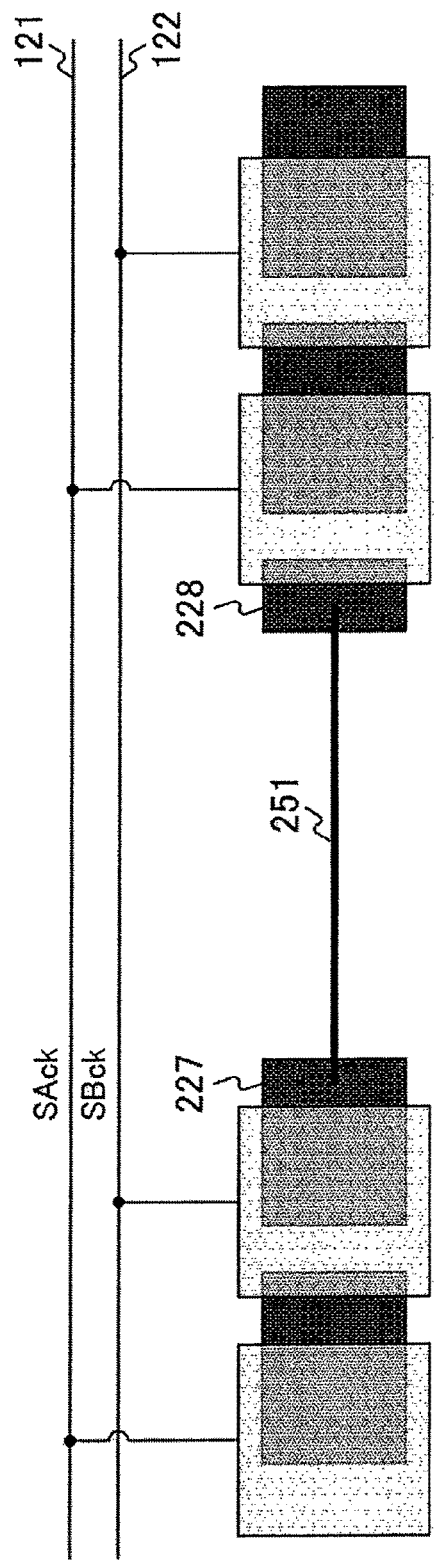
[FIG. 5] A diagram showing an exemplary placement in which BBD cells are scattered in the embodiment of the invention.

Note that, in an LSI in actual use, since signals for monitoring are scattered at random in the LSI, if BBD cells are all disposed collectively at a part of the LSI, a need arises for wiring to the BBD cells from their nodes, thereby resultantly increasing the chip area. In consideration thereof, preferably, the BBD cells are scattered so as to be located near their own nodes, and are disposed like a graphic drawn with a single stroke of pen so as to minimize the total length of wiring. FIG. 5 is a diagram showing an exemplary placement in which the BBD cells are scattered in the embodiment of the invention. As in this example, a diffusion layer region 227 in one BBD cell is connected with, by a signal line 251, a diffusion layer region 228 in another BBD cell so that even the BBD cells scattered as such can be handled as a piece of scan path.

Figure 6:
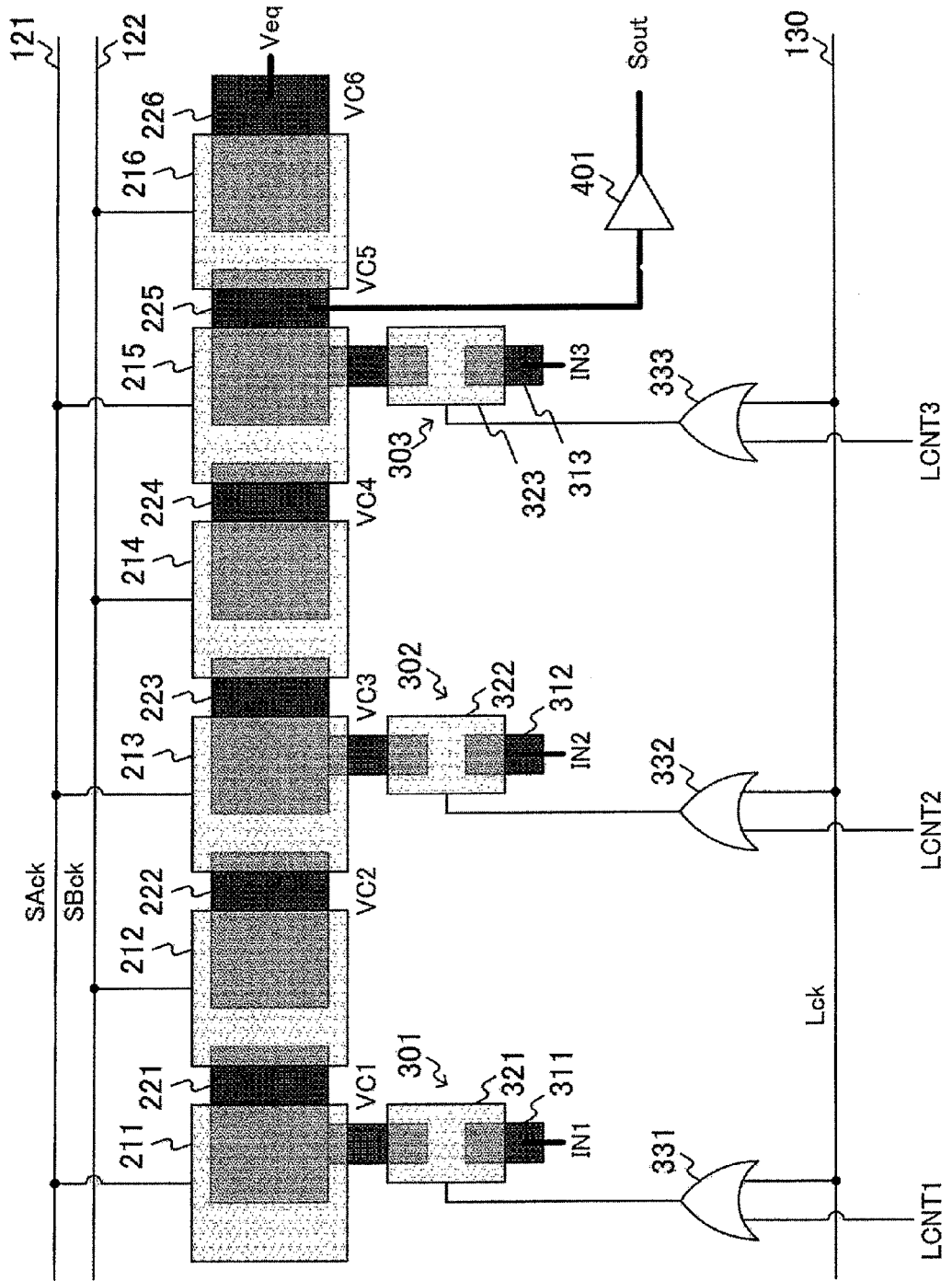
[FIG. 6] A layout diagram of a second example of the analog scan circuit 100 in the embodiment of the invention.

FIG. 6 is a layout diagram of a second example of the analog scan circuit 100 in the embodiment of the invention. In the first example, the transistors connected with the input terminals IN1 to IN3 are all connected at their gates with the load-use clock signal line 130 of shared use. However, in this second example, the transistors connected with the input terminals IN1 to IN3 are connected at their gate electrodes 321 to 323 individually with each corresponding control signal line. These individual signal lines are connected with outputs of OR gates 331 to 333, respectively.

The OR gates 331 to 333 are logical gates that respectively generate ORs (OR) of the control signals LCNT1 to LCNT3 with the load-use clock signal Lck. Accordingly, even when the load-use clock signal Lck is not in the state of H, the control signals LCNT1 to LCNT3 are individually changed in state to H, thereby being able to capture analog signals from the corresponding input terminals IN1 to IN3.

Figure 7:
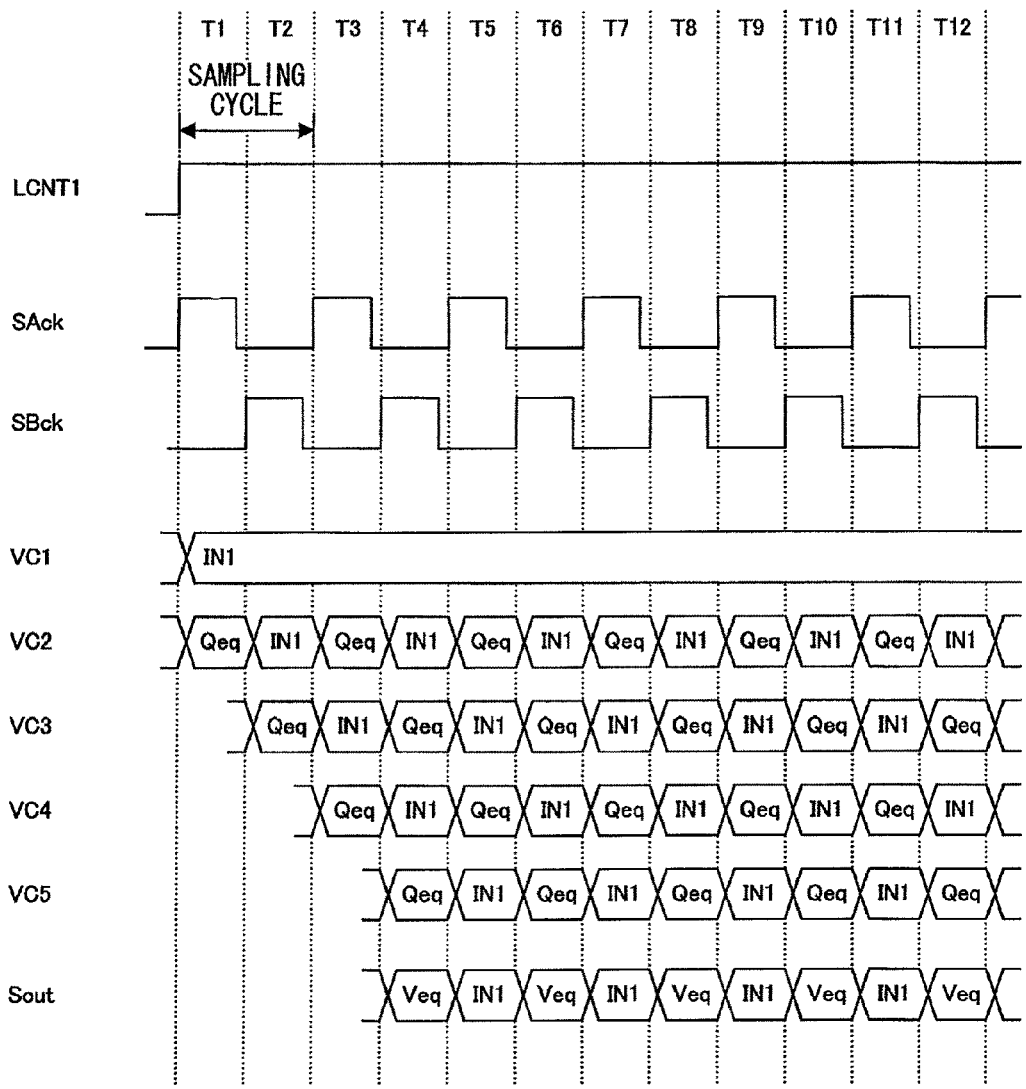
[FIG. 7] A timing diagram of the second example of the analog scan circuit 100 in the embodiment of the invention.

FIG. 7 is a timing diagram of the second example of the analog scan circuit 100 in the embodiment of the invention. Assumed in this second example is that, for capturing only an analog signal from the input terminal IN1, stationary settings are made as LCNT1=H, LCNT2=L, LCNT3=L, and Lck=L.

At a time T1, when the control signal LCNT1 is changed in state to H, the diffusion layer region 221 starts receiving an analog value from the input terminal IN1. Moreover, when the clock signal SAck is changed in state to H, and when the clock signal SBck is changed in state to L, transfer of electric charge in storage is performed, i.e., the electric charge stored in the capacities between the gate electrodes 212 and 214 and the diffusion layer regions 222 and 224 is transferred to the capacities between the gate electrodes 213 and 215 and the diffusion layer regions 223 and 225.

At a time T2, with the clock signal SAck changed in state to L, and with the clock signal SBck changed in state to H, transfer of electric charge in storage is performed, i.e., the electric charge stored in the capacities between the gate electrodes 211, 213, and 215 and the diffusion layer regions 221, 223, and 225 is transferred to the capacities between the gate electrodes 212, 214, and 216 and the diffusion layer regions 222, 224, and 226. In other words, an analog signal from the input terminal IN1 is provided not only to the diffusion layer region 221 but also to the diffusion layer region 222 so that the accumulation of electric charge is continued until the timing comes when the clock signal SBck is changed in state again to L.

At a time T3, with the clock signal SAck changed in state to H, and with the clock signal SBck changed in state to L, transfer of electric charge in storage is performed, i.e., the electric charge stored in the capacities between the gate electrodes 212 and 214 and the diffusion layer regions 222 and 224 is transferred to the capacities between the gate electrodes 213 and 215 and the diffusion layer regions 223 and 225. In other words, the electric charge accumulated by the input terminal IN1 at the time T2 between the gate electrode 212 and the diffusion layer region 222 is transferred to the capacitor between the gate electrode 213 and the diffusion layer region 223.

At a time T4, with the clock signal SAck changed in state to L, and with the clock signal SBck changed in state to H, transfer of electric charge in storage is performed, i.e., the electric charge stored in the capacities between the gate electrodes 211, 213, and 215 and the diffusion layer regions 221, 223, and 225 is transferred to the capacities between the gate electrodes 212, 214, and 216 and the diffusion layer regions 222, 224, and 226. In other words, an analog signal from the input terminal IN1 is provided not only to the diffusion layer region 221 but also to the diffusion layer region 222 so that the accumulation of electric charge is continued until the timing comes when the clock signal SBck is changed in state again to L. Moreover, the electric charge accumulated by the input terminal IN1 at the time T2 between the gate electrode 212 and the diffusion layer region 222 is transferred to the capacitor between the gate electrode 214 and the diffusion layer region 224.

At a time T5, with the clock signal SAck changed in state to H, and with the clock signal SBck changed in state to L, transfer of electric charge in storage is performed, i.e., the electric charge stored in the capacities between the gate electrodes 212 and 214 and the diffusion layer regions 222 and 224 is transferred to the capacities between the gate electrodes 213 and 215 and the diffusion layer regions 223 and 225. In other words, the electric charge accumulated at the time T4 between the gate electrode 212 and the diffusion layer region 222 is transferred to the capacitor between the gate electrode 213 and the diffusion layer region 223, and the electric charge accumulated at the time T2 between the gate electrode 212 and the diffusion layer region 222 is transferred to the capacitor between the gate electrode 215 and the diffusion layer region 225. As a result, the scan-out signal Sout at the time T5 has the electric potential same as that of the input terminal IN1 at the time 2.

In such a second example, at the time T3 and thereafter, the operation at the time T1 and thereafter is to be repeated. Accordingly, the sampling cycle in this second example is 2T where 1T denotes a half cycle of the clock signal SAck or that of the clock signal SBck. In other words, in the first example, the sampling cycle is long because a plurality of input signals is captured in parallel. However, as in this second embodiment, a control signal is individually provided to each input signal so that the number of targets for sampling can be reduced. As a result, the sampling cycle can be favorably reduced.

Figure 8:
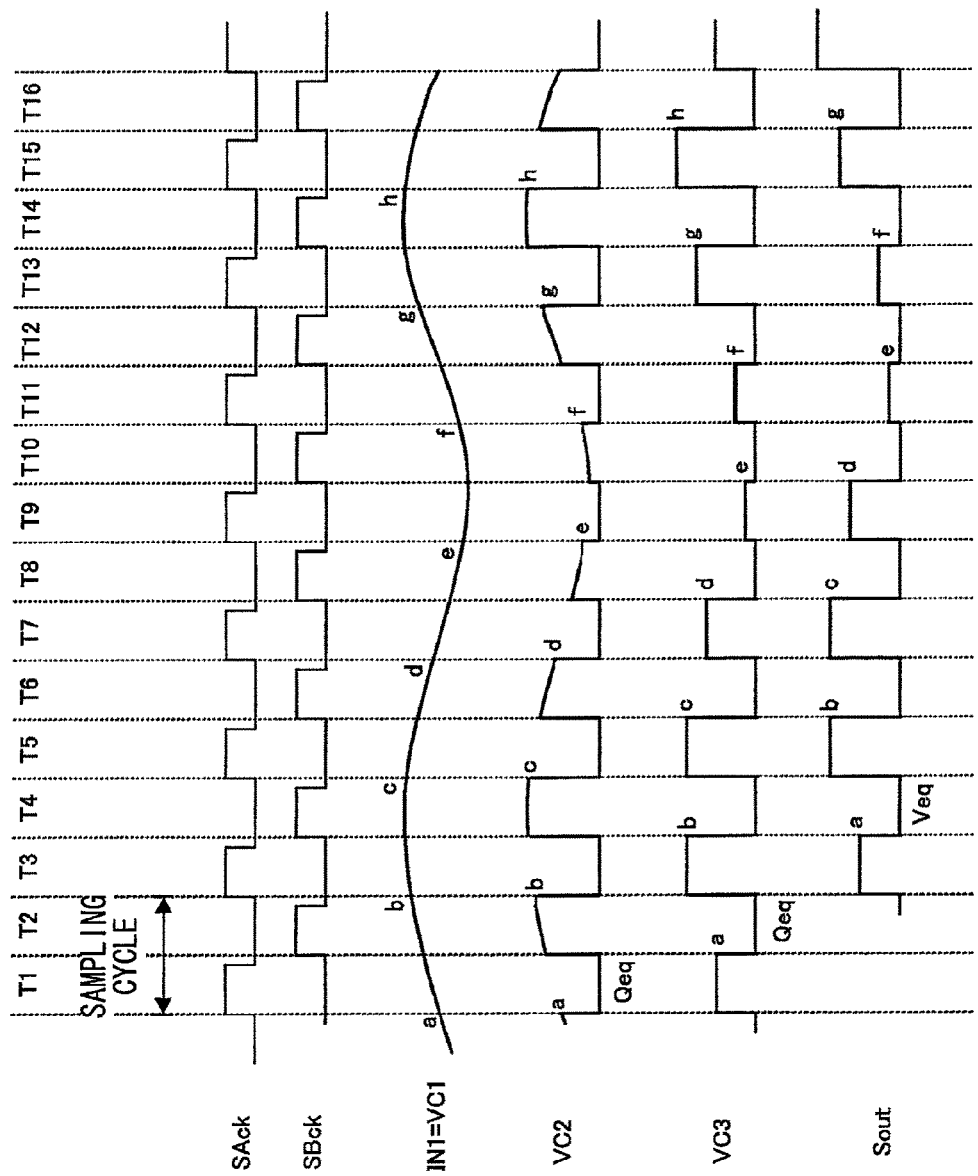
[FIG. 8] A detailed timing diagram of the second example of the analog scan circuit 100 in the embodiment of the invention.

FIG. 8 is a detailed timing diagram of second example of the analog scan circuit 100 in the embodiment of the invention. The drawing shows a specific example in which the input terminal In1 is provided with a sine wave.

Since the LCNT1 is always in the state of H, the diffusion layer region 221 is provided with an analog signal always from the input terminal IN1. Moreover, in a period when the clock signal SBck is in the state of H, the analog signal from the input terminal IN1 is supplied also to the diffusion layer region 222. As a result, an electric charge is accumulated in the capacitor between the gate electrode 212 and the diffusion layer region 222. Thereafter, by the alternate control over the clock signals SAck and SBck, the accumulated electric charge is transferred from left to right.

Figure 9:
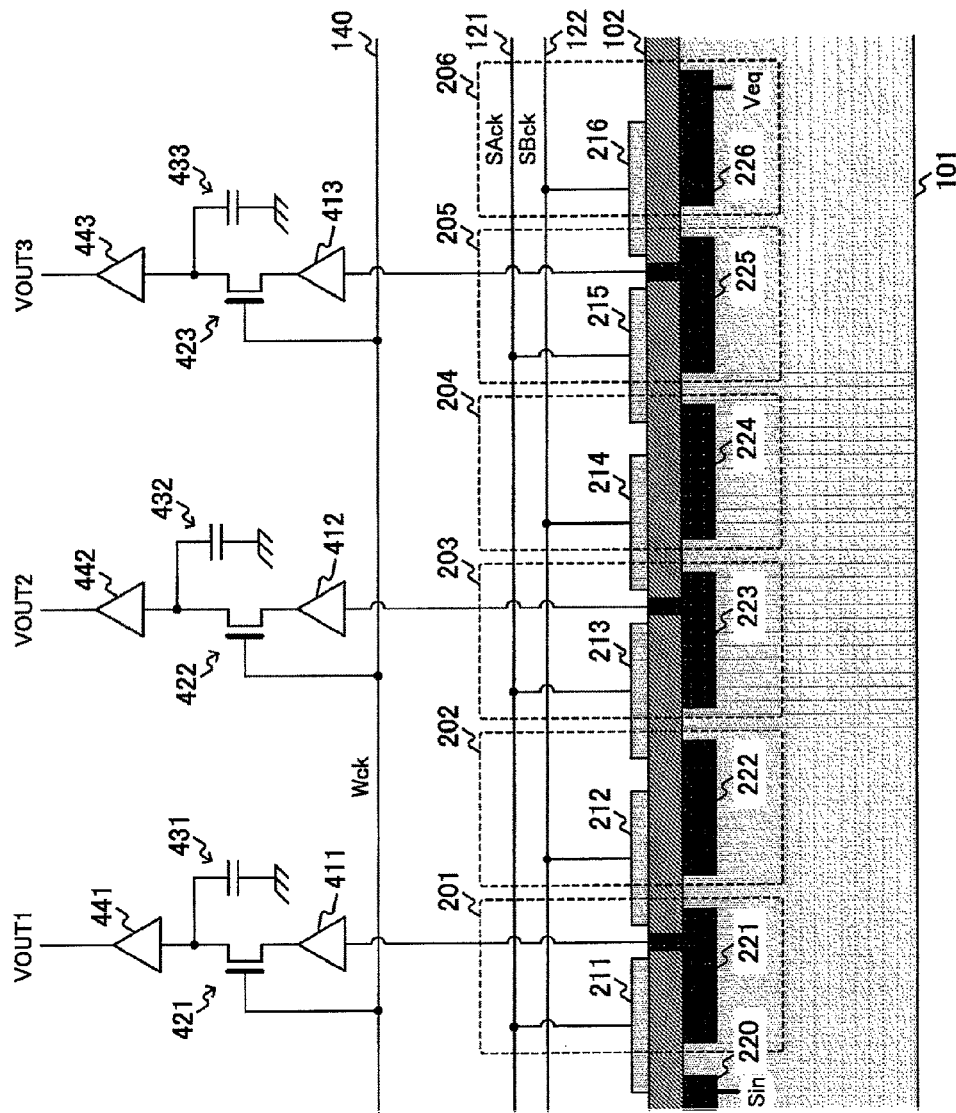
[FIG. 9] A conceptual diagram of a third example of the analog scan circuit 100 in the embodiment of the invention.
Figure 10:
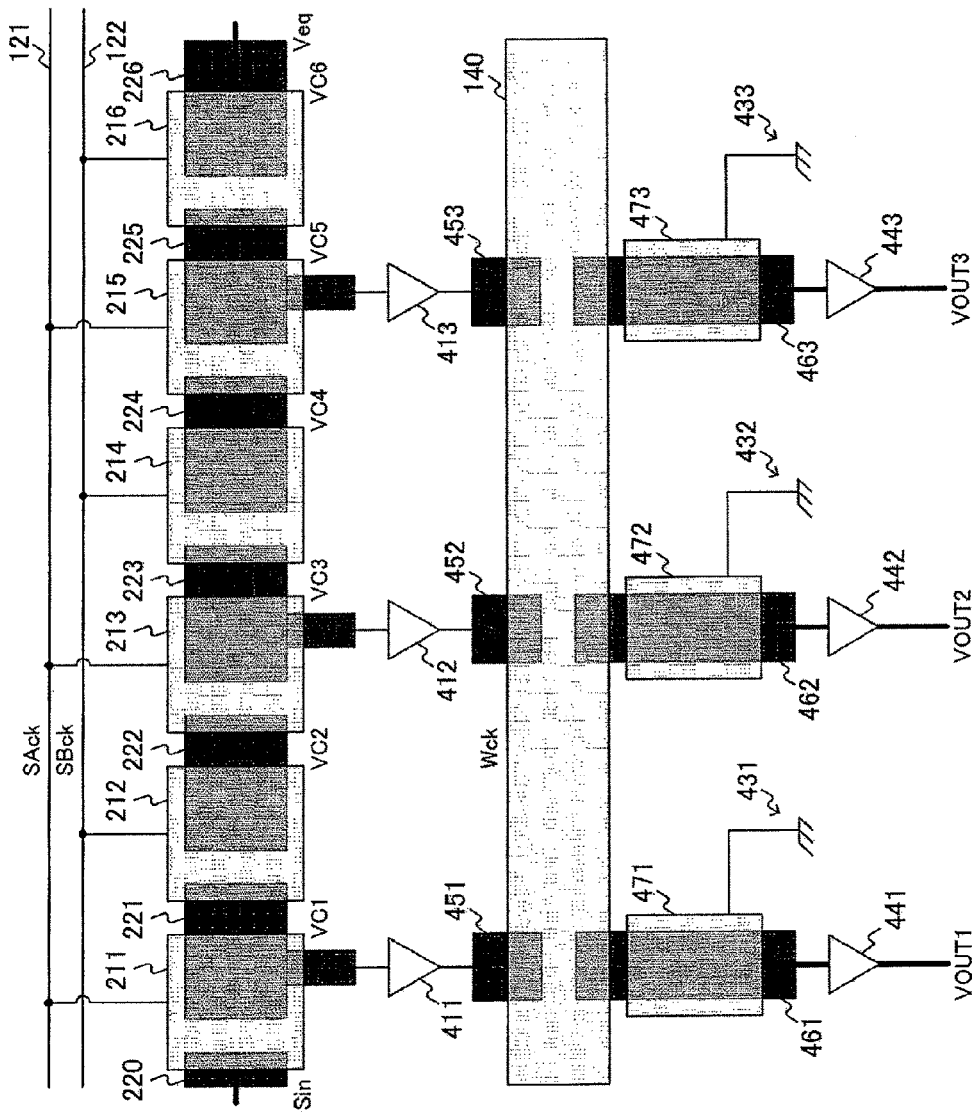
[FIG. 10] A layout diagram of the third example of the analog scan circuit 100 in the embodiment of the invention.

FIG. 9 is a conceptual diagram of a third example of the analog scan circuit 100 in the embodiment of the invention. Moreover, FIG. 10 is a layout diagram of the third example of the analog scan circuit 100 in the embodiment of the invention.

In this third example, a signal from the scan-in terminal Sin is supplied to the diffusion layer region 220. As a result, an electric charge is accumulated in the capacitor between the gate electrode 211 and the diffusion layer region 221. Thereafter, by the alternate control over the clock signals SAck and SBck, the accumulated electric charge is transferred from left to right.

In such a third example, the diffusion layer regions 221, 223, and 225 are connected with charge voltage conversion amplifiers 411 to 413, respectively. These charge voltage conversion amplifiers 411 to 413 are each an amplifier that converts the accumulated electric charge into voltage as described above. The output from such an amplifier becomes voltage, and is not high in impedance.

The outputs from the charge voltage conversion amplifiers 411 to 413 are applied by the diffusion layer regions 451 to 453 to transistors 421 to 423, respectively. The transistors 421 to 423 are supplied at their gates with a clock signal Wck for output use over a clock signal line 140. When this clock signal Wck is in the state of H, the transistors 421 to 423 are put into the ON state, thereby electrically charging capacitors 431 to 433, which are respectively configured by diffusion layer regions 461 to 463, and electrodes 471 to 473. Moreover, when the clock signal Wck is in the state of L, the transistors 421 to 423 are put into the OFF state so that the voltage value as a result of the electric charging is held. As such, the transistors 421 to 423 configure a sample-and-hold circuit respectively with the capacitors 431 to 433. The outputs from such sample-and-hold circuits are respectively connected with amplifiers 441 to 443, and the outputs are respectively supplied to the output terminals VOUT1 to VOUT3.

Figure 11:
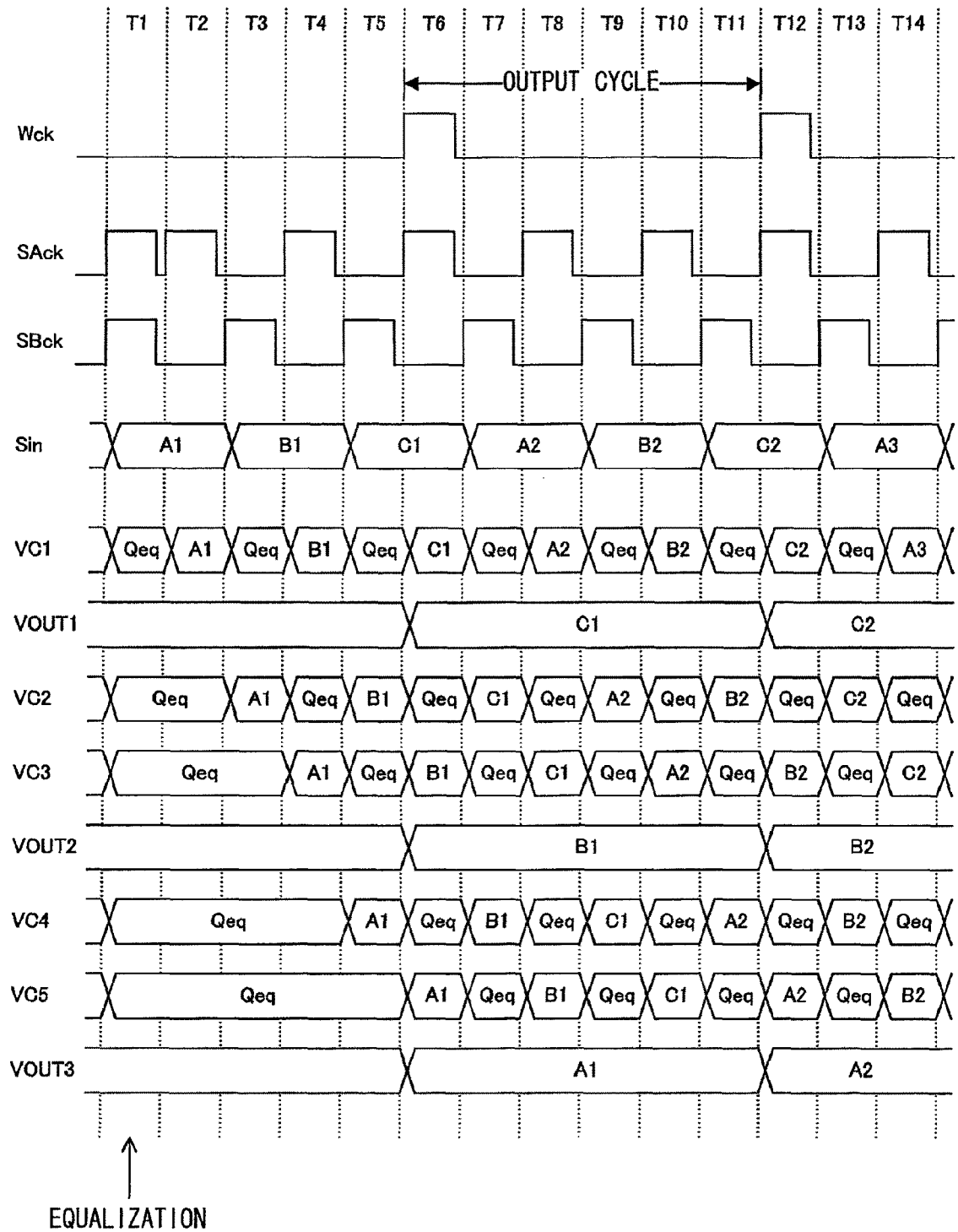
[FIG. 11] A timing diagram of the third example of the analog scan circuit 100 in the embodiment of the invention.

FIG. 11 is a timing diagram of the third example of the analog scan circuit 100 in the embodiment of the invention.

At a time T1, with both the clock signals SAck and SBck changed in state to H, the diffusion layer regions 221 to 226 respectively have the electric potentials VC1 to VC6 coinciding with the electric potential Veq for equalization use so that the mobile electric charge takes an initial value (Qeq).

At a time T2, with the clock signal SAck change in state to H, and with the clock signal SBck changed in state to L, a signal A1 from the scan-in terminal Sin is supplied to the diffusion layer region 221 so that an electric charge of the signal A1 is accumulated in the capacitor between the diffusion layer region 221 and the gate electrode 211 (VC1).

At a time T3, with the clock signal SAck changed in state to L, and with the clock signal SBck changed in state to H, transfer of electric charge in storage is performed, i.e., the electric charge stored in the capacities between the gate electrodes 211, 213, and 215 and the diffusion layer regions 221, 223, and 225 is transferred to the capacities between the gate electrodes 212, 214, and 216 and the diffusion layer regions 222, 224, and 226. In other words, at this time T3, the electric charge of the signal A1 accumulated at the time T2 in the capacitor between the diffusion layer region 221 and the gate electrode 211 is transferred to the capacitor between the diffusion layer region 222 and the gate electrode 212 (VC2).

At a time T4, with the clock signal SAck changed in state to H, and with the clock signal SBck changed in state to L, a signal B1 from the scan-in terminal Sin is supplied to the diffusion layer region 221 so that the electric charge of the signal B1 is accumulated in the capacitor between the diffusion layer region 221 and the electrode 211. Moreover, transfer of electric charge in storage is performed, i.e., the electric charge stored in the capacities between the gate electrodes 212 and 214 and the diffusion layer regions 222 and 224 is transferred to the capacities between the gate electrodes 213 and 215 and the diffusion layer regions 223 and 225. In other words, at this time T4, the electric charge of the signal A1 accumulated at the time T2 in the capacitor between the diffusion layer region 221 and the gate electrode 211 is transferred to the capacitor between the diffusion layer region 223 and the gate electrode 213 (VC3).

At a time T5, with the clock signal SAck changed in state to L, and with the clock signal SBck changed in state to H, transfer of electric charge in storage is performed, i.e., the electric charge stored in the capacities between the gate electrodes 211, 213, and 215 and the diffusion layer regions 221, 223, and 225 is transferred to the capacities between the gate electrodes 212, 214, and 216 and the diffusion layer regions 222, 224, and 226. In other words, at this time T5, the electric charge of the signal A1 accumulated at the time T2 in the capacitor between the diffusion layer region 221 and the gate electrode 211 is transferred to the capacitor between the diffusion layer region 224 and the gate electrode 214 (VC4), and at the same time, the electric charge of the signal B1 accumulated at the time T4 in the capacitor between the diffusion layer region 221 and the gate electrode 211 is transferred to the capacitor between the diffusion layer region 222 and the gate electrode 212 (VC2).

At a time T6, with the clock signal SAck changed in state to H, and with the clock signal SBck changed in state to L, a signal C1 from the scan-in terminal Sin is supplied to the diffusion layer region 221 so that the electric charge of the signal C1 is accumulated in the capacitor between the diffusion layer region 221 and the gate electrode 211. Moreover, another transfer of electric charge in storage is performed, i.e., the electric charge stored in the capacities between the gate electrodes 212 and 214 and the diffusion layer regions 222 and 224 is transferred to the capacities between the gate electrodes 213 and 215 and the diffusion layer regions 223 and 225. In other words, at this time T6, it means that the electric charge of the signal A1 accumulated at the time T2 in the capacitor between the diffusion layer region 221 and the gate electrode 211 is transferred to the capacitor between the diffusion layer region 225 and the gate electrode 215 (VC5), and at the same time, the electric charge of the signal B1 accumulated at the time T4 in the capacitor between the diffusion layer region 221 and the gate electrode 211 is transferred to the capacitor between the diffusion layer region 223 and the gate electrode 213 (VC3).

Also at this time T6, with the write-use clock signal Wck changed in state to H, the output terminals VOUT1 to VOUT3 are respectively supplied with analog values C1, B1, and A1. These output terminals VOUT1 to VOUT3 each keep the same value immediately before a time T12 when the clock signal Wck is changed in state to H again by the sample-and-hold circuits.

At a time T7 and thereafter, the operation is to be repeated in a similar manner. In this case, the output cycle in this third example is 6T where 1T denotes a half cycle of the clock signal SAck or that of the clock signal SBck.

Figure 12:
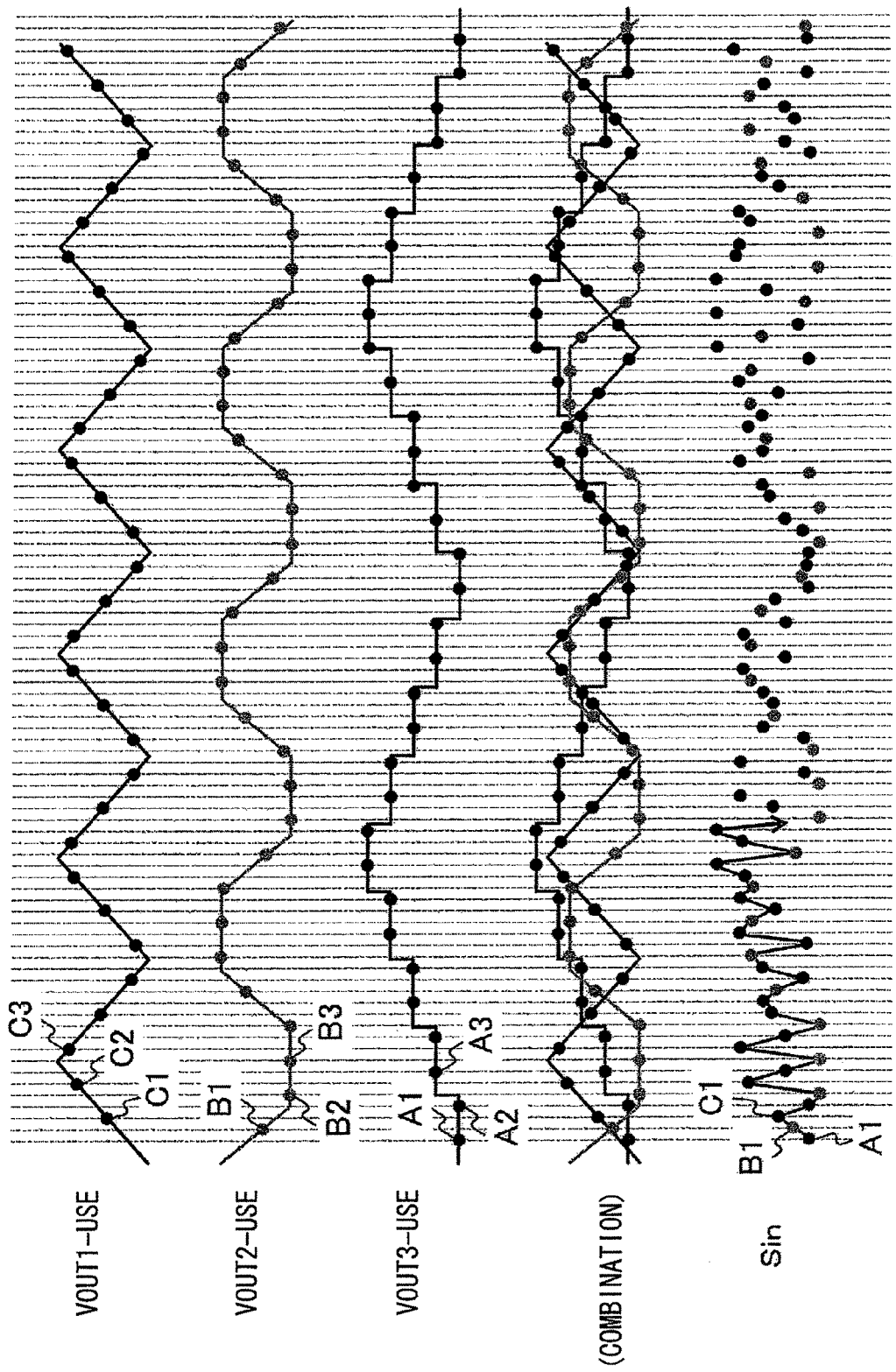
[FIG. 12] Exemplary signals coming from a scan-in terminal Sin for the third example of the analog scan circuit 100 in the embodiment of the invention.

FIG. 12 shows exemplary signals coming from the scan-in terminal Sin for the third example of the analog scan circuit 100 in the embodiment of the invention. Therein, a VOUT1-use signal, a VOUT2-use signal, and a VOUT3-use signal are signals that are to be output from the output terminals VOUT1 to VOUT3, respectively. The VOUT1-use signal becomes a signal sequence including A1, A2, A3, and others in the order of sampling. The VOUT2-use signal becomes a signal sequence including B1, B2, B3, and others in the order of sampling. The VOUT3-use signal becomes a signal sequence including C1, C2, C3, and others in the order of sampling.

The scan-in signal Sin is a combination of the VOUT1-use signal, the VOUT2-use signal, and the VOUT3-use signal as such, and is a signal sequence including, after sorting, A1, B1, C1, A2, B2, C2, A3, B3, C3, and others. The scan-in signal Sin generated as such becomes a PAM signal that shows a change at each point as shown in the drawing.

Figure 13:
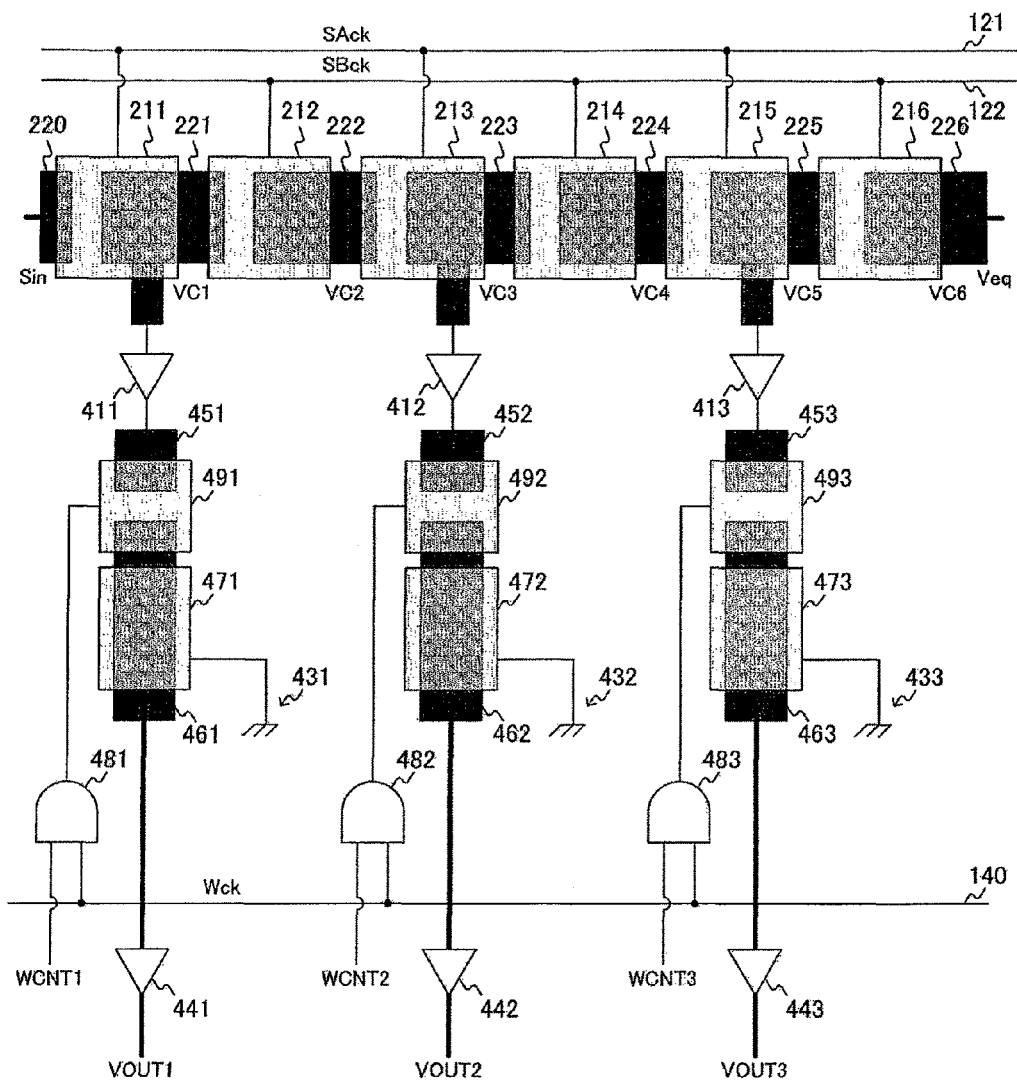
[FIG. 13] A layout diagram of a fourth example of the analog scan circuit 100 in the embodiment of the invention.

FIG. 13 is a layout diagram of a fourth example of the analog scan circuit 100 in the embodiment of the invention. In the third example, the transistors connected with the output terminals VOUT1 to VOUT3 are all connected at their gates with the write-use clock signal line 140 of shared use. However, in this fourth example, in the transistors connected with the output terminals VOUT1 to VOUT3, their gate electrodes 491 to 493 are individually connected with each corresponding control signal line. These individual signal lines are connected with outputs of AND gates 481 to 483, respectively.

The AND gates 481 to 483 are logical gates that respectively generate ANDs (AND) of the write-use control signals WCNT1 to WCNT3 with the write-use clock signal Wck. Accordingly, with the control signals WCNT1 to WCNT3 individually changed in state to H, at the timing when the write-use clock signal Wck is changed in state to H, analog signals are output to the corresponding output terminals VOUT1 to VOUT3.

Figure 14:
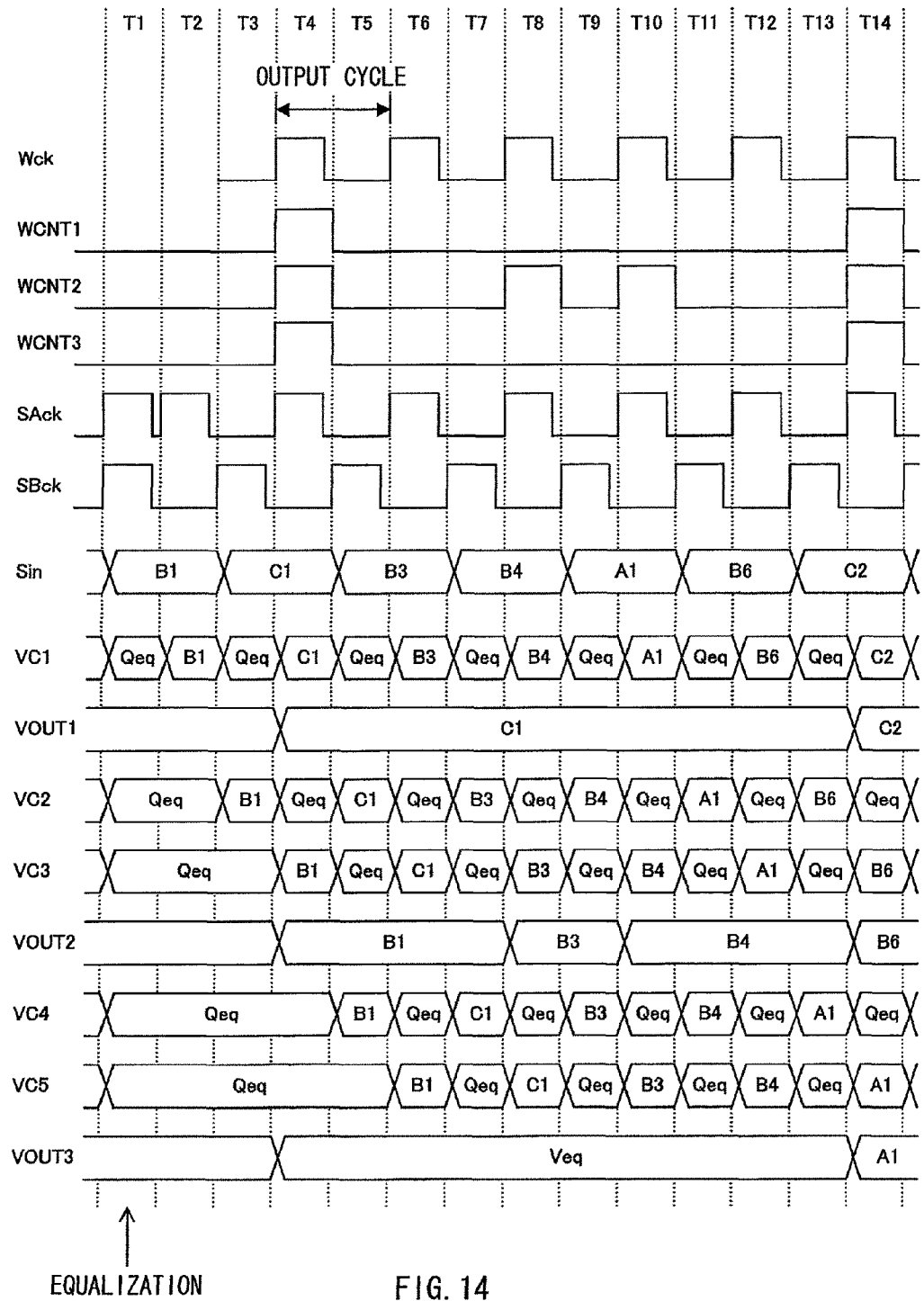
[FIG. 14] A timing diagram of the fourth example of the analog scan circuit 100 in the embodiment of the invention.

FIG. 14 is a timing diagram of the fourth example of the analog scan circuit 100 in the embodiment of the invention. Assumed in this fourth example is that, with the control signals WCNT1 to WCNT3 individually changed in state to H, analog signals are output to the output terminals VOUT1 to VOUT3.

In this example, the scan-in signal Sin shows analog values, i.e., B1 at a time T1, C1 at a time T3, B3 at a time T5, B4 at the time T7, A1 at a time T9, B6 at a time T11, and C2 at a time T13. Such a scan-in signal Sin is supplied to the capacitor between the gate electrode 211 and the diffusion layer region 221 at the timing when the clock signal SAck is changed in state to H so that electric charging is started. Thereafter, by the control over the clock signals SAck and SBck, the accumulated electric charge is transferred from left to right.

At a time T4, when the clock signal Wck is changed in state to H, the output terminals VOUT1 to VOUT3 are all changed in state to H. As a result, the output terminal VOUT1 is provided with the analog value C1, the output terminal VOUT2 is provided with the analog value B1, and the output terminal VOUT3 is provided with an analog value "0".

At a time T8, when the clock signal Wck is changed in state to H, only the output terminal VOUT2 is changed in state to H. As a result, the output terminal VOUT2 is provided with the analog value B3 but the remaining output terminals VOUT1 and VOUT3 show no change of output.

Similarly, at a time T10, when the clock signal Wck is changed in state to H, only the output terminal VOUT2 is changed in state to H. As a result, the output terminal VOUT2 is provided with the analog value B4 but the remaining output terminals VOUT1 and VOUT3 show no change of output.

Moreover, at a time T14, when the clock signal Wck is changed in state to H, the output terminals VOUT1 to VOUT3 are all changed in state to H. As a result, the output terminal VOUT1 is provided with the analog value C2, the output terminal VOUT2 is provided with the analog value B6, and the output terminal VOUT3 is provided with the analog value A1. In this case, the output cycle in this fourth example is 2T where 1T denotes a half cycle of the clock signal SAck or that of the clock signal SBck.

Figure 15:
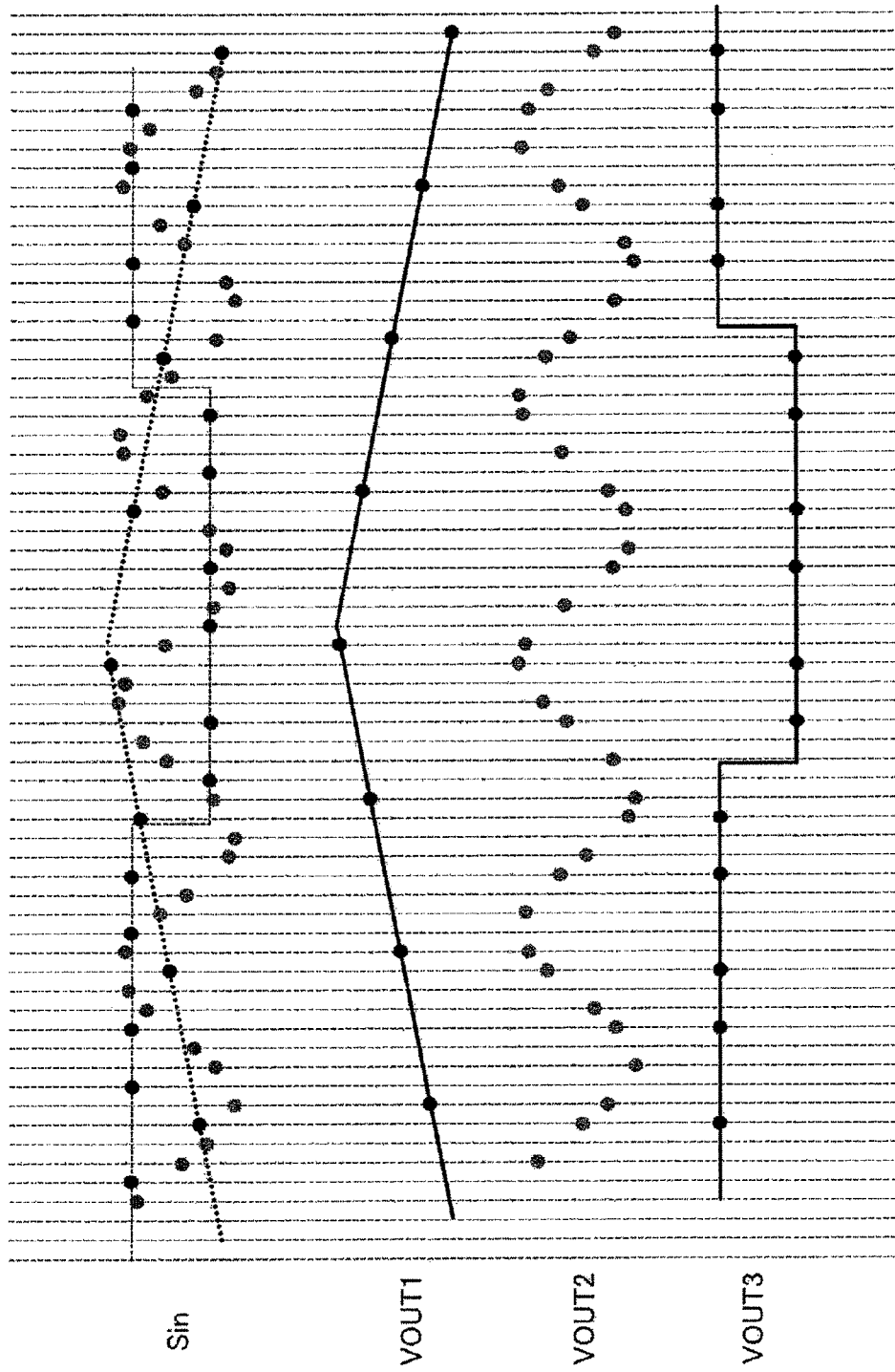
[FIG. 15] Exemplary signals coming from a scan-in terminal Sin for the fourth example of the analog scan circuit 100 in the embodiment of the invention.

FIG. 15 shows exemplary signals coming from the scan-in terminal Sin for the fourth example of the analog scan circuit 100 in the embodiment of the invention.

The scan-in signal Sin includes signals to be output to the output terminals VOUT1 to VOUT3. Herein, the signal to be output to the output terminal VOUT1 is a triangular wave that shows a slow change, the signal to be output to the output terminal VOUT2 is a sine wave that is high in frequency, and the signal to be output to the output terminal VOUT3 is a binary signal slightly high in frequency.

With the signals assumed as such, the effective use of the cells can be implemented by reducing the output cycle for the signals high in frequency, and by increasing the output cycle for the signal low in frequency. According to the fourth example described above, the output terminals can be individually controlled so that the signal characteristics can be used as a basis to determine the number of occurrences of output.

Figure 16:
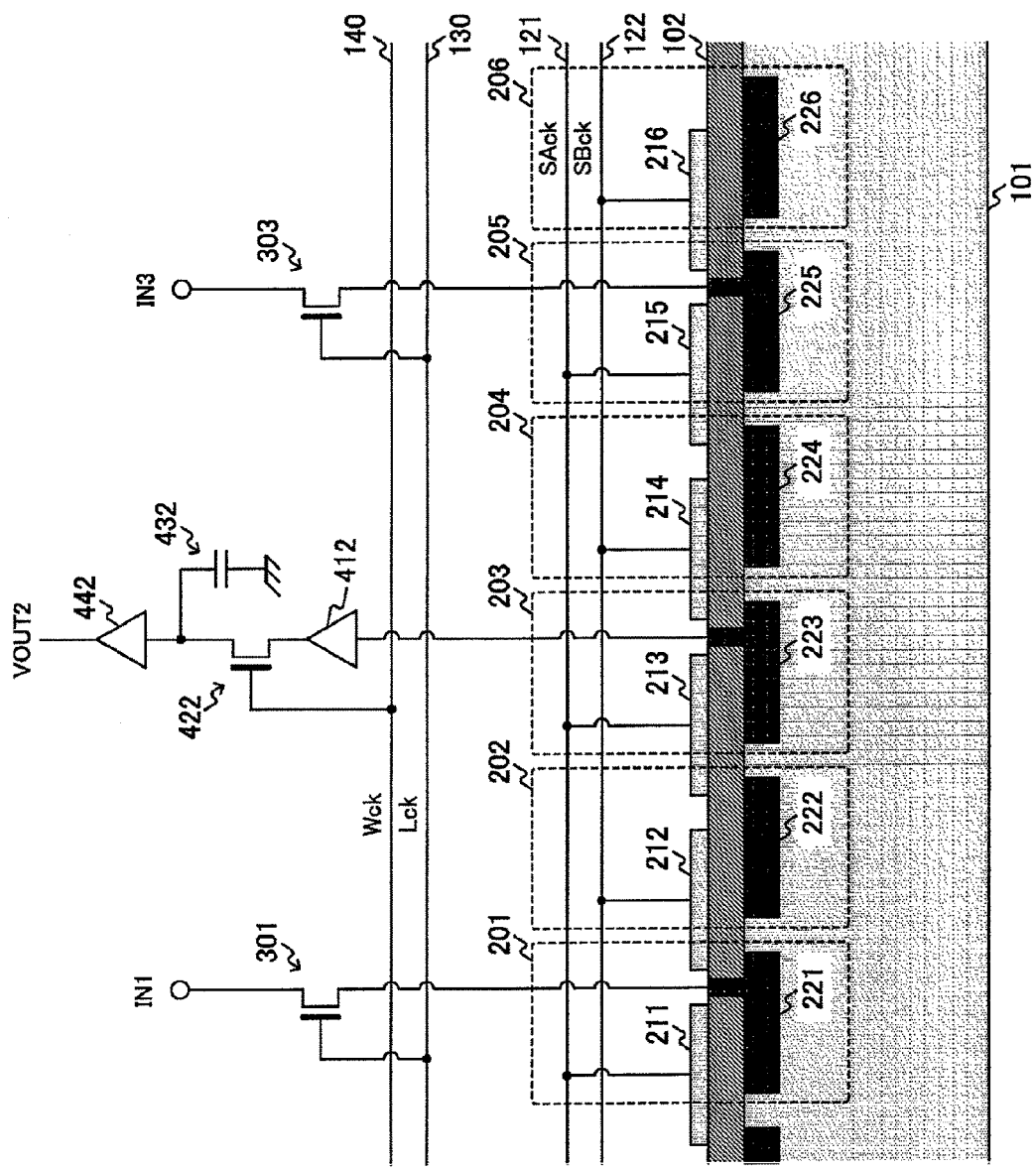
[FIG. 16] A conceptual diagram of a fifth example of the analog scan circuit 100 in the embodiment of the invention.
Figure 17:
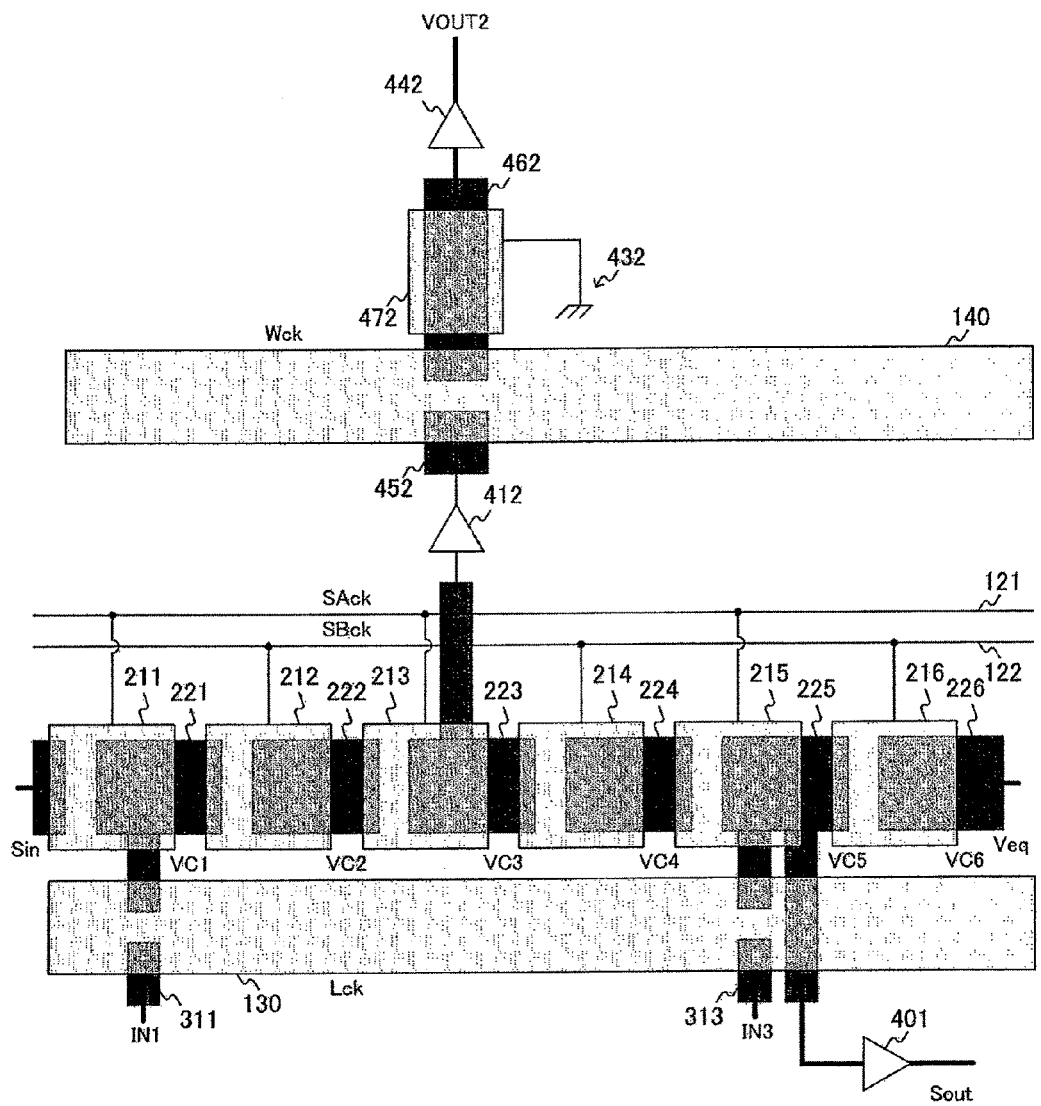
[FIG. 17] A layout diagram of the fifth example of the analog scan circuit 100 in the embodiment of the invention.

FIG. 16 is a conceptual diagram of a fifth example of the analog scan circuit 100 in the embodiment of the invention. Moreover, FIG. 17 is a layout diagram of the fifth example of the analog scan circuit 100 in the embodiment of the invention. In this fifth example, the diffusion layer region 221 is connected with the transistor 301, the diffusion layer region 223 is connected with the charge voltage conversion amplifier 412, and the diffusion layer region 225 is connected with the transistor 303. Moreover, the diffusion layer region 225 is connected with a charge voltage conversion amplifier 401, and the output of this charge voltage conversion amplifier 401 is supplied to the scan-out terminal Sout.

The transistor 301 is connected at one end thereof with the input terminal IN1, and the transistor 303 is connected at one end thereof with the input terminal IN3. The transistors 301 and 303 are both connected at their gates with the load-use clock signal line 130. This clock signal line 130 is supplied with a load-use clock signal Lck. In response thereto, when the clock signal Lck is in the state of H, the transistors 301 and 303 are all put in the ON state, and analog signals from the input terminals IN1 and IN3 are respectively supplied to the diffusion layer regions 221 and 225. By the analog signals provided as such, the capacities between the gate electrodes 211 and 215 and the diffusion layer regions 221 and 225 are electrically charged. Thereafter, when the clock signal Lck is changed in state to L, the transistors 301 and 303 are put in the OFF state so that the electric charging is stopped.

The output of the charge voltage conversion amplifier 412 is applied by the diffusion layer region 452 to the transistor 422. The gate of the transistor 422 is provided with an output-use clock signal Wck over the clock signal line 140. When this clock signal Wck is in the state of H, the transistor 422 is put in the ON state, thereby electrically charging the capacitor 432 configured by the diffusion layer region 462 and the electrode 472. Moreover, when the clock signal Wck is in the state of L, the transistor 422 is put in the OFF state so that the voltage value as a result of the electric charging is held. As such, the transistor 422 and the capacitor 432 configure a sample-and-hold circuit. The output of this sample-and-hold circuit is connected with the amplifier 422, and the output thereof is supplied to the output terminal VOUT2.

In other words, this fifth example is the implementation of the first example of FIG. 3 and the third example of FIG. 10 at the same time. Accordingly, the operation thereof is also a combination of those.

Figure 18:
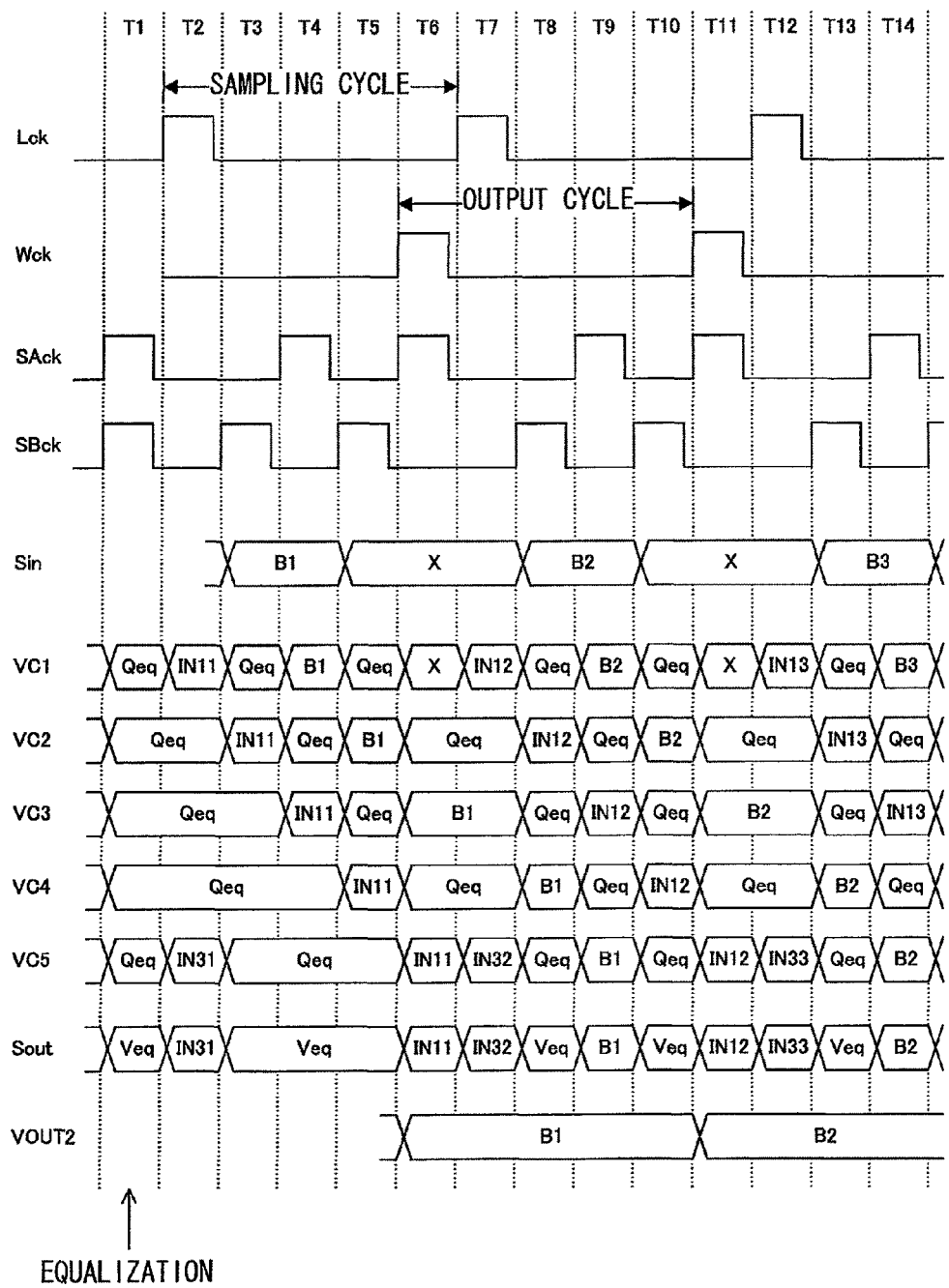
[FIG. 18] A timing diagram of the fifth example of the analog scan circuit 100 in the embodiment of the invention.

FIG. 18 is a timing diagram of the fifth example of the analog scan circuit 100 in the embodiment of the invention. In this fifth example, at the timing when the clock signal Lck is changed in state to H, analog signal comes from each of the input terminals IN1 and IN3, and electric charging is started to the capacities between the gate electrodes 211 and 215 and the diffusion layer regions 221 and 225. Moreover, at the timing when the clock signal SAck is changed in state to H, an analog signal comes from the scan-in terminal Sin, and electric charging is started to the capacitor between the gate electrode 211 and the diffusion layer region 221. Thereafter, by the control over the clock signals SAck and SBck, the accumulated electric charge is transferred from left to right.

Moreover, at the timing when the clock signal Wck is changed in state to H, the output terminal VOUT2 is provided with the electric potential corresponding to the electric charge accumulated in the capacitor between the gate electrode 213 and the diffusion layer region 223.

In this fifth example, the sampling cycle and the output cycle are both 5T where 1T denotes a half cycle of the clock signal SAck or that of the clock signal SBck.

Note that since the BBD in the embodiment of the invention is operated to transfer analog signals by transfer of electric charge, there may be a possibility of attenuating the amount of electric charge due to a leakage of electric charge during the transfer. Since this signal is an existing signal provided from the outside via the scan-in terminal Sin, by reading the voltage thereof, any amount change of the electric charge can be corrected. For example, the signal B1 of the scan-out terminal Sout at the time T9 is already known as is the signal B2 thereof at the time T14. Therefore, these signals may be used as a basis for such a correction of amount change so that a voltage adjustment can be implemented. Moreover, when the analog scan circuit 100 is under fault conditions, for a test use of the analog scan circuit 100, the output of this scan-out terminal Sout can be used.

Figure 19:
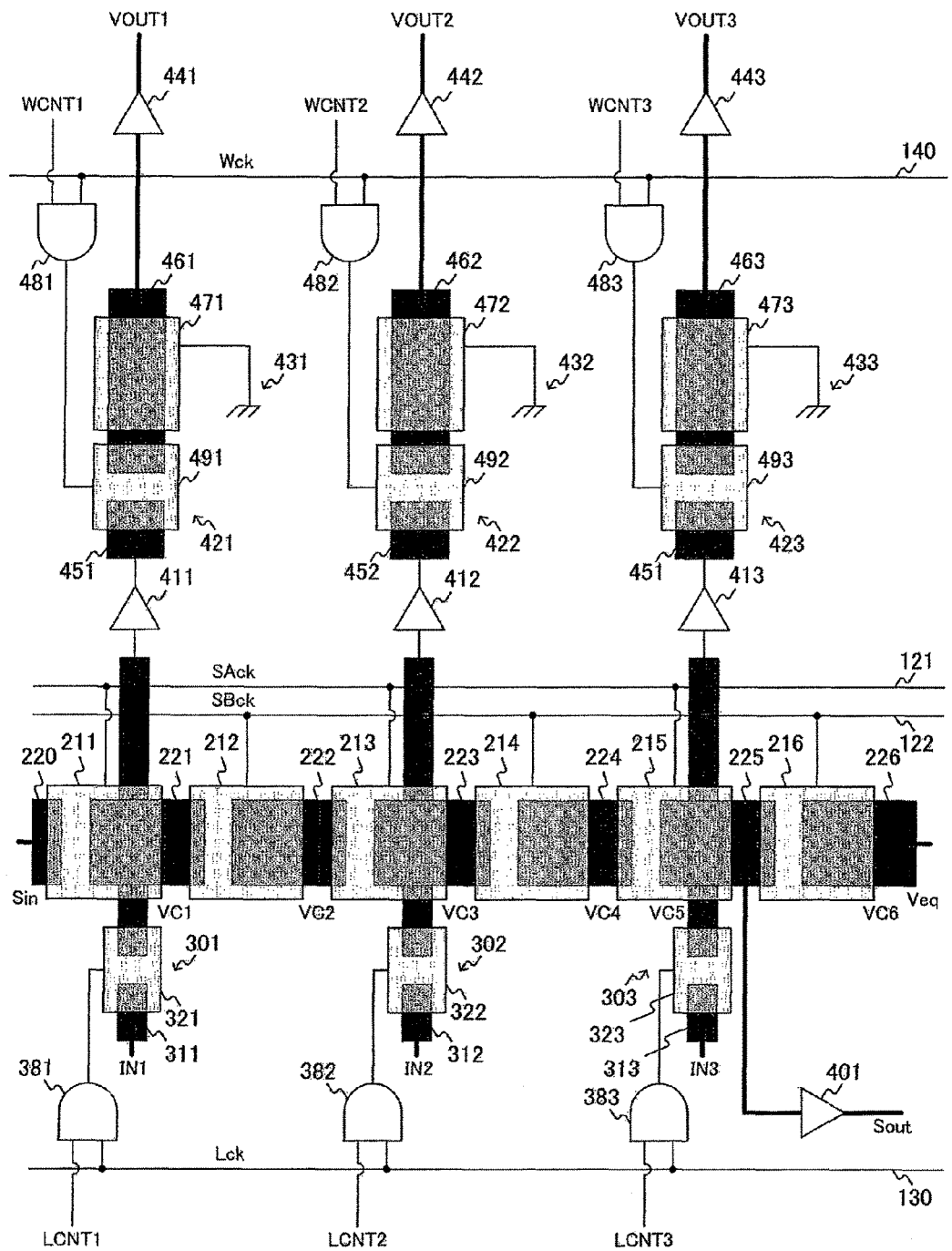
[FIG. 19] A layout diagram of a sixth example of the analog scan circuit 100 in the embodiment of the invention.

FIG. 19 is a layout diagram of a sixth example of the analog scan circuit 100 in the embodiment of the invention. In this sixth example, the diffusion layer regions 221, 223, and 225 are each connected with any one of the transistors 301 to 303, and any one of the charge voltage conversion amplifiers 411 to 413.

In other words, this sixth example is the implementation of the second example of FIG. 6 and the fourth example of FIG. 13 at the same time. As such, the operation thereof is also a combination of those. Note here that, in the second example of FIG. 6, the clock signal Lck is ORed with the control signals LCNT1 to LCNT3. However, in this sixth example, the AND gates 381 to 383 are in charge of ANDing therebetween. Their basic operations are similar to each other, e.g., for selecting not IN2 and IN3 but only IN1, the clock signal Lck and the control signal LCNT1 may be both changed in state to H, and the control signals LCNT2 and LCNT3 may be both changed in state to L.

Note that, in this sixth example, the cells are each connected with both input and output as a general configuration thereof, but in each of the cells, either the input or output is allowed for operation at a time.

Figure 20:
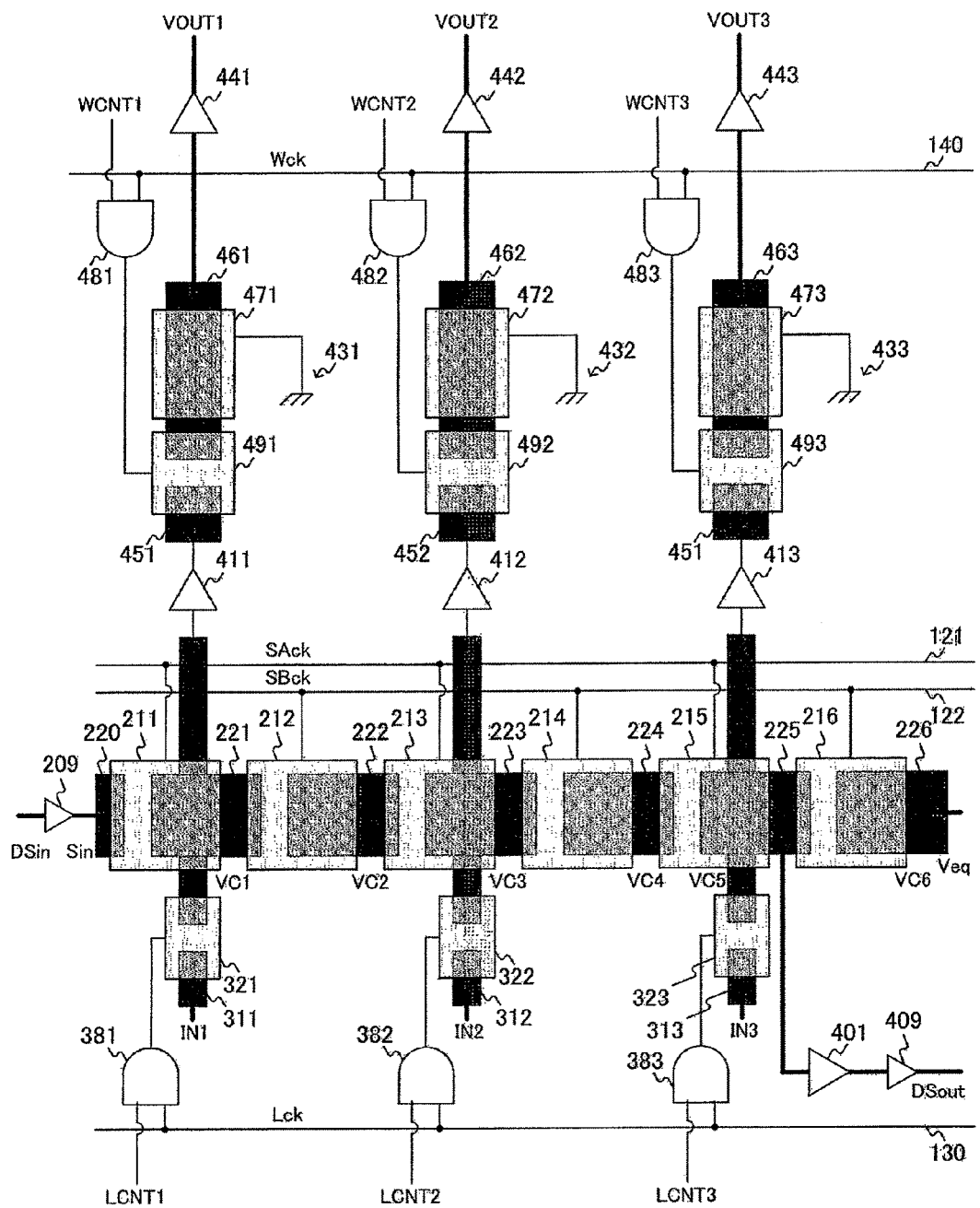
[FIG. 20] A layout diagram of a seventh example of the analog scan circuit 100 in the embodiment of the invention.

FIG. 20 is a layout diagram of a seventh example of the analog scan circuit 100 in the embodiment of the invention. In this seventh example, unlike in the sixth example, the scan-in terminal is connected with a D/A (Digital to Analog) converter 209, and the scan-out terminal is connected with an A/D (Analog to Digital) converter 409. Such a configuration allows an input of a digital signal from an LSI tester via the D/A converter 209, and allows an output of the digital signal to the LSI tester via the A/D converter 409.

For a measurement of an analog LSI, generally, the LSI tester applies a voltage of analog value, and reads the voltage of analog value. However, such an LSI tester is not generally good for such a measurement because it generates analog signals at a high speed. On the other hand, as long as handling digital signals, the LSI tester can be used for such a measurement by generating those at a high speed. Especially for reading, sorting, and filtering or signal processing of internal signals read from an LSI, such processing is easily executed with those captured as digital data. This thus is the reason for additionally providing, in this seventh example, the D/A converter 209 and the A/D converter 409.

The D/A converter 209 and the A/D converter 409 as such are those to be in use as appropriate and as needed, and may be provided inside of the LSI, or may be provided outside of the LSI. When these are provided inside of the LSI, the technique is referred to as BIST (Built-In Self-Test), and has advantages in terms of conversion speed and noise resistance, but has disadvantages of causing increase of chip area. On the other hand, when these are provided outside of the LSI, the technique is referred to as BOST (Built-Out Self-Test), and has advantages and disadvantages opposite to those of the BIST. The invention is applicable to both of such techniques. By providing the D/A converter 209 and the A/D converter 409 as such, analog signals can be handled similarly to digital data. Moreover, this allows the resulting LSI to be more compatible especially with a digital-analog LSI.

Note that, in the examples described above, exemplified is the case where the transfer function of analog values is implemented by a BBD. The invention is surely not restrictive thereto, and such a function may be implemented by a CCD (Charge Coupled Device), for example.

Figure 21:
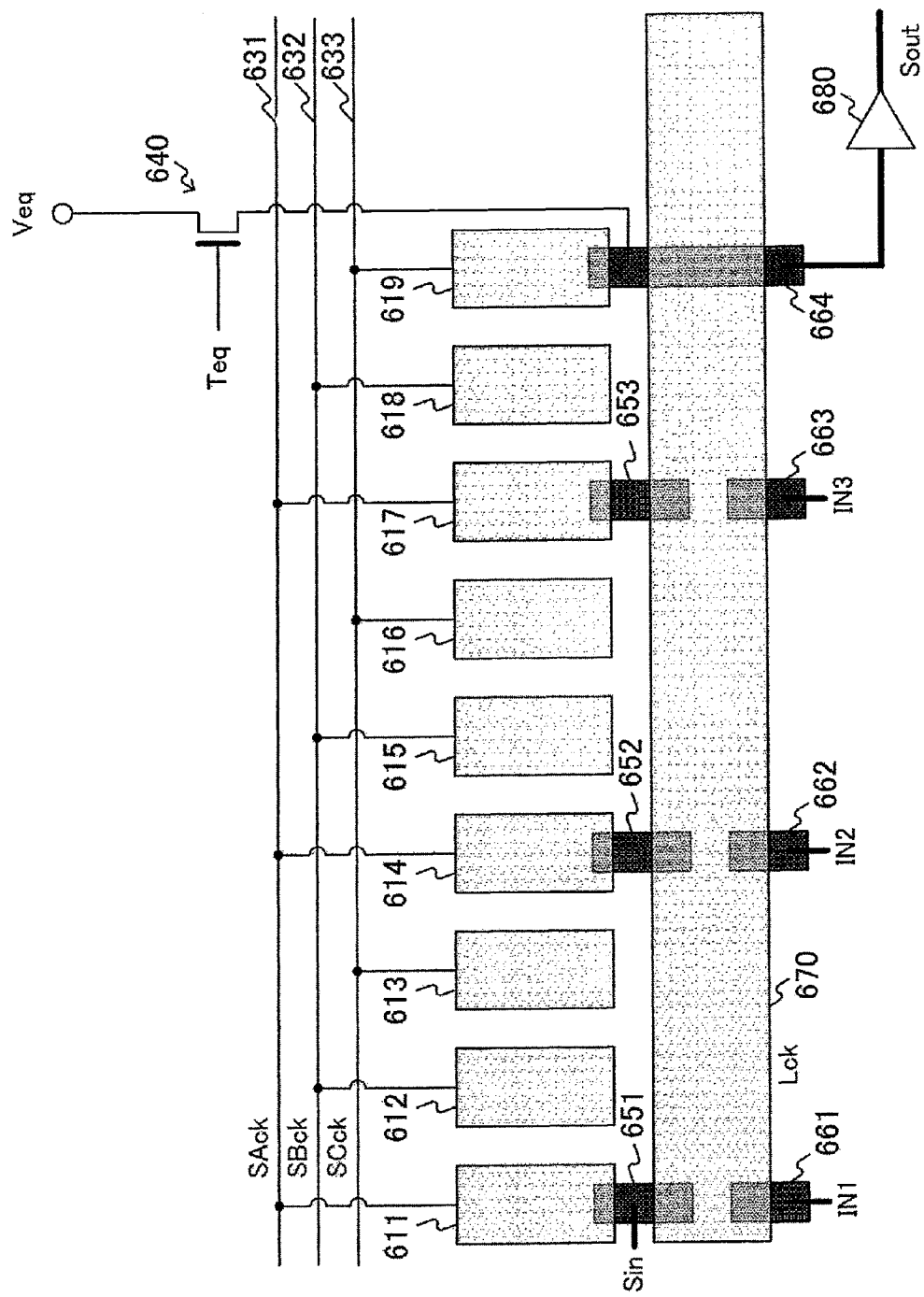
[FIG. 21] A layout diagram of an eighth example of the analog scan circuit 100 in the embodiment of the invention.

FIG. 21 is a layout diagram of an eighth example of the analog scan circuit 100 in the embodiment of the invention. This eighth example is an example in which the transfer function of analog values is implemented by a CCD. The CCD is configured by a two-layer polysilicon electrode disposed on an oxidization film on a silicon substrate. With such a CCD, a depletion layer is connected to another depletion layer adjacent thereto through application of voltage to the electrode, thereby transferring the electric charge of the adjacent capacitor by punching through.

In such an eighth example, exemplified is a CCD with three-phase clocks in which electrodes 611 to 619 are each connected with any one of three clock signal lines 631 to 633. Moreover, similarly to the first example of FIG. 3, the electrodes 611, 614, and 617 are each connected with a transistor whose gate is connected with a load-use clock signal line 670. In the transistors, the remaining ends are respectively connected with the input terminals IN1 to IN3. Note here that such transistors are respectively configured by pairs of diffusion layer regions 651 to 653 and 661 to 663 corresponding to their sources and drains, and the clock signal line 670 corresponding to their gates.

Moreover, the electrode 619 is connected with a charge voltage conversion amplifier 680 and a transistor 640 via a diffusion layer region 664. By the charge voltage conversion amplifier 680, a scan-out signal Sout is output to the scan-out terminal via the diffusion layer region 664. Moreover, the remaining end of the transistor 640 is connected with a terminal Veq for equalization use, and the gate thereof is connected with an equalization drive terminal Teq. By changing the equalization drive terminal Teq in state to H, the equalization is performed via the diffusion layer region 664.

When the clock signal line 670 is changed in state to H, an analog signal comes from each of the input terminals IN1 to IN3 for a supply to charge accumulation regions (depletion layers) located below the electrodes 611, 614, and 617, thereby accumulating an electric charge. In response thereto, the clock signal lines 631 to 633 change in order the three-phase clock signals SAck, SBck, and SCck in state to H so that the electric charge is transferred from left to right. The electric charge transferred as such is converted into voltage after being sequentially input to the charge voltage conversion amplifier 680, and then is output to the scan-out terminal as a scan-out signal Sout.

As such, the CCD has a different mechanism from that of BBD for transfer of the electric charge, but the basic operation thereof is similar to that of the BBD. Note that, in the eighth example, exemplified is a CCD with three-phase clocks, but a CCD with any other multi-phase clocks such as two-phase and four-phase clocks is also possible. The configuration of such a CCD with two-phase or four-phase clocks can be referred to "Basics and Applications of CCD/CMOS Image Sensors" written by Kazuya YONEMOTO (CQ Publishing Co., Ltd), for example.

Described next is a specific exemplary application of the embodiment of the invention.

Figure 22:
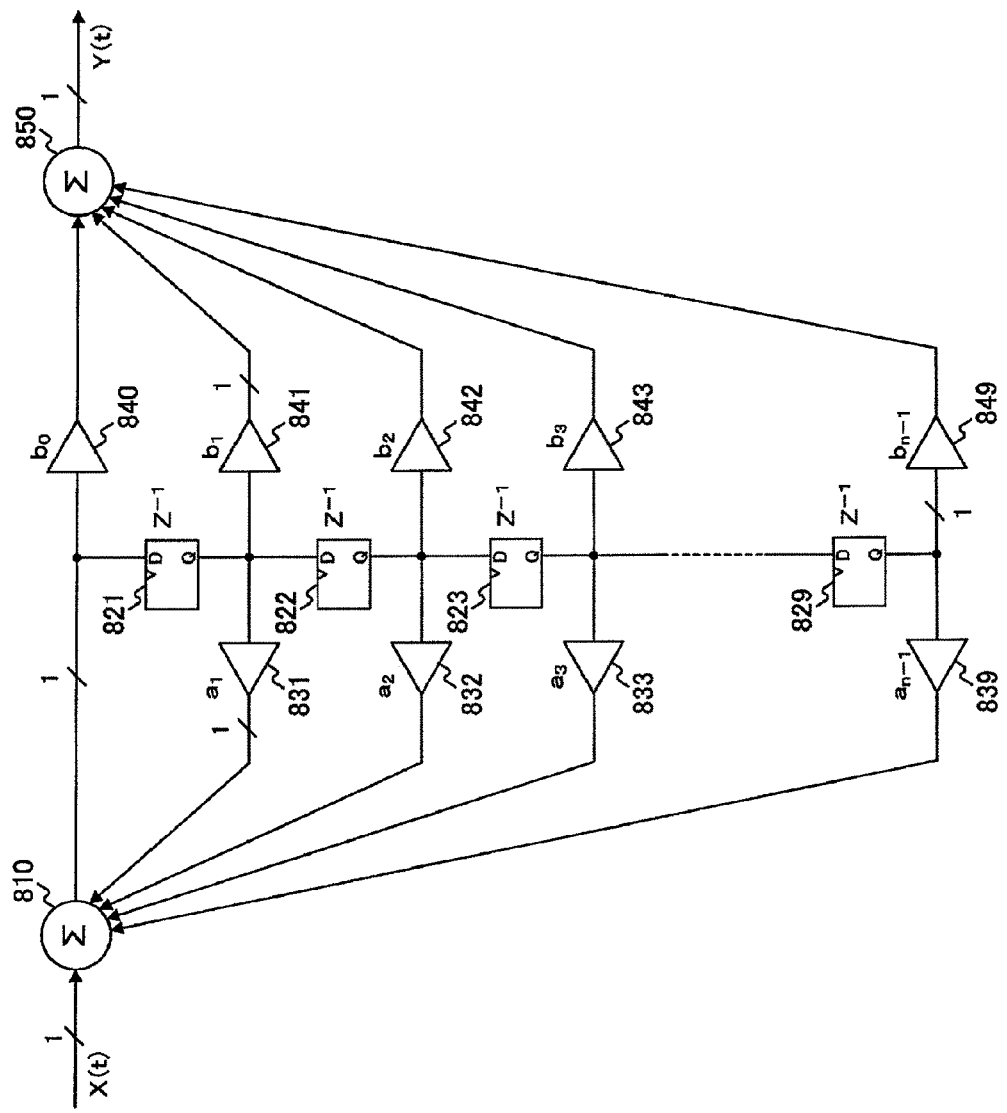
[FIG. 22] A diagram of an IIR filter using the analog scan circuit in the embodiment of the invention, showing an exemplary configuration thereof.

FIG. 22 is a diagram of an IIR filter using the analog scan circuit in the embodiment of the invention, showing an exemplary configuration thereof. An IIR (Infinite Impulse Response) filter is a filter with infinite number of impulse response sequences of a system (infinite impulse response filter). This IIR filter is often implemented as a digital filter, and if this is the case, the components are each configured by a digital circuit. On the other hand, in the embodiment of the invention, the components are each implemented by an analog circuit as below.

The IIR filter in the embodiment of the invention is configured to include analog adders 810 and 850, analog multipliers 831 to 849, and analog synchronization circuits 821 to 829. The analog adder 810 is an adder that performs addition of an incoming analog signal X(t) with outputs of the analog multipliers 831 to 839. The analog adder 850 is an adder that performs addition of outputs of the analog multipliers 840 to 849. The analog multipliers 831 to 839 are each a multiplier that multiplies outputs of the analog synchronization circuits 821 to 829 by constants a1 to an-1, respectively. The analog multipliers 840 to 849 are each a multiplier that multiplies an output of the analog adder 810 and the outputs of the analog synchronization circuits 821 to 829 by constants b0 to bn-1, respectively. The analog synchronization circuits 821 to 829 are each a delay unit that delays the output of the analog adder 810 by a sampling time. Such analog synchronization circuits 821 to 829 can be each implemented by the analog scan circuit in the embodiment of the invention.

In other words, in the IIR filter in the embodiment of the invention, the analog synchronization circuits 821 to 829 are each implemented by the analog scan circuit so that the resulting filter becomes able to handle analog signals in its entirety. As such, compared with a previous digital filter, the number of components can be reduced, thereby being able to reduce the power consumption and the cost. Furthermore, since the designing method of a digital filter becomes available for use, compared with a previous analog filter, there is no more need for adjustments of the filter frequency characteristics, thereby being able to determine the frequency characteristics with no dependence on the LCR components.

Note that, in this example, described is an exemplary configuration of the IIR filter using the analog scan circuit in the embodiment of the invention. Alternatively, the analog scan circuit of the invention can be applied similarly to an FIR filter. The FIR filter (Finite Impulse Response) filter is a filter (finite impulse response filter) with which impulse response sequences in a system converge to 0 in a finite length of time.

Figure 23:
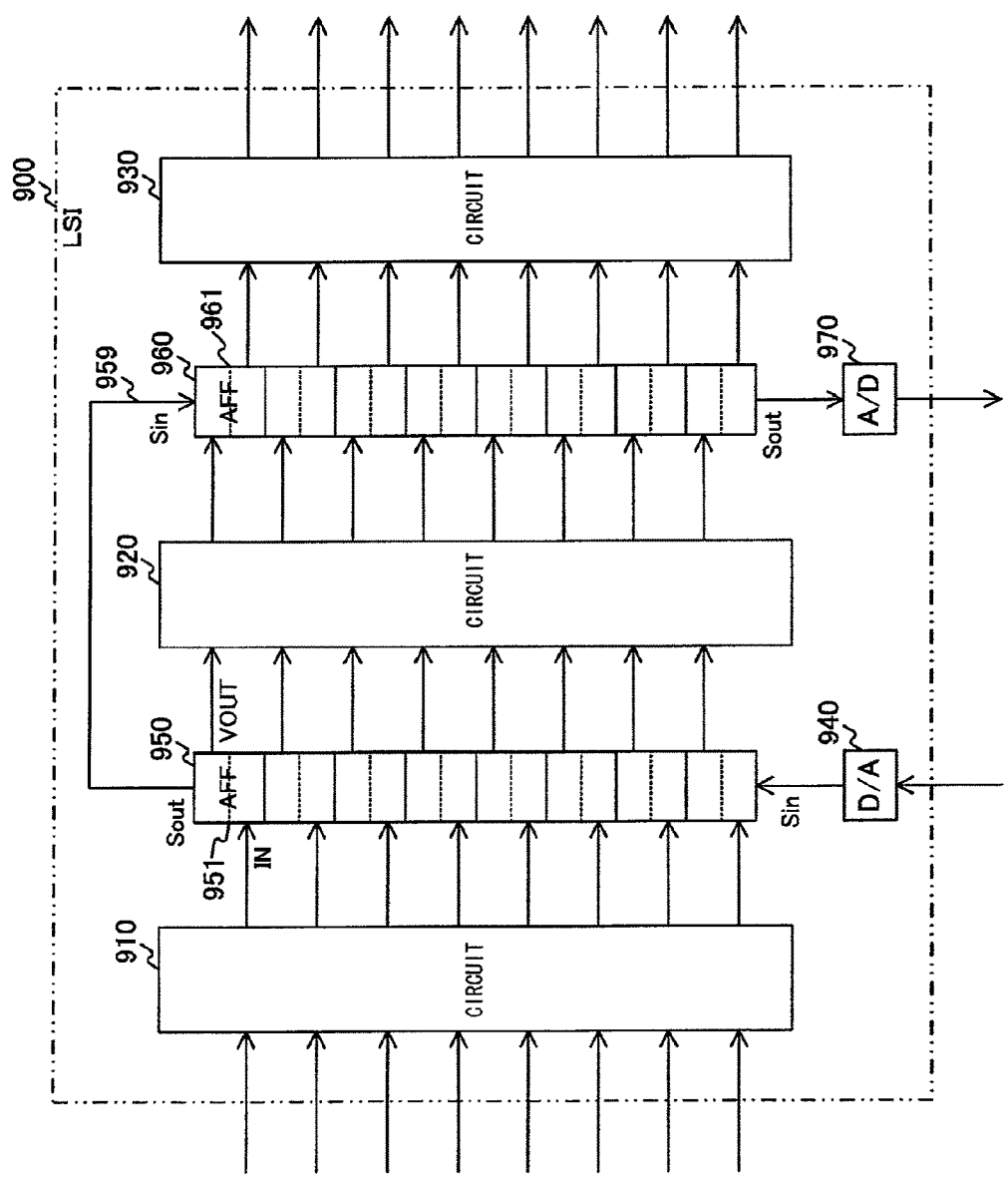
[FIG. 23] A diagram in an exemplary case where the analog scan circuit in the embodiment of the invention is used for synchronization control over analog circuits.

FIG. 23 is a diagram in an exemplary case where the analog scan circuit in the embodiment of the invention is used for synchronization control over analog circuits. In this example, an analog scan circuit 950 is inserted between a circuit 910 and a circuit 920 in an LSI 900, and an analog scan circuit 960 is inserted between the circuit 920 and a circuit 930. The analog scan circuits 950 and 960 are each allowed to include a plurality of analog flip-flops (AFFs) 951 and 961 each have one bit. With such a configuration, an output of the circuit 910 is synchronized for once in the analog scan circuit 950, and is then input to the circuit 920. Similarly, an output of the circuit 920 is synchronized for once in the analog scan circuit 960, and then is input to the circuit 930.

The analog scan circuit 950 and the analog scan circuit 960 are connected together by a scan chain 959, and these form a piece of a scan path. Moreover, a scan-in terminal of the analog scan circuit 950 is connected with a D/A converter 940, and a scan-out terminal of the analog scan circuit 960 is connected with an A/D converter 970. As such, an interface of digital signals is formed with an LSI tester. In other words, at any arbitrarily synchronized timing, an analog signal coming from the circuit 910 or 920 can be read out, and an analog signal that is supposed to be input to the circuit 920 or 930 can be set. Values to be stored in the analog scan circuits 950 and 960 are each an analog value, thereby being able to implement a scan path for the analog signals.

Note that such a scan path is available for use not only for verification of the LSI itself but even after it is incorporated as a device. After being incorporated as a device, the scan path becomes available for use for routine maintenance, for a log dump for an analysis in the event of failure, or for a step and dump for verification or others in such cases (any desired value is embedded in any desired position for capturing output data or others therefrom after an arbitrary clock, or for a log dump), or for execution of a test program, for example.

Figure 24:
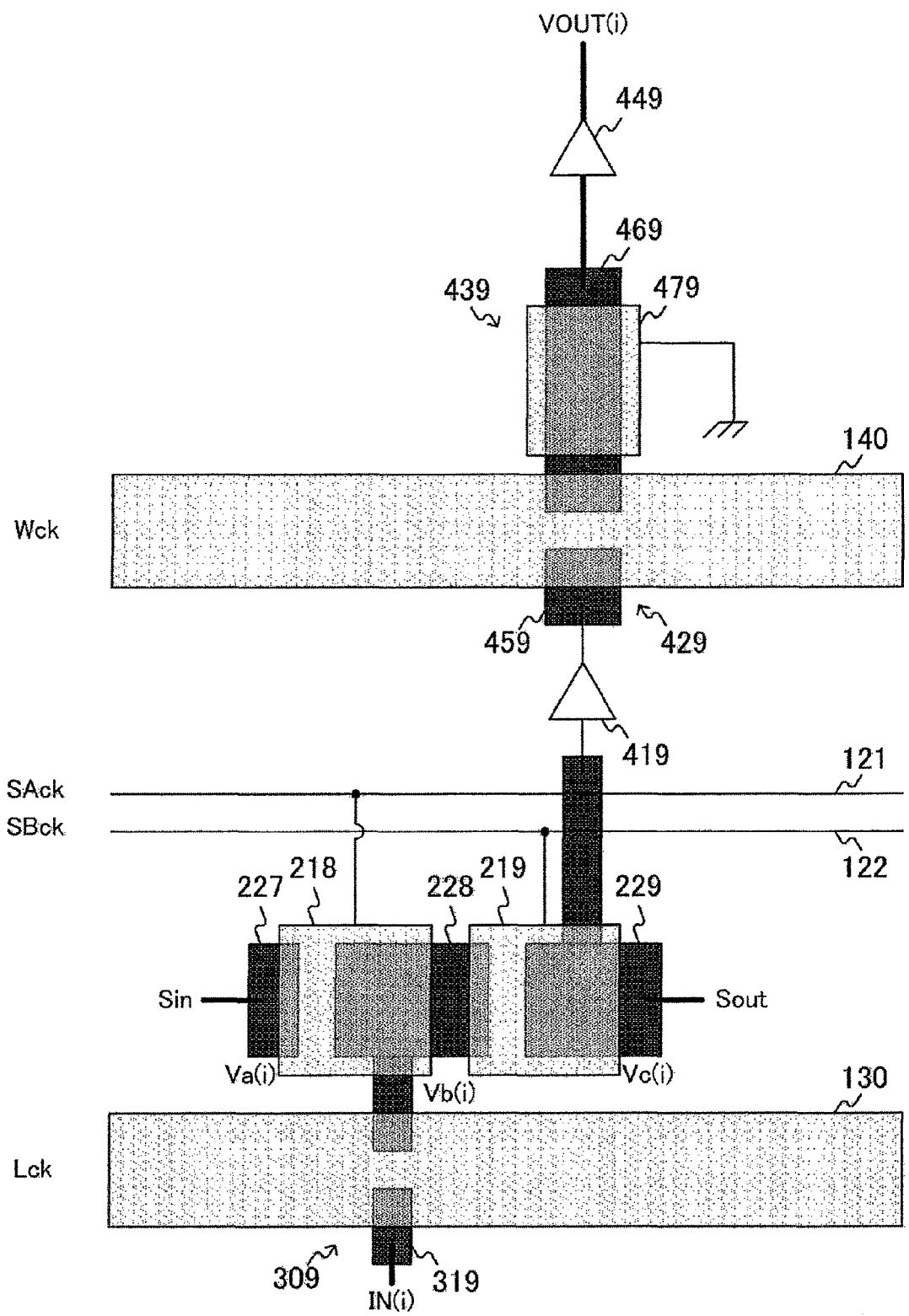
[FIG. 24] A layout diagram in the exemplary case where the analog scan circuit in the embodiment of the invention is used for the synchronization control over the analog circuits.

FIG. 24 is a layout diagram in the exemplary case where the analog scan circuit in the embodiment of the invention is used for the synchronization control over the analog circuits. In this example, as an analog flip-flop (AFF) (a unit corresponding to a piece of analog signal), the drawing shows gate electrodes 218 and 219, and diffusion layer regions 228 and 229. The gate electrode 218 is provided with a SAck by the clock signal line 121, and the gate electrode 219 is provided with a SBck by the clock signal line 122. Moreover, the diffusion layer region 227 located below the gate electrode 218 is provided with a signal from a shift-in terminal Sin. Thereafter, from the diffusion layer region 229, a shift-out signal is output via a shift-out terminal Sout. In this configuration, the operation to be performed is conceptually similar to that of a 1-bit flip-flop of a master-slave type with a scan function in a digital circuit. In this case, the electric potential Vb(i) of the diffusion layer region 228 is considered to correspond to the output of a latch on the master side, and the electric potential Vc(i) of the diffusion layer region 229 is considered to correspond to the output of a latch on the slave side. Note here that such an analog flip-flop is surely a part of the scan path.

The diffusion layer region 228 is connected with a transistor 309 whose gate is connected with the signal line 130. The remaining end of this transistor 309 is connected with an input terminal IN(i). The diffusion layer region 229 is connected with a charge voltage conversion amplifier 419. This charge voltage conversion amplifier 419 is connected with a transistor 429 whose gate is connected with the signal line 140. The remaining end of this transistor 429 is connected with a capacitor 439 and an amplifier 449. The transistor 429 and the capacitor 439 configure a sample-and-hold circuit.

Note that the gate electrode 218 and the diffusion layer region 228 are each an example of the input analog value retention means claimed in Claims. Moreover, the gate electrode 219 and the diffusion layer region 229 are each an example of the output analog value retention means claimed in Claims. Further, the transistor 309 is an example of the input means, or the first or second input means claimed in Claims, Still further, the gate electrode 218 and the diffusion layer region 227 are each an example of the input means, or the first or second input means claimed in Claims. Still further, the transistor 429 is an example of the output means claimed in Claims.

Figure 25:
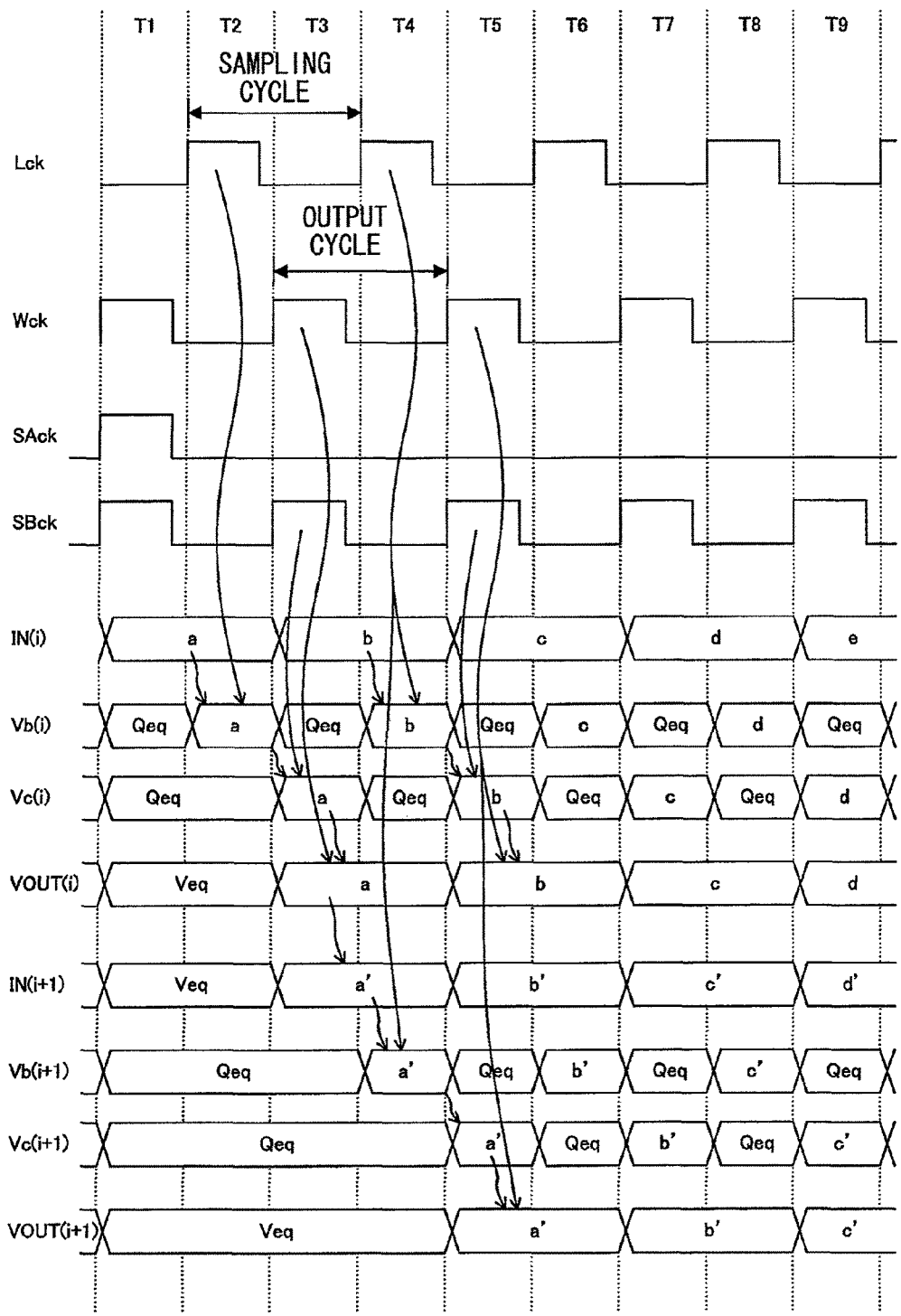
[FIG. 25] A timing diagram in the exemplary case where the analog scan circuit in the embodiment of the invention is used for the synchronization control over the analog circuits.

FIG. 25 is a timing diagram in the exemplary case where the analog scan circuit in the embodiment of the invention is used for the synchronization control over the analog circuits. An analog flip-flop in the i-th stage is provided with a subscript of "(i)", and an analog flip-flop in the (i+1-th) stage is provided with a subscript of "(i+1)".

At a time T1, with the clock signal SAck and SBck both changed in state to H, in the diffusion layer regions 228 and 229 (Vb(i), Vc(i), Vb(i+1), Vc(i+1)), the mobile electric charge takes an initial value (Qeq).

At a time T2, with the clock signal Lck changed in state to H, an analog signal "a" to be input to the input terminal IN(i) is supplied to the capacitor between the gate electrode 218 and the diffusion layer region 228 so that an electric charge (Vb(i)) is accumulated.

At a time T3, with the clock signal SBck changed in state to H, the electric charge "a" accumulated in the capacitor between the gate electrode 218 and the diffusion layer region 228 is transferred to the capacitor between the gate electrode 219 and the diffusion layer region 229 (Vc(i)). Also at this time, with the write-use clock signal Wck changed in state to H, the electric potential corresponding to the electric charge "a" transferred to the capacitor between the gate electrode 219 and the diffusion layer region 229 is output to an output terminal VOUT(i).

Based on the electric potential of a signal output from the output terminal VOUT(i) of the analog flip-flop in the i-th stage (e.g., the analog scan circuit 950 of FIG. 23), the circuit in the subsequent stage (e.g., the circuit 920 of FIG. 23) is operated. Signals generated in this subsequent circuit are each provided with a dash symbol in FIG. 25. For example, the signal "a" output from the output terminal VOUT(i) at the time T3 is subjected to processing by the circuit in the subsequent stage, and the result is input as a signal "a" to an input terminal IN(i+1) of the analog flip-flop in the (i+1-th) stage.

At a time T4, with the clock signal Lck changed in state to H, a signal "b" input to the IN(i) in the i-th stage is supplied to the Vb(i) so that an electric charge is accumulated. Similarly, the signal "a" input to the IN(i+1) in the (i+i-th) stage is supplied to the Vb(i+1) so that an electric charge is accumulated.

Moreover, at a time T5, with the clock signal SBck changed in state to H, the electric charge "b" accumulated in the Vb(i) is transferred to the Vc(i), and the electric charge "a" accumulated in the Vb(i+1) is transferred to the Vc(i+1). Also at this time, with the write-use clock signal Wck changed in state to H, the electric potential corresponding to the electric charge "b" transferred to the Vc(i) is output to the output terminal VOUT(i), and the electric potential corresponding to the electric charge "a" transferred to the VC(i+1) is output to the output terminal VOUT(i+1).

Thereafter, such an operation is repeated in a similar manner. In this case, the sampling cycle and the output cycle are both 2T where 1T denotes a half cycle of the clock signal SBck. In other words, by providing the clock signals Lck and Wck with a time lag of half a cycle therebetween, this allows the analog scan circuit to establish synchronization for once after receiving an analog signal from the analog circuit in the preceding stage, and then to supply the analog signal to the analog circuit in the subsequent stage.

Figure 26:
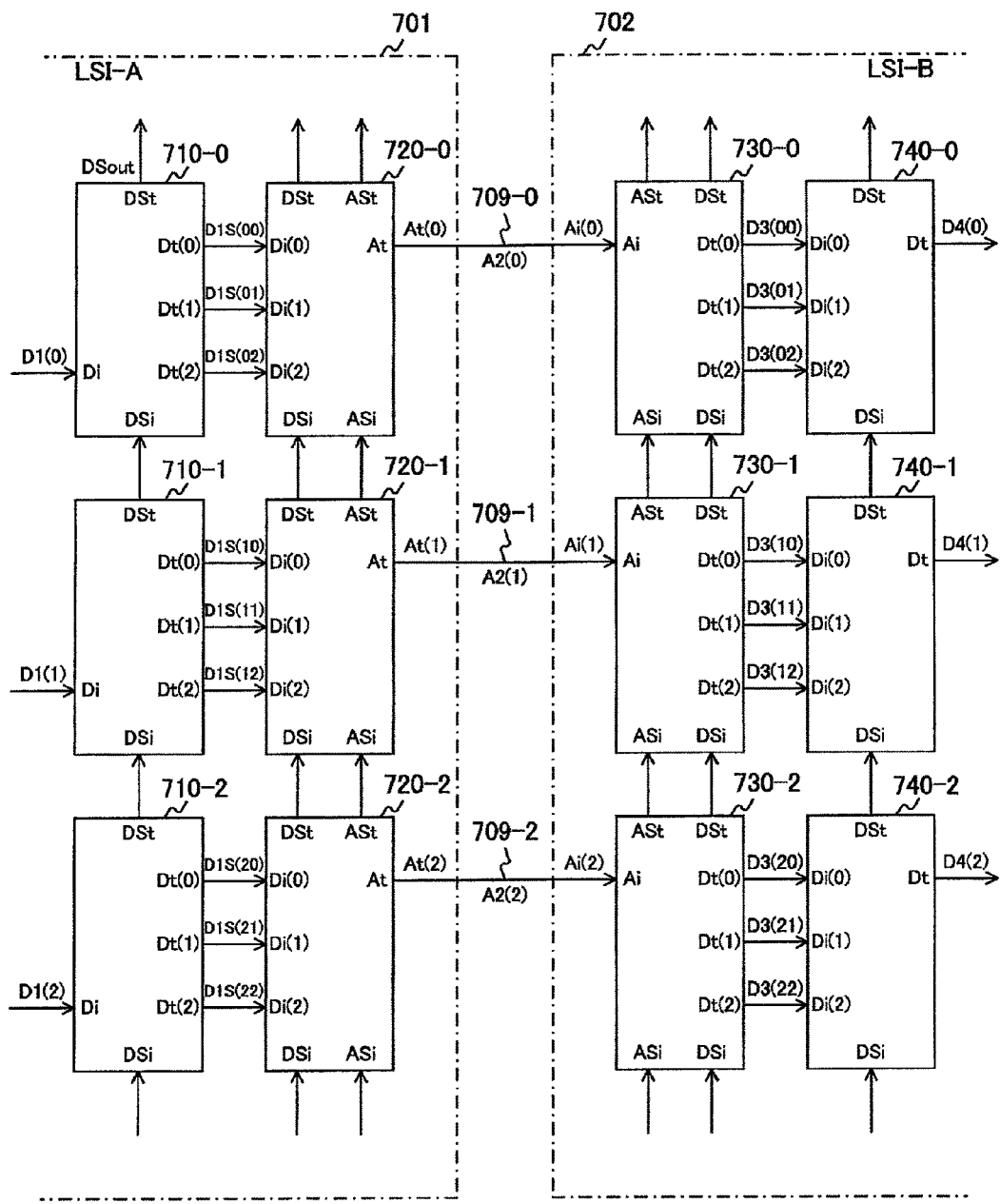
[FIG. 26] A diagram showing an exemplary LSI-to-LSI transfer using the analog scan circuit in the embodiment of the invention.

FIG. 26 is a diagram showing an exemplary LSI-to-LSI transfer using the analog scan circuit in the embodiment of the invention. In this example, described is an exemplary configuration when an analog signal is transferred from an LSI-A701 to an LSI-B702.

The LSI-A701 is configured to include shift circuits 710-0 to -3 each performing a shift operation after receiving a digital signal, and analog conversion circuits 720-0 to -3 each converting the digital signal into an analog signal. This LSI-A701 is provided with three shift circuits and three analog circuits, with an assumption that a connection with the LSI-B702 is established by three analog signal lines 709-0 to -2, but this is surely not restrictive. The shift circuits 710-0 to -3 are each referred to as a shift circuit 710. Moreover, the analog conversion circuits 720-0 to -3 are each referred to as an analog conversion circuit 720.

The LSI-B702 is configured to include digital conversion circuits 730-0 to -3 each converting an analog signal into a digital signal, and selection circuits 740-0 to -3 sequentially selecting one of a plurality of digital signals. Also this LSI-B 702 is provided with three shift circuits and three analog circuit, with an assumption that a connection with the LSI-A 701 is established by the three analog signal lines 709-0 to -2, but this is surely not restrictive. The digital conversion circuits 730-0 to -3 are each referred to as a digital conversion circuit 730. Moreover, the selection circuits 740-0 to 3 are each referred to as a selection circuit 740.

Figure 27:
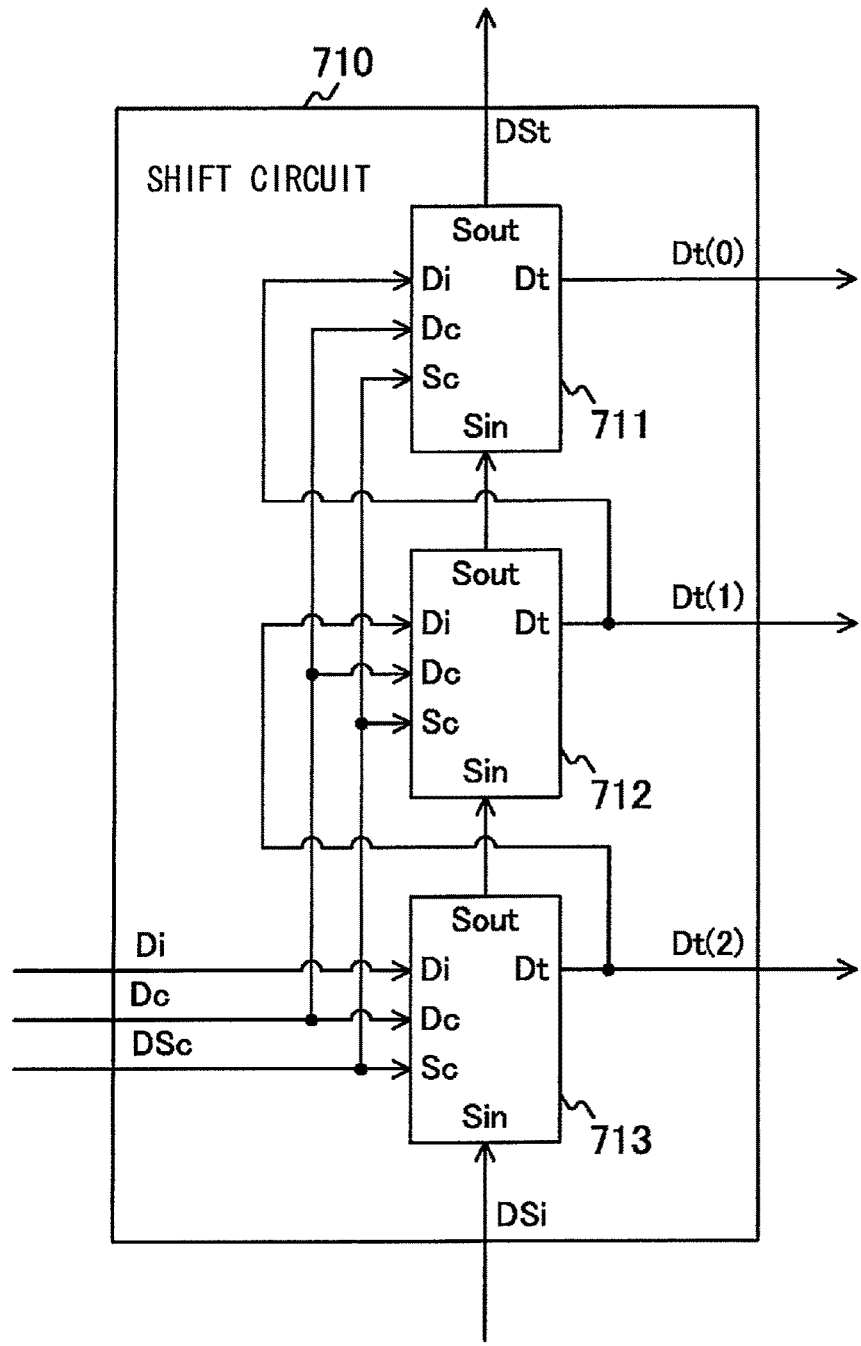
[FIG. 27] A diagram showing a shift circuit 710 in the embodiment of the invention, showing an exemplary configuration thereof.

FIG. 27 is a diagram showing the shift circuit 710 in the embodiment of the invention, showing an exemplary configuration thereof. This shift circuit 710 is configured to include flip-flop circuits 711 to 713, which are connected together in series. These flip-flop circuits 711 to 713 are each a circuit that retains and outputs any input digital signals.

A data input terminal Di of the flip-flop circuit 713 in the first stage is connected to a data input terminal Di of the shift circuit 710. Also a data output terminal Dt of the flip-flop circuit 713 in the first stage is connected to a data input terminal Di of the flip-flop circuit 712 in the second stage. A data output terminal Dt of the flip-flop circuit 712 in the second stage is connected to a data input terminal Di of the flip-flop circuit 711 in the third stage. Data output terminals Dt of the flip-flop circuits 711 to 713 are respectively connected to data output terminals Dt(0) to (2) of the shift circuit 710.

A scan input terminal Sin of the flip-flop circuit 713 in the first stage is connected to a scan input terminal DSi of the shift circuit 710. Also, a scan output terminal Sout of the flip-flop circuit 713 in the first stage is connected to a scan input terminal Sin of the flip-flop circuit 712 in the second stage. A scan output terminal Sout of the flip-flop circuit 712 in the second stage is connected to a scan input terminal Sin of the flip-flop circuit 711 in the third stage. A scan output terminal Sout of the flip-flop circuit 711 in the third stage is connected to a scan output terminal DSt of the shift circuit 710.

Data clock terminals Dc of the flip-flop circuits 711 to 713 are all connected to a data clock terminal Dc of the shift circuit 710. Moreover, scan clock terminals DSc of the flip-flop circuits 711 to 713 are all connected to a scan clock terminal DSc of the shift circuit 710.

Note here that the shift circuit 710 is an example of the output digital value output means, the specific output digital value shift means, or the output interface circuit claimed in Claims. Moreover, the flip-flop circuits 711 to 713 are each an example of the output digital value output means or the specific output digital value retention means claimed in Claims.

Figure 28:
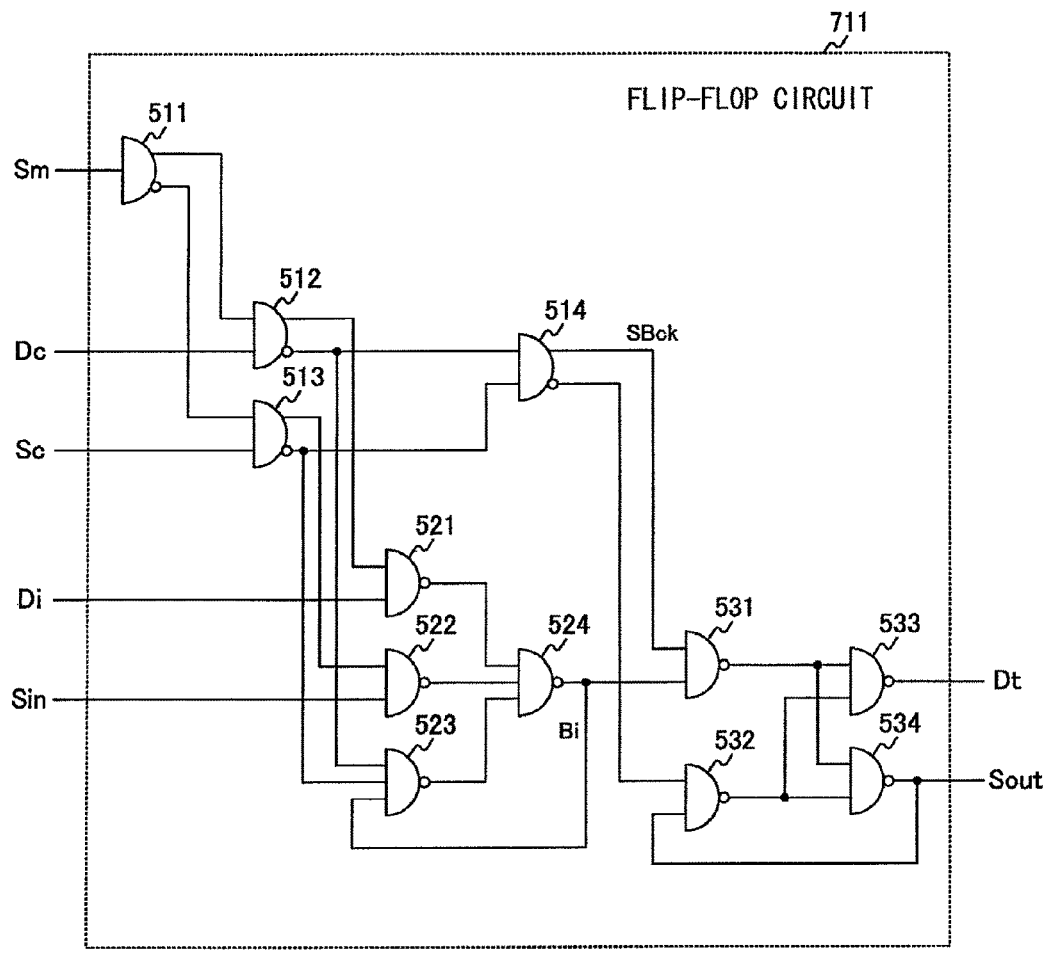
[FIG. 28] A diagram of a flip-flop circuit 711 in the embodiment of the invention, showing an exemplary configuration thereof.

FIG. 28 is a diagram of the flip-flop circuit 711 in the embodiment of the invention, showing an exemplary configuration thereof. Described here is an exemplary configuration of the flip-flop circuit 711, but the remaining flip-flop circuits 712 and 713 are also each in the configuration similar thereto. The flip-flop circuit 711 is configured to include AND gates 511 to 514, 521 to 524, and 531 to 534.

The AND gates 511 to 514 are each for generating a clock signal based on an input coming from the data clock terminal Dc and an input coming from the scan clock terminal DSc. When a scan mode terminal Sm is in the state of H, a data clock is provided to the AND gate 521, and when the scan mode terminal Sm is in the state of L, a scan clock is provided to the AND gate 522. Moreover, the AND gate 514 supplies an inverted signal SBck of the data clock or that of the scan clock to the AND gate 531. In other words, the AND gate 514 is an example of the control means in the first data processor of the invention, and is an example of the transfer trigger signal supply means in the second data processor of the invention.

The AND gates 521 to 524 are those each corresponding to a latch on the master side in a flip-flop. When a data clock or a scan clock is in the state of H, data from the data input terminal Di or scan data from the scan input terminal Sin is captured, and when the data clock or the scan clock is in the state of L, an output Bi of the AND gate 524 is retained.

The AND gates 531 to 534 are those each corresponding to a latch on the slave side in a flip-flop. The AND gate 531 captures an output Bi of the AND gate 524 while the clock SBck from the AND gate 514 remains in the state of H. The AND gate 532 captures an output Sout of the AND gate 534 while an inverted signal of the clock SBck from the AND gate 514 remains in the state of H. An output of the AND gate 533 is connected to a data output terminal Dt. An output of the AND gate 534 is connected to a scan output terminal Sout. Note that, in this example, the data output terminal Dt shows a value same as that of the scan output terminal Sout.

Figure 29:
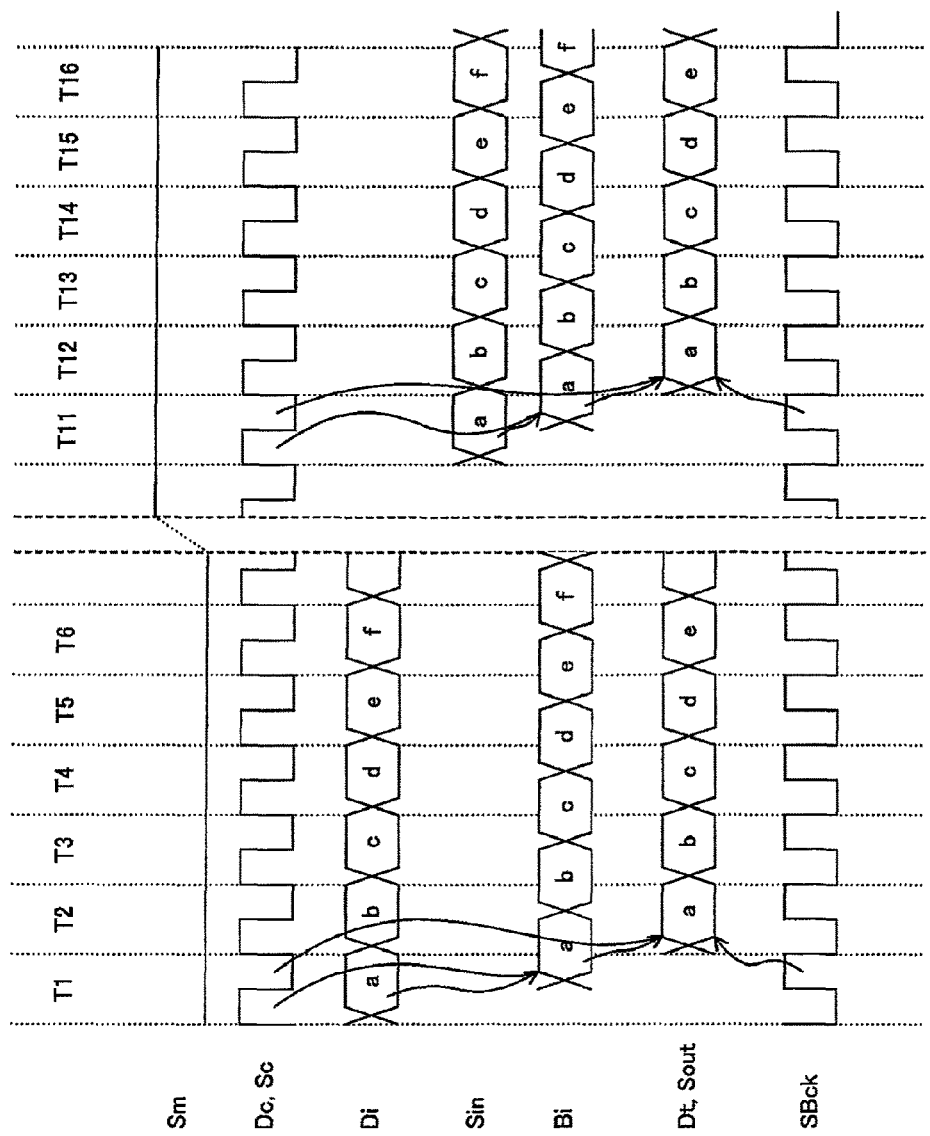
[FIG. 29] A diagram showing exemplary operation timings of the flip-flop circuit 711 in the embodiment of the invention.

FIG. 29 is a diagram showing exemplary operation timings of the flip-flop circuit 711 in the embodiment of the invention.

First of all, from times T1 to T6, the scan mode terminal Sm is assumed as taking a value in the state of L, that is, it is assumed as being in a normal data shift mode. In this case, an input signal from the data input terminal Di is input in accordance with a clock of the data clock terminal Dc. For example, a signal "a" input at the time T1 is captured into a latch on the master side in a first half of the time T1, and then in a second half of the time T1, is captured into the latch on the slave side.

On the other hand, from times T11 to T16, the scan mode terminal Sm is assumed as taking a value in the state of H, i.e., it is assumed as being in a scan mode. In this case, a scan input signal coming from the scan input terminal Sin is input in accordance with a clock of the scan clock terminal DSc. For example, a signal "a" input at the time T11 is captured into the latch on the master side in a first half of the time T11, and then in a second half of the time T11, is captured into the latch on the slave side.

In this example, the relationship between the input terminals (Di, and Sin) and the output terminals (Dt, and Sout) in each input state (Sm, Dc, or DSc) is described with representation by logical gates for easy understanding in terms of logical circuits. However, circuits in actual use can be implemented by any logically-equivalent circuits (circuits that perform operation as shown in FIG. 29) that perform a so-called flip-flop operation, e.g., circuits of tri-state buffer type, TTL circuits, or circuits in any combination of MOS transistors and/or any other transistors. Note herein that, like in FIGS. 26 and 27, the subsequent drawings do not show the scan mode terminal Sm, the data clock terminal Dc, the scan clock terminal Sc, and others for the sake of brevity. Moreover, as to the allocation of the scan mode terminal Sm, the data clock terminal Dc, the scan clock terminal Sc, and others in the LSI, one block is not necessarily limited to one input, and as long as the allocation leads to the logically-equivalent operation, the similar application is possible.

Figure 30:
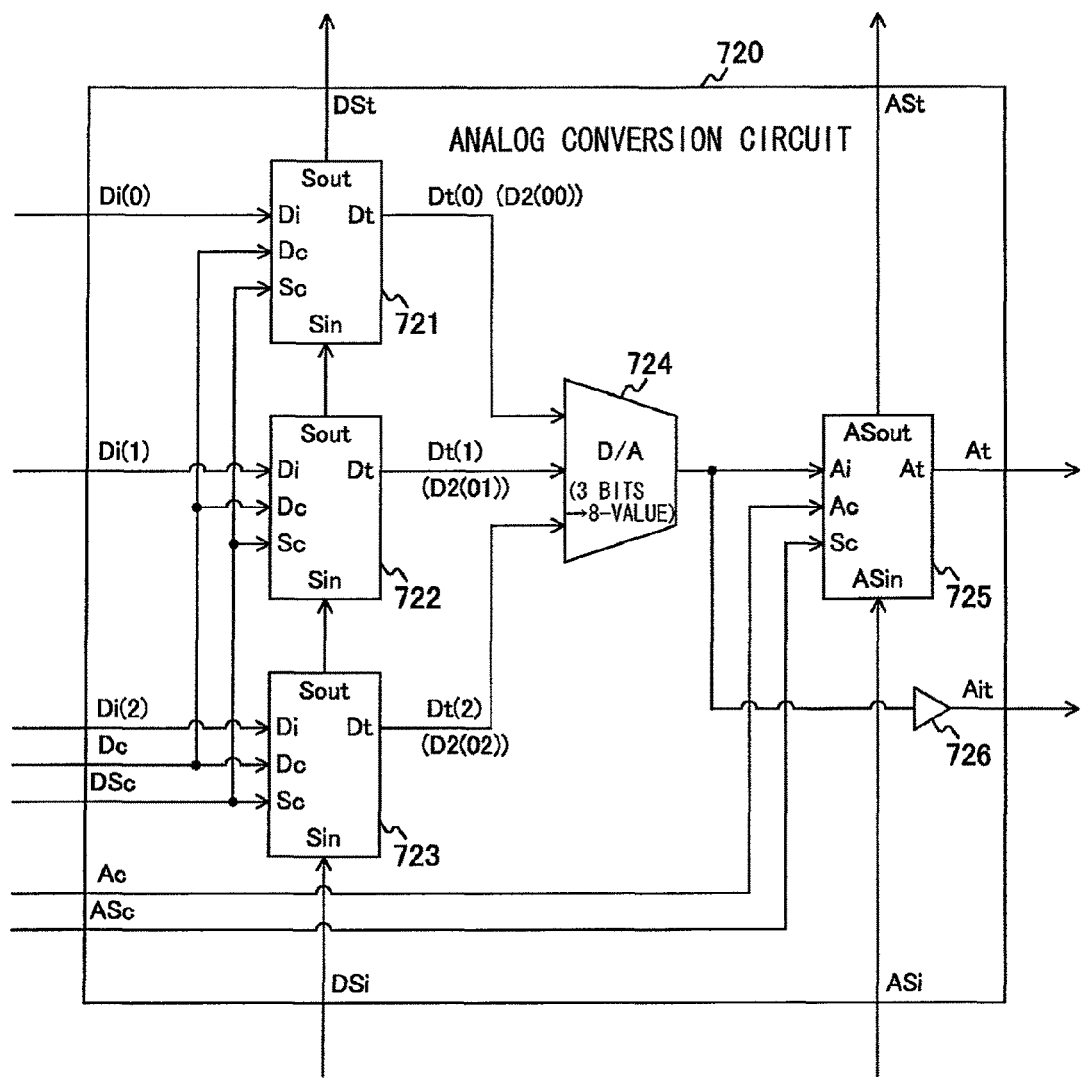
[FIG. 30] A diagram of an analog conversion circuit 720 in the embodiment of the invention, showing an exemplary configuration thereof.

FIG. 30 is a diagram of the analog conversion circuit 720 in the embodiment of the invention, showing an exemplary configuration thereof. This analog conversion circuit 720 is configured to include flip-flop circuits 721 to 723, a D/A (Digital to Analog) conversion circuit 724, and an analog flip-flop 725.

The flip-flop circuits 721 to 723 are each a circuit that retains and outputs any input digital signal, and is configured similarly to the flip-flop circuit 711 described by referring to FIG. 28. A data input terminal Di of the flip-flop circuit 721 is connected to a data input terminal Di(0) of the analog conversion circuit 720. A data input terminal Di of the flip-flop circuit 722 is connected to a data input terminal Di(1) of the analog conversion circuit 720. A data input terminal Di of the flip-flop circuit 723 is connected to a data input terminal Di(2) of the analog conversion circuit 720. Note here that data output terminals Dt(0) to (2) of the shift circuit 710 are connected to the data input terminals Di(0) to (2) of the analog conversion circuit 720 by signal lines D1S(00) to (02), respectively.

A scan input terminal Sin of the flip-flop circuit 723 in the first stage is connected to a scan input terminal DSi of the analog conversion circuit 720. A scan output terminal Sout of the flip-flop circuit 723 in the first stage is connected to a scan input terminal Sin of the flip-flop circuit 722 in the second stage. A scan output terminal Sout of the flip-flop circuit 722 in the second stage is connected to a scan input terminal Sin of the flip-flop circuit 721 in the third stage. A scan output terminal Sout of the flip-flop circuit 721 in the third stage is connected to a scan output terminal DSt of the analog conversion circuit 720.

Data clock terminals Dc of the flip-flop circuits 721 to 723 are all connected to a data clock terminal Dc of the analog conversion circuit 720. Moreover, scan clock terminals Sc of the flip-flop circuits 721 to 723 are all connected to a scan clock terminal DSc of the analog conversion circuit 720.

Note that a signal from the data output terminal Dt of each of the flip-flop circuits 721 to 723 is supplied to the D/A conversion circuit 724 over signal lines Dt(0) to (2). Data of these signal lines Dt(0) to (2) is referred to as D2(0) to (2) in the timing diagram that will be described later.

The D/A conversion circuit 724 is the one for converting three bits in total from the data output terminals Dt of the flip-flop circuits 721 to 723 into an 8-value analog signal for output as a piece of signal line. The output of such a D/A conversion circuit 724 is supplied to an analog flip-flop 725, and is supplied to an analog signal observation terminal Ait via an amplifier 726.

The analog flip-flop 725 is a flip-flop that retains the analog value provided by the D/A conversion circuit 724. The basic configuration thereof is similar to that described by referring to FIG. 24. A data input terminal Ai of the analog flip-flop 725 is connected to an output terminal of the D/A conversion circuit 724. A data output terminal At of the analog flip-flop 725 is connected to a data output terminal At of the analog conversion circuit 720. A scan input terminal ASin of the analog flip-flop 725 is connected to a scan input terminal ASi of the analog conversion circuit 720. A scan output terminal ASout of the analog flip-flop 725 is connected to a scan output terminal ASt of the analog conversion circuit 720.

A data clock terminal Ac of the analog flip-flop 725 is connected to an analog data clock terminal Ac of the analog conversion circuit 720. Further, a scan clock terminal Sc of the analog flip-flop 725 is connected to an analog scan clock terminal ASc of the analog conversion circuit 720. The analog flip-flop 725 retains a data signal coming from the data input terminal Ai in accordance with a clock of the data clock terminal Ac, and outputs the data signal to the data output terminal At. Further, the analog flip-flop 725 retains a scan data signal coming from the scan input terminal ASin in accordance with a clock of the scan clock terminal Sc, and outputs the scan data signal to the scan output terminal ASout.

With the analog flip-flop 725, from a clock provided by the analog data clock terminal Ac, and from that provided by the analog scan clock terminal ASc, a clock SBck is generated by the configuration similar to those of the AND gates 511 to 514 in the flip-flop circuit 711. As a write-use clock Wck, the signal same as the SBck can be used. Moreover, as a load-use clock Lck, an inverted signal of the SBck can be used.

The analog signal provided by the analog conversion circuit 720 as such is transferred from the LSI-A701 to the LSI-B702.

Note that the flip-flop circuits 721 to 723 are each an example of the output digital value output means or the common output digital value retention means claimed in Claims. Further, the D/A conversion circuit 724 is an example of the output analog value output means claimed in Claims. Still further, the analog flip-flop 725 is an example of the output analog flip-flop claimed in Claims. Still further, the analog conversion circuit 720 is an example of the output interface circuit claimed in Claims.

Figure 31:
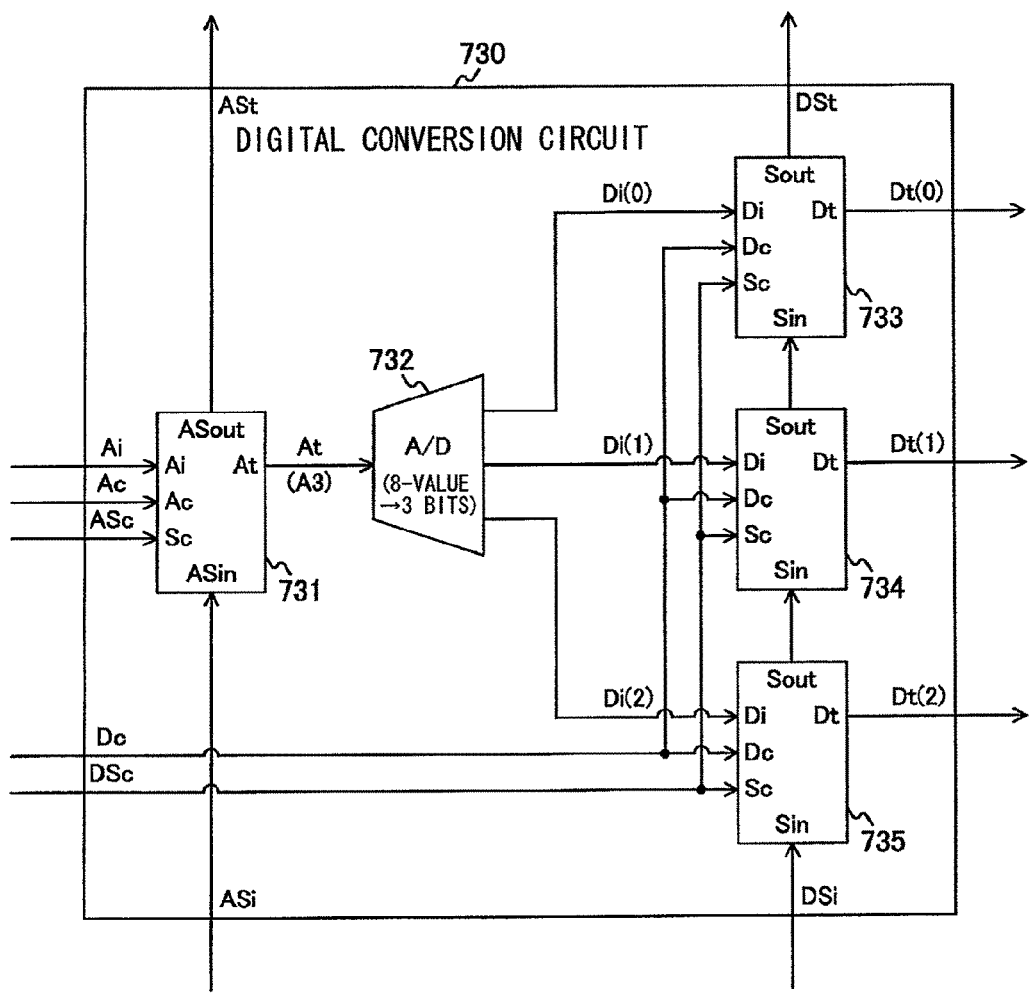
[FIG. 31] A diagram of a digital conversion circuit 730 in the embodiment of the invention, showing an exemplary configuration thereof.

FIG. 31 is a diagram of the digital conversion circuit 730 in the embodiment of the invention, showing an exemplary configuration thereof. This digital conversion circuit 730 is configured to include an analog flip-flop 731, an A/D (Analog to Digital) conversion circuit 732, and flip-flop circuits 733 to 735.

The analog flip-flop 731 is a flip-flop that retains an analog value provided by the LSI-A701. The basic configuration thereof is similar to that of the analog flip-flop 725. A data input terminal Ai of the analog flip-flop 731 is connected to a data input terminal Ai of the digital conversion circuit 730. A data output terminal At of the analog flip-flop 731 is connected to an input terminal of the A/D conversion circuit 732. A scan input terminal ASin of the analog flip-flop 731 is connected to a scan input terminal ASi of the digital conversion circuit 730. A scan output terminal ASout of the analog flip-flop 731 is connected to a scan output terminal ASt of the digital conversion circuit 730.

A data clock terminal Ac of the analog flip-flop 731 is connected to an analog data clock terminal Ac of the digital conversion circuit 730. Moreover, a scan clock terminal Sc of the analog flip-flop 731 is connected to an analog scan clock terminal ASc of the digital conversion circuit 730. The analog flip-flop 731 retains a data signal coming from the data input terminal Ai in accordance with a clock of the data clock terminal Ac, and outputs the data signal to the data output terminal At. Data to be output from the data output terminal of this analog flip-flop 731 is referred to as A3 in the timing diagram that will be described later. Moreover, the analog flip-flop 731 retains a scan data signal coming from the scan input terminal ASin in accordance with a clock of the scan clock terminal Sc, and outputs the scan data signal to the scan output terminal ASout.

The A/D conversion circuit 732 is the one for quantizing the analog signal coming from the analog flip-flop 731 for conversion into 3-bit digital signals. In this A/D conversion circuit 732, output terminals Di(0) to (2) are each provided to the flip-flop circuits 733 to 735.

The flip-flop circuits 733 to 735 are each a circuit for retaining and outputting any input digital signals, and are each configured similarly to the flip-flop circuit 711 described by referring to FIG. 28. A data input terminal Di of the flip-flop circuit 733 is connected to an output terminal Di(0) of the A/D conversion circuit 732. A data input terminal Di of the flip-flop circuit 734 is connected to an output terminal Di(1) of the A/D conversion circuit 732. A data input terminal Di of the flip-flop circuit 735 is connected to an output terminal Di(2) of the A/D conversion circuit 732. Data output terminals Dt of the flip-flop circuits 733 to 735 are respectively connected to data output terminals Dt(0) to (2) of the digital conversion circuit 730.

A scan input terminal Sin of the flip-flop circuit 735 in the first stage is connected to a scan input terminal DSi of the digital conversion circuit 730. A scan output terminal Sout of the flip-flop circuit 735 in the first stage is connected to a scan input terminal Sin of the flip-flop circuit 734 in the second stage. A scan output terminal Sout of the flip-flop circuit 734 in the second stage is connected to a scan input terminal Sin of the flip-flop circuit 733 in the third stage. A scan output terminal Sout of the flip-flop circuit 733 in the third stage is connected to a scan output terminal DSt of the digital conversion circuit 730.

Data clock terminals Dc of the flip-flop circuits 733 to 735 are all connected to a data clock terminal Dc of the digital conversion circuit 730. Moreover, scan clock terminals Sc of the flip-flop circuits 733 to 735 are all connected to a scan clock terminal DSc of the digital conversion circuit 730.

Note that the analog flip-flop 731 is an example of the input analog flip-flop claimed in Claims. Further, the A/D conversion circuit 732 is an example of the input digital value input means or the input digital value output means claimed in Claims. Still further, the flip-flop circuits 733 to 735 are each an example of the input digital value input means or the common input digital value retention means claimed in Claims. Still further, the digital conversion circuit 730 is an example of the input interface circuit claimed in Claims.

Figure 32:
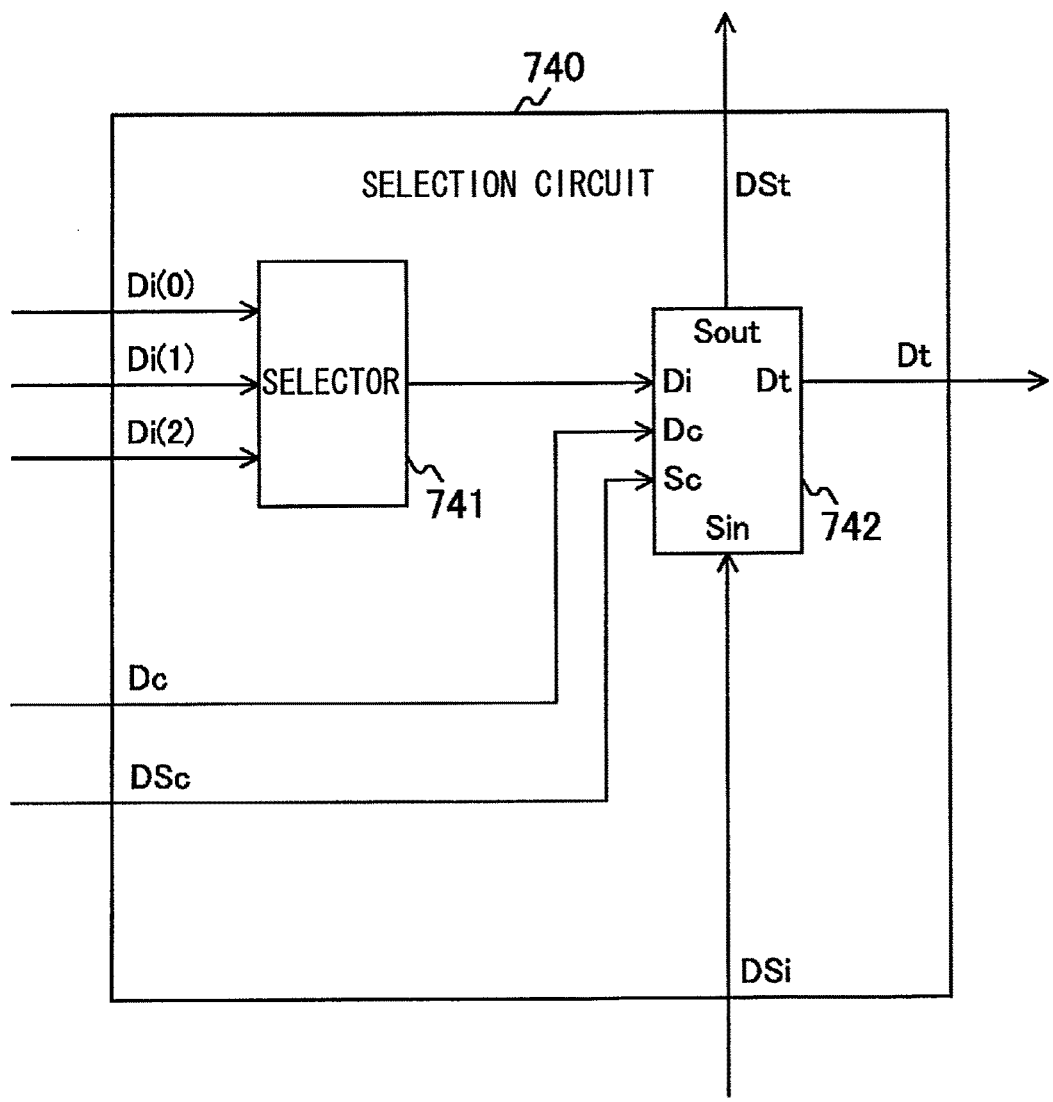
[FIG. 32] A diagram of a selection circuit 740 in the embodiment of the invention, showing an exemplary configuration thereof.

FIG. 32 is a diagram of the selection circuit 740 in the embodiment of the invention, showing an exemplary configuration thereof. This selection circuit 740 is configured to include a selector 741, and a flip-flop circuit 742.

The selector 741 is for sequentially selecting signals provided by data input terminals Di(0) to (2) of the selection circuit 740. By the selector 741 as such, the signals provided by the data input terminals Di(0) to (2) are supplied to the flip-flop circuit 742 on a clock basis.

The flip-flop circuit 742 is a circuit for retaining and outputting any input digital signals, and is configured similarly to the flip-flop circuit 711 described by referring to FIG. 28.

a data input terminal Di of the flip-flop circuit 742 is connected to an output terminal of the selector 741. A data output terminal Dt of the flip-flop circuit 742 is connected to a data output terminal Dt of the selection circuit 740. A scan input terminal Sin of the flip-flop circuit 742 is connected to a scan input terminal DSi of the selection circuit 740. A scan output terminal Sout of the flip-flop circuit 742 is connected to a scan output terminal DSt of the selection circuit 740. A data clock terminal Dc of the flip-flop circuit 742 is connected to a data clock terminal Dc of the selection circuit 740. A scan clock terminal Sc of the flip-flop circuit 742 is connected to a scan clock terminal DSc of the selection circuit 740.

Note here that the selector 741 is an example of the input digital value input means or the specific input digital value selection means claimed in Claims. Further, the flip-flop circuit 742 is an example of the input digital value input means or the specific input digital value retention means claimed in Claims. Still further, the selection circuit 740 is an example of the input interface circuit claimed in Claims.

Figure 33:
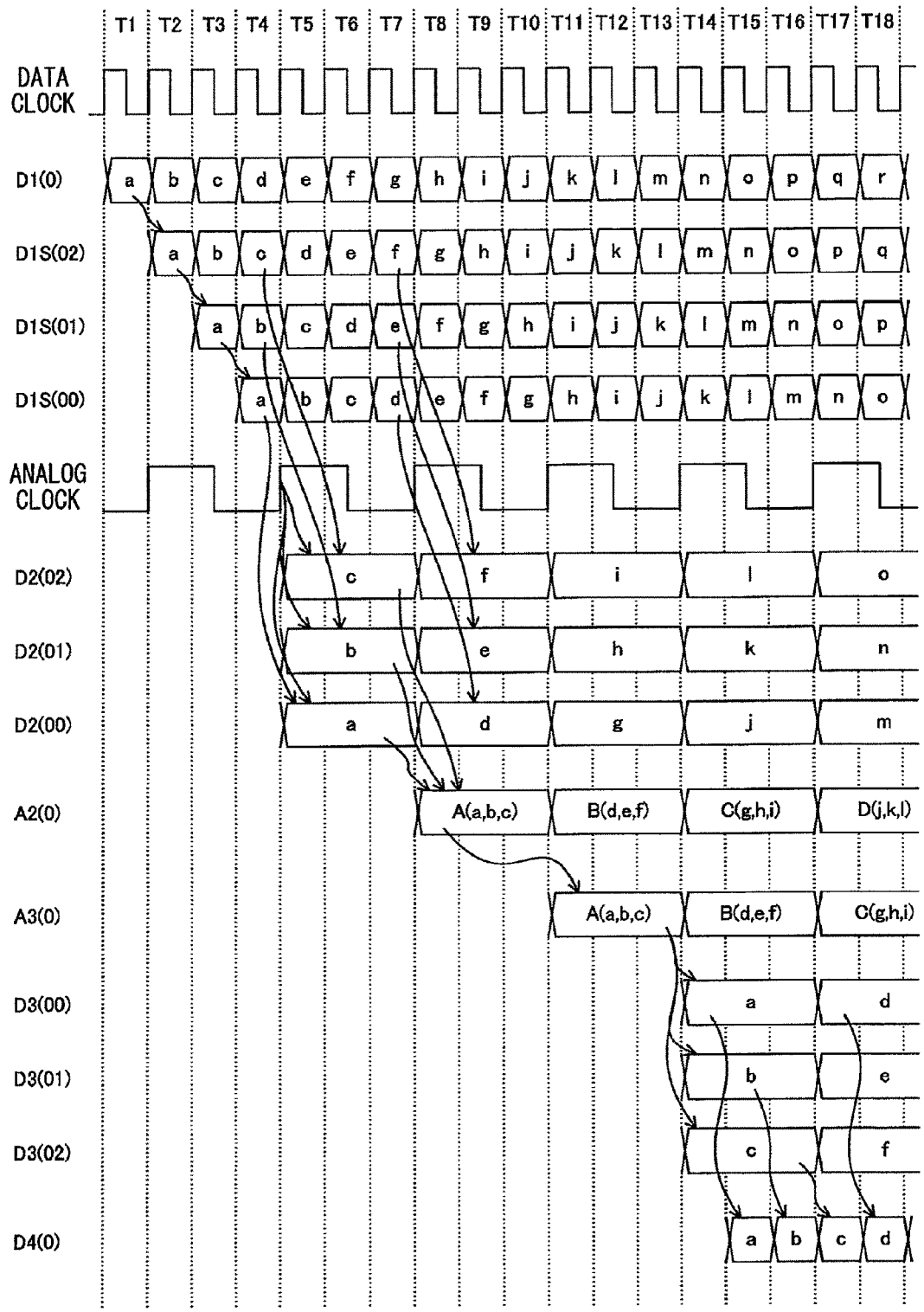
[FIG. 33] A diagram showing an exemplary timing diagram of the LSI-to-LSI transfer (FIG. 26) using the analog scan circuit in the embodiment of the invention.

FIG. 33 is an exemplary timing diagram of LSI-to-LSI transfer (FIG. 26) using the analog scan circuit in the embodiment of the invention. In this example, exemplified is a case where the speed ratio is set to 3:1 between an internal clock for handling digital signals and a clock for transferring analog signals. In other words, the clock for transferring the analog signals has the speed of one thirds (cycle three times longer) of the clock for handling the digital signals.

A data input terminal D1(0) in the shift circuit 710-0 is provided with a data signal on a data clock basis like a signal "a" at a time T1, a signal "b" at a time T2, and a signal "c" at a time T3. The resulting data is shifted by the flip-flop circuits 711 to 713 in the shift circuit 710-0 (refer to FIG. 27). For example, in a sequential manner, the signal "a" is output to a signal line D1S(02) at the time T2, to a signal line D1S(01) at the time T3, and to a signal line D1S(00) at the time T4. Similarly, the signals "b" and "c" are each sequentially output with a time lag of one data clock.

In the analog conversion circuit 720-0, by an analog clock provided to the data clock terminals Dc in the flip-flop circuits 721 to 723, at a time T5, the signals "a" to "c" are output from the flip-flop circuits 721 to 723 (refer to FIG. 30). Note that since the data clock terminal Dc in the analog conversion circuit 720 is allocated with the signal same as that to the analog data clock terminal Ac, these terminals may be combined to be a single piece of terminal, and signals from the same input terminal may be allocated therein. The signals "a" to "c" (D2(00) to (02)) are each converted by the D/A conversion circuit 724 into an analog signal "A", and the conversion results are output from a signal line 709-0 starting from a time T8. This signal line 709-0 has the data width of a line, but as is with an analog value, the multi-value representation is possible. In this example, 3-bit signals "a" to "c" are transferred over a piece of analog signal line (A2(0)).

In the digital conversion circuit 730-0, with the analog flip-flop 731 provided with an analog clock (refer to FIG. 31), an analog signal coming from the analog conversion circuit 720-0 is retained by the analog flip-flop 731, and then is output starting from a time T11 (A3(0)). This analog signal "A" is converted by the A/D conversion circuit 732 into digital signals "a" to "c". The conversion results are retained in the flip-flop circuits 733 to 735, and then are output starting from a time T14 (D3(00) to (02)). These flip-flop circuits 733 to 735 are also each provided with an analog clock. Herein, since the data clock terminal Dc is allocated with the signal same as that to the analog data clock terminal Ac, also in the digital conversion circuit 730 as in the analog conversion circuit 720, these terminals may be combined to be a single piece of terminal, and signals from the same input terminal may be allocated therein.

In the selection circuit 740-0, with a data clock provided to the flip-flop circuit 742 (refer to FIG. 32), a data signal is output on a data clock basis (D4(0)). In this example, a signal "a" is output at a time T15, a signal "b" is output at a time T16, and a signal "c" is output at a time T17.

In this example, three digital signals D2(00) to (02) in synchronization with an analog clock are transferred over the signal line 709-0 as a piece of analog signal A2(0) also in synchronization with the analog clock. In other words, according to the embodiment of the invention, as long as the clock speed remains the same, the number of signal lines needed for data transfer can be reduced.

Also in this example, transfer is performed between the LSI-A 701 and the LSI-B 702 with the speed of one thirds of a clock for data inside of the LSI-A 701 and the LSI-B 702 (D1(0) and D4(0)) (A2(0) and A3(0)). Assuming that a digital data clock is 1T for use as a reference, in this example, it means that the transfer is performed with a throughput of 3T and with a turn-around time of 3T. In other words, according to the embodiment of the invention, the data transfer can be performed at a speed lower than the original clock speed. As a result, the data transfer can be increased in reliability. Moreover, since there is no more need for flip-flops during the data transfer, the circuit placement can be with a higher degree of flexibility, and the circuit size can be reduced.

Note that exemplified here is an example of simple transfer of analog values with the throughput of 3T and the turn-around time of 3T. Alternatively, as long as the processing can be completed within 3T, the analog conversion circuit 720 and the digital conversion circuit 730 can be provided therebetween with any other analog circuit. As shown in FIG. 34(a), for example, an analog circuit 751 may be provided between the LSI-A 701 and the LSI-B 702. Alternatively, as shown in FIG. 34(*b*), an analog circuit 752 may be provided inside of the LSI-A 701. Still alternatively, as shown in FIG. 34(*c*), an analog circuit 753 may be provided inside of the LSI-B 702. These are the spillover effects by the data transfer at a lower speed as described above eliminating the need for flip-flops during the data transfer.

In the embodiment of the invention, a digital value of k=3 bits is transferred (transmission: output, reception: input), over a piece of signal line, as a corresponding analog value in values of m=8 including discrete values of n=8. However, if with the resolving power of m>8 (e.g., m=9), allocation may be performed with a correspondence to n pieces of values (e.g., 8 values from "0" to "7") among a plurality of values that can be represented (e.g., 9 values), and thus m≧n will do. Moreover, in 8 values from "0" to "7" that can be generally represented by k=3 bits, when there is any value that cannot be existed considering the logical structure, an analog signal in use may be the one with which discrete values of n≦7 (resolving power of 7 or more) can be represented. Any value that cannot be existed considering the logical structure is "7" with a modulo 7, for example.

Described next is an implementation example of an analog-digital scan path using the analog scan circuit in the embodiment of the invention.

Figure 35:
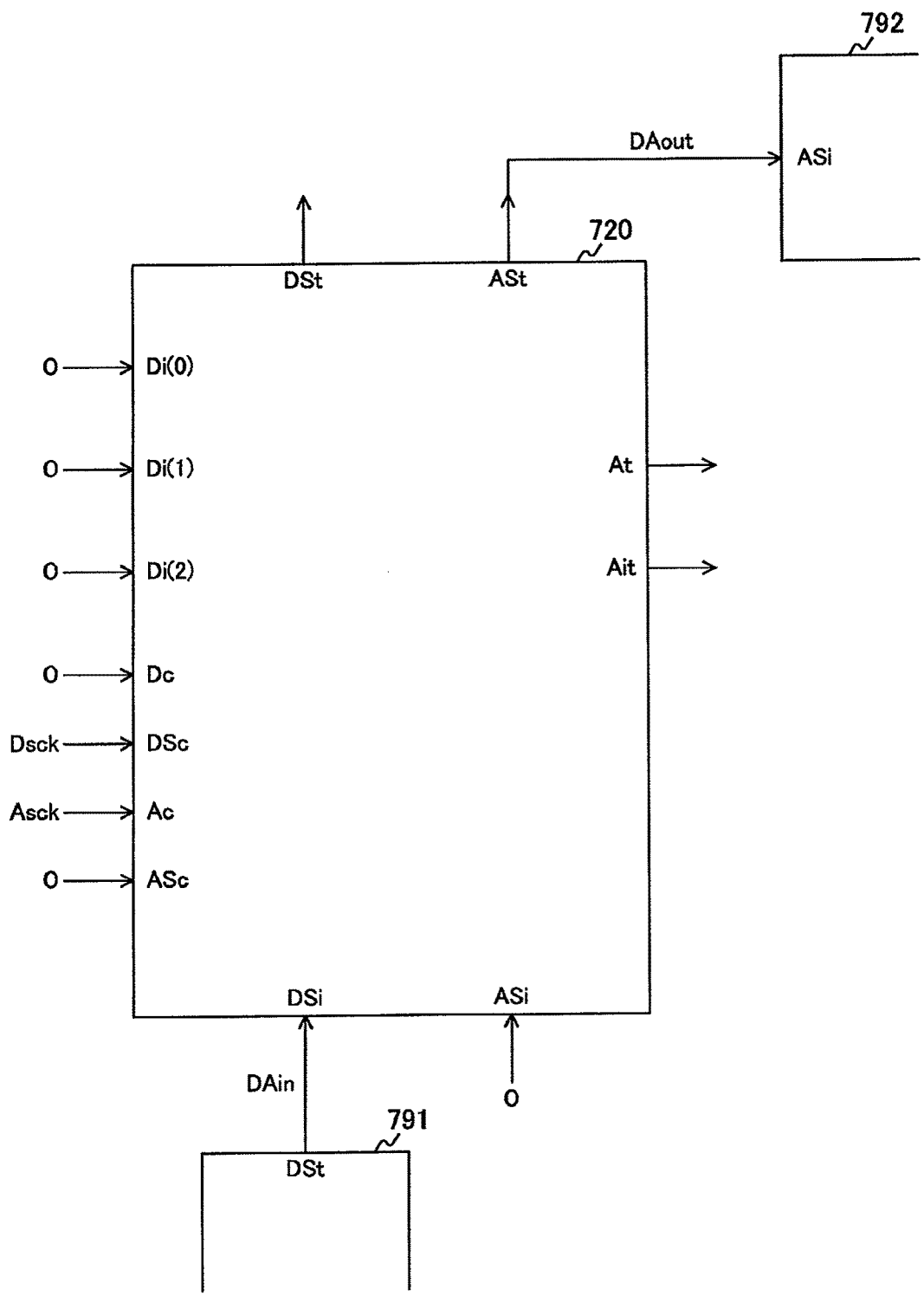
[FIG. 35] A diagram showing an implementation example of a scan-path-use D/A converter in the embodiment of the invention.

FIG. 35 is a diagram showing an implementation example of a scan-path-use D/A converter in the embodiment of the invention. In this example, by using the analog conversion circuit 720 described by referring to FIG. 30, assumed here is that a connection is established from a scan output terminal DSt of a digital circuit 791 to a scan input terminal ASi of an analog circuit 792.

The scan output terminal DSt in the digital circuit 791 is connected to the scan input terminal DSi of the analog conversion circuit 720 over a signal line DAin. The scan input terminal ASi of the analog circuit 792 is connected to the scan output terminal ASt of the analog conversion circuit 720 over a signal line DAout. Since any other data input/output terminals and scan input/output terminals are not in use, the inputs are each set to "0".

Moreover, in the analog conversion circuit 720, the data clock terminal Dc is set to "0". Also in the analog conversion circuit 720, the scan clock terminal Dsc is provided with a data clock Dsck for internal data use. Also in the analog conversion circuit 720, an analog clock terminal Ac is provided with an analog clock Asck for analog signal use. Also in the analog conversion circuit 720, an analog scan clock terminal Asc is set to "0".

Figure 36:
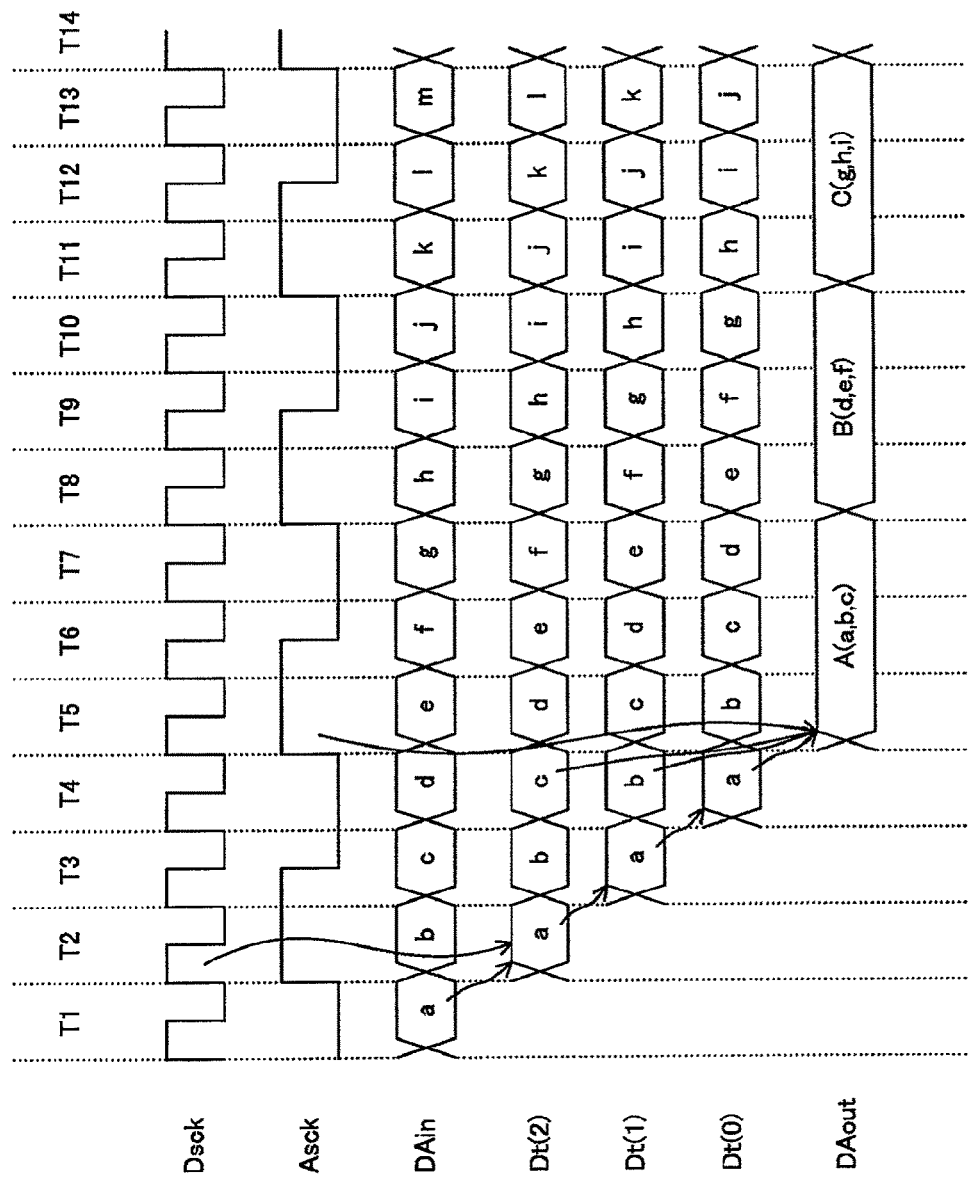
[FIG. 36] A diagram showing an exemplary timing diagram of the scan-path-use D/A converter in the embodiment of the invention.

FIG. 36 is a diagram showing an exemplary timing diagram of the scan-path-use D/A converter in the embodiment of the invention.

A signal "a" provided by the digital circuit 791 at a time T1 over the signal line DAin is synchronized with a data clock Dsck, and then is retained in the flip-flop circuit 723 of the analog conversion circuit 720. The signal "a" is then output at a time T2 from the flip-flop circuit 723, and then is retained in the flip-flop circuit 722. The signal "a" is then output from the flip-flop circuit 722 at a time T3, is retained in the flip-flop circuit 721, and then is output from the flip-flop circuit 721 at a time T4. Similarly, a signal "b" and a signal "c" are sequentially output with a time lag of one data clock.

At the time T4, the signals "a" to "c" are each converted into an analog signal "A" in the D/A conversion circuit 724. Then at a time T5, in synchronization with the analog clock Asck, the analog signal "A" is output from the analog flip-flop 725.

By using the analog conversion circuit 720 as such, a digital scan signal can be converted into an analog scan signal. As a result, digital signals and analog signals can be existed together on a single piece of the scan path.

Note that, in this example, described is an example in which the scan input terminal ASi of the analog circuit 792 is connected with the scan output terminal ASt of the analog conversion circuit 720. Alternatively, connecting the data output terminal At of the analog conversion circuit 720 leads to the same results. Moreover, as will be described later, connecting the analog signal observation terminal Ait of the analog conversion circuit 720 to the scan input terminal ASi of the analog conversion circuit 720 can lead to the same results.

FIG. 37 is a diagram showing another implementation example of the scan-path-use D/A converter in the embodiment of the invention. In this example, unlike in FIG. 35, the scan input terminal ASi of the analog conversion circuit 720 is connected with the analog signal observation terminal Ait. Moreover, the analog clock terminal Ac of the analog conversion circuit 720 is set to "0", and the analog scan clock terminal ASc is provided with the analog clock Asck for analog signal use. As such, by feedback of the output of the analog signal observation terminal Ait, a direct input can be made to the scan path of the analog flip-flop 725 of the analog conversion circuit 720.

Figure 38:
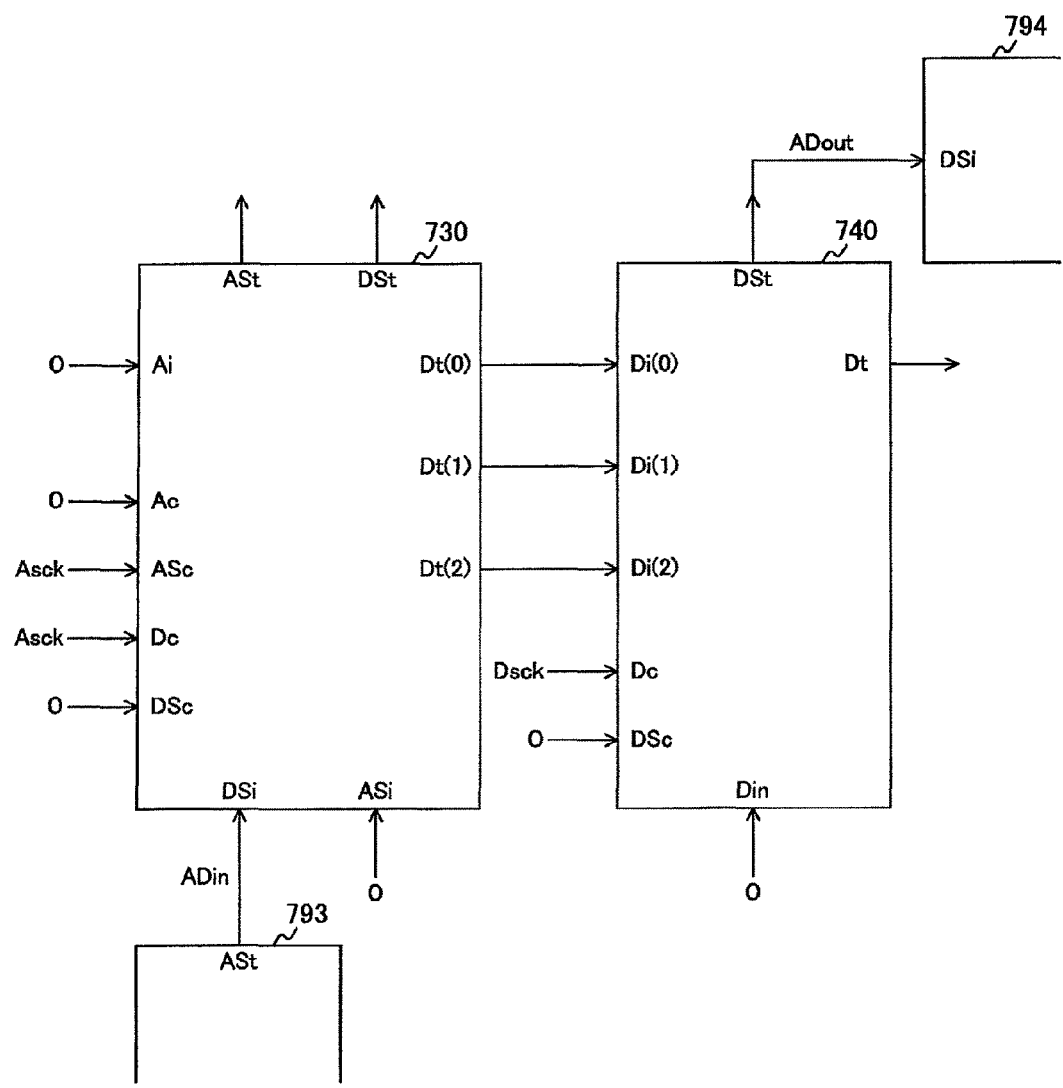
[FIG. 38] A diagram showing an implementation example of a scan-path-use A/D converter in the embodiment of the invention.

FIG. 38 is a diagram showing an implementation example of a scan-path-use A/D converter in the embodiment of the invention. In this example, using the digital conversion circuit 730 described by referring to FIG. 31, and using the selection circuit 740 described by referring to FIG. 32, assumed here is a connection established from a scan output terminal ASt of an analog circuit 793 to a scan input terminal DSi of a digital circuit 794.

A scan output terminal ASt of the analog circuit 793 is connected to the scan input terminal DSi of the digital conversion circuit 730 over a signal line ADin. A scan input terminal DSi of the digital circuit 794 is connected to the scan output terminal DSt of the selection circuit 740 over a signal line ADout. The data output terminals Dt(0) to (2) of the digital conversion circuit 730 are connected to the data input terminals Di(0) to (2) of the selection circuit 740, respectively. Any other data input/output terminals and the scan input/output terminals are not in use, and thus the inputs are each set to "0".

Moreover, in the digital conversion circuit 730, the analog clock terminal Ac and the scan clock terminal DSc are each set to "0". Also in the digital conversion circuit 730, the analog scan clock terminal ASc and the data clock terminal Dc are each provided with the analog clock Asck for analog signal use. In the selection circuit 740, the data clock terminal Dc is provided with a data clock Dsck for internal data use. Also in the selection circuit 740, the scan clock terminal DSc is set to "0".

Figure 39:
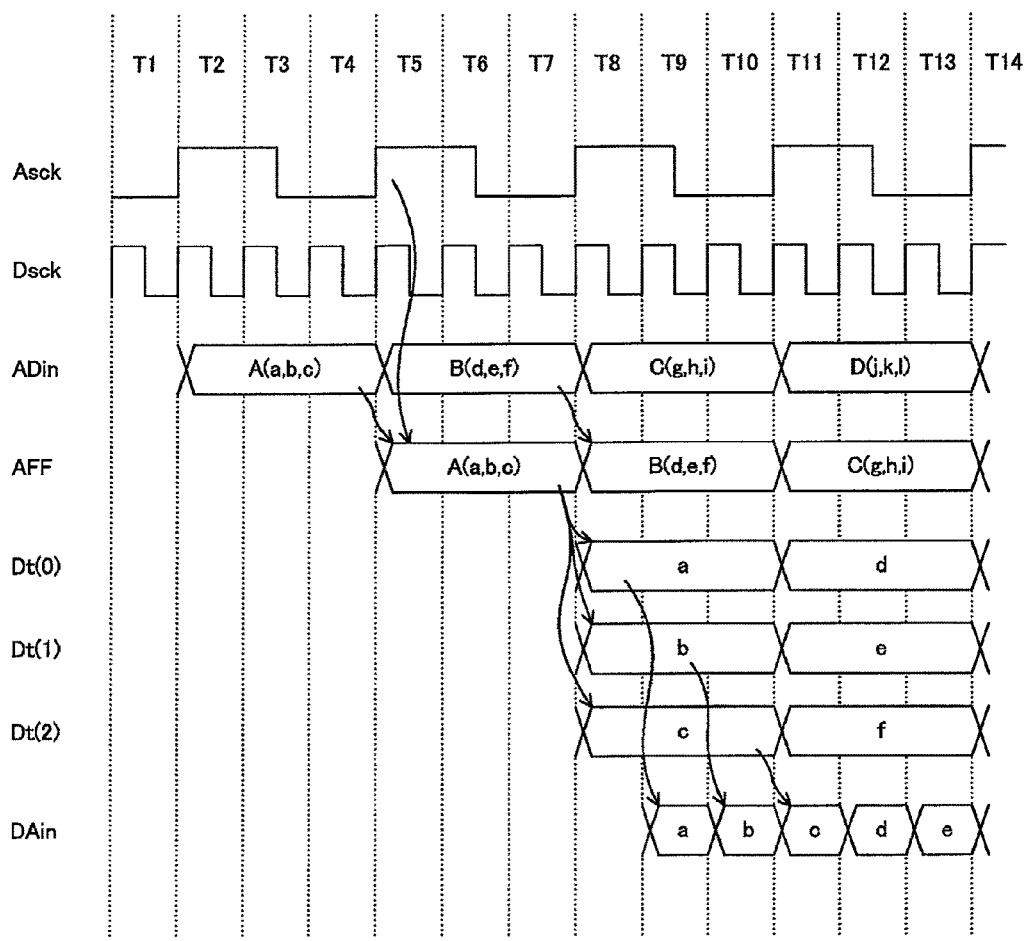
[FIG. 39] A diagram showing an exemplary timing diagram of the scan-path-use A/D converter in the embodiment of the invention.

FIG. 39 is an exemplary timing diagram of the scan-path-use A/D converter in the embodiment of the invention.

At a time T1, an analog signal "A" provided by the analog circuit 793 over the signal line ADin is synchronized with the analog clock Asck, and then is retained in the analog flip-flop circuit 731 of the digital conversion circuit 730. This analog signal "A" indicates analog values of the signals being the digital signals "a" to "c". The analog flip-flop circuit 731 outputs the analog signal "A" starting from a time T5.

The analog signal "A" is converted into the digital signals "a" to "c" by the A/D conversion circuit 732 of the digital conversion circuit 730, and the conversion results are retained in the flip-flop circuits 733 to 735. The flip-flop circuits 733 to

735 each output the digital signals "a" to "c" starting from a time T8 in synchronization with the analog clock Asck.

The flip-flop circuit 742 of the selection circuit 740 sequentially retains the signals "a" to "c" in synchronization with a data clock Ssck. In this manner, the signals "a" to "c" are sequentially output starting from a time T9.

As such, by using the digital conversion circuit 730 and the selection circuit 740, an analog scan signal can be converted into a digital scan signal. In this manner, a single scan path can carry both the digital signals and the analog signals.

Note here that the embodiment of the invention is merely an example for implementation of the invention, and as described above, there is a correlation with the specific matters of the invention in Claims. However, the invention is not restricted to the embodiment, and it is understood that numerous other modifications and variations can be devised without departing from the scope of the invention.

Moreover, the process procedure described in the embodiment of the invention may be understood as a method including such a series of procedures, or may be understood as a program for execution of such a series of procedures by a computer, and a recording medium for storage of the program. Such a recording medium is exemplified by a CD (Compact Disc), an MD (MiniDisc), a DVD (Digital Versatile Disk), a memory card, and a blu-ray disk (Blu-rayDisc (registered trade mark)).

The invention claimed is:

1. An interface circuit comprising:
   an output digital value output element to output an output digital value of k bits (where k is an integer greater than or equal to 2);
   an output analog value output element to output a piece of output analog value corresponding to the k-bit output digital value in m pieces (where m is an integer greater than or equal to n) of values including n pieces (where n is an integer satisfying $3 \leq n \leq 2^k$) of discrete values;
   an output analog flip-flop to retain and output the output analog value based at least in part on a common trigger signal;
   wherein, the output digital value output element includes a common output digital value retention element to retain and output the k-bit output digital value based at least in part on the common trigger signal.

2. The interface circuit according to claim 1, wherein:
   the output digital value output element further includes:
   k pieces of specific output digital value retention elements each retain and output a 1-bit output digital value based at least in part on an output trigger signal specific to control over the output digital value, and
   specific output digital value shift elements to shift, based at least in part on the output trigger signal, by using an output of any of the k pieces of specific output digital value retention elements located at the i-th (where i is an arbitrary integer satisfying $1 \leq i \leq (k-1)$) as an input of any of the specific output digital value retention elements located at the i+1-th, the output digital values retained by the k pieces of specific output digital value retention means, and
   the common output digital value retention element:
   receives the output digital values of k bits in total coming from the k pieces of specific output digital value retention elements based at least in part on the common trigger signal, and retains and outputs the values as the k-bit output digital value.

3. The interface circuit according to claim 2, wherein:
   the common trigger signal has a cycle k times longer than a cycle of the output trigger signal.

4. The interface circuit according to claim 1, wherein:
   the output analog flip-flop retains an analog value by accumulating an electric charge in a diffusion layer region formed on a semiconductor substrate.

5. The interface circuit according to claim 1, wherein:
   the output analog flip-flop retains an analog value by accumulating an electric charge in a depletion layer region generated on a semiconductor substrate.

* * * * *